(12) United States Patent
Merrow et al.

(10) Patent No.: US 8,628,239 B2
(45) Date of Patent: Jan. 14, 2014

(54) STORAGE DEVICE TEMPERATURE SENSING

(75) Inventors: Brian S. Merrow, Harvard, MA (US); Larry W. Akers, Westford, MA (US)

(73) Assignee: Teradyne, Inc., North Reading, MA (US)

( * ) Notice: Subject to any disclaimer, the term of this patent is extended or adjusted under 35 U.S.C. 154(b) by 568 days.

(21) Appl. No.: 12/836,940

(22) Filed: Jul. 15, 2010

(65) Prior Publication Data

US 2011/0013667 A1    Jan. 20, 2011

Related U.S. Application Data

(63) Continuation-in-part of application No. 12/503,687, filed on Jul. 15, 2009, now Pat. No. 7,995,349.

(51) Int. Cl.
*G01K 1/08* (2006.01)
(52) U.S. Cl.
USPC .................................. 374/141; 374/4; 374/5
(58) Field of Classification Search
None
See application file for complete search history.

(56) References Cited

U.S. PATENT DOCUMENTS

| | | | |
|---|---|---|---|
| 557,186 | A | 3/1896 | Cahill |
| 2,224,407 | A | 12/1940 | Passur |
| 2,380,026 | A | 7/1945 | Clarke |
| 2,631,775 | A | 3/1953 | Gordon |
| 2,635,524 | A | 4/1953 | Jenkins |
| 3,120,166 | A | 2/1964 | Lyman |
| 3,360,032 | A | 12/1967 | Sherwood |
| 3,364,838 | A | 1/1968 | Bradley |
| 3,517,601 | A | 6/1970 | Courchesne |
| 3,845,286 | A | 10/1974 | Aronstein et al. |
| 4,147,299 | A | 4/1979 | Freeman |
| 4,233,644 | A | 11/1980 | Hwang et al. |
| 4,336,748 | A | 6/1982 | Martin et al. |
| 4,379,259 | A | 4/1983 | Varadi et al. |
| 4,477,127 | A | 10/1984 | Kume |
| 4,495,545 | A | 1/1985 | Dufresne et al. |
| 4,526,318 | A | 7/1985 | Fleming et al. |
| 4,620,248 | A | 10/1986 | Gitzendanner |

(Continued)

FOREIGN PATENT DOCUMENTS

| | | |
|---|---|---|
| AU | 583716 | 5/1989 |
| CN | 1177187 | 3/1998 |

(Continued)

OTHER PUBLICATIONS

Abraham et al., "Thermal Proximity Imaging of Hard-Disk Substrates", IEEE Transactions on Mathematics 36:3997-4004, Nov. 2000.

(Continued)

*Primary Examiner* — Lisa Caputo
*Assistant Examiner* — Janice M Soto
(74) *Attorney, Agent, or Firm* — Fish & Richardson P.C.

(57) ABSTRACT

A test slot assembly is provided for testing a storage device. The test slot assembly is configured to receive and support a storage device, or a storage device supported by a storage device transporter. The test slot assembly also includes a temperature sensing assembly. The temperature sensing assembly is arranged to measure a temperature of a storage device by way of physical contact. The test slot assembly also includes a clamping mechanism operatively associated with the housing. The clamping mechanism is operable to move the temperature sensing assembly into contact with a storage device.

19 Claims, 59 Drawing Sheets

(56) References Cited

U.S. PATENT DOCUMENTS

| | | |
|---|---|---|
| 4,648,007 A | 3/1987 | Garner |
| 4,654,732 A | 3/1987 | Mesher |
| 4,665,455 A | 5/1987 | Mesher |
| 4,683,424 A | 7/1987 | Cutright et al. |
| 4,685,303 A | 8/1987 | Branc et al. |
| 4,688,124 A | 8/1987 | Scribner et al. |
| 4,713,714 A | 12/1987 | Gatti et al. |
| 4,739,444 A | 4/1988 | Zushi et al. |
| 4,754,397 A | 6/1988 | Varaiya et al. |
| 4,768,285 A | 9/1988 | Woodman, Jr. |
| 4,778,063 A | 10/1988 | Ueberreiter |
| 4,801,234 A | 1/1989 | Cedrone |
| 4,809,881 A | 3/1989 | Becker |
| 4,817,273 A | 4/1989 | Lape et al. |
| 4,817,934 A | 4/1989 | McCormick et al. |
| 4,851,965 A | 7/1989 | Gabuzda et al. |
| 4,881,591 A | 11/1989 | Rignall |
| 4,888,549 A | 12/1989 | Wilson et al. |
| 4,911,281 A | 3/1990 | Jenkner |
| 4,967,155 A | 10/1990 | Magnuson |
| 5,012,187 A | 4/1991 | Littlebury |
| 5,045,960 A | 9/1991 | Eding |
| 5,061,630 A | 10/1991 | Knopf et al. |
| 5,119,270 A | 6/1992 | Bolton et al. |
| 5,122,914 A | 6/1992 | Hanson |
| 5,127,684 A | 7/1992 | Klotz et al. |
| 5,128,813 A | 7/1992 | Lee |
| 5,136,395 A | 8/1992 | Ishii et al. |
| 5,158,132 A | 10/1992 | Guillemot |
| 5,168,424 A | 12/1992 | Bolton et al. |
| 5,171,183 A | 12/1992 | Pollard et al. |
| 5,173,819 A | 12/1992 | Takahashi et al. |
| 5,176,202 A | 1/1993 | Richard |
| 5,205,132 A | 4/1993 | Fu |
| 5,206,772 A | 4/1993 | Hirano et al. |
| 5,207,613 A | 5/1993 | Ferchau et al. |
| 5,210,680 A | 5/1993 | Scheibler |
| 5,237,484 A | 8/1993 | Ferchau et al. |
| 5,263,537 A | 11/1993 | Plucinski et al. |
| 5,269,698 A | 12/1993 | Singer |
| 5,295,392 A | 3/1994 | Hensel et al. |
| 5,309,323 A | 5/1994 | Gray et al. |
| 5,325,263 A | 6/1994 | Singer et al. |
| 5,349,486 A | 9/1994 | Sugimoto et al. |
| 5,368,072 A | 11/1994 | Cote |
| 5,374,395 A | 12/1994 | Robinson et al. |
| 5,379,229 A | 1/1995 | Parsons et al. |
| 5,398,058 A | 3/1995 | Hattori |
| 5,412,534 A | 5/1995 | Cutts et al. |
| 5,414,591 A | 5/1995 | Kimura et al. |
| 5,426,581 A | 6/1995 | Kishi et al. |
| 5,469,037 A | 11/1995 | McMurtrey, Sr. et al. |
| 5,477,416 A | 12/1995 | Schkrohowsky et al. |
| 5,484,012 A | 1/1996 | Hiratsuka |
| 5,486,681 A | 1/1996 | Dagnac et al. |
| 5,491,610 A | 2/1996 | Mok et al. |
| 5,543,727 A | 8/1996 | Bushard et al. |
| 5,546,250 A | 8/1996 | Diel |
| 5,557,186 A | 9/1996 | McMurtrey, Sr. et al. |
| 5,563,768 A | 10/1996 | Perdue |
| 5,570,740 A | 11/1996 | Flores et al. |
| 5,593,380 A | 1/1997 | Bittikofer |
| 5,601,141 A | 2/1997 | Gordon et al. |
| 5,604,662 A | 2/1997 | Anderson et al. |
| 5,610,893 A | 3/1997 | Soga et al. |
| 5,617,430 A | 4/1997 | Angelotti et al. |
| 5,644,705 A | 7/1997 | Stanley |
| 5,646,918 A | 7/1997 | Dimitri et al. |
| 5,654,846 A | 8/1997 | Wicks et al. |
| 5,673,029 A | 9/1997 | Behl et al. |
| 5,694,290 A | 12/1997 | Chang |
| 5,718,627 A | 2/1998 | Wicks |
| 5,718,628 A | 2/1998 | Nakazato et al. |
| 5,731,928 A | 3/1998 | Jabbari et al. |
| 5,751,549 A | 5/1998 | Eberhardt et al. |
| 5,754,365 A | 5/1998 | Beck et al. |
| 5,761,032 A | 6/1998 | Jones |
| 5,793,610 A | 8/1998 | Schmitt et al. |
| 5,811,678 A | 9/1998 | Hirano |
| 5,812,761 A | 9/1998 | Seki et al. |
| 5,819,842 A | 10/1998 | Potter et al. |
| 5,831,525 A | 11/1998 | Harvey |
| 5,851,143 A | 12/1998 | Hamid |
| 5,859,409 A | 1/1999 | Kim et al. |
| 5,859,540 A | 1/1999 | Fukumoto |
| 5,862,037 A | 1/1999 | Behl |
| 5,870,630 A | 2/1999 | Reasoner et al. |
| 5,886,639 A | 3/1999 | Behl et al. |
| 5,890,959 A | 4/1999 | Pettit et al. |
| 5,912,799 A | 6/1999 | Grouell et al. |
| 5,913,926 A | 6/1999 | Anderson et al. |
| 5,914,856 A | 6/1999 | Morton et al. |
| 5,923,181 A * | 7/1999 | Beilstein et al. ......... 324/750.07 |
| 5,927,386 A | 7/1999 | Lin |
| 5,956,301 A | 9/1999 | Dimitri et al. |
| 5,959,834 A | 9/1999 | Chang |
| 5,999,356 A | 12/1999 | Dimitri et al. |
| 5,999,365 A | 12/1999 | Hasegawa et al. |
| 6,000,623 A | 12/1999 | Blatti et al. |
| 6,005,404 A | 12/1999 | Cochran et al. |
| 6,005,770 A | 12/1999 | Schmitt |
| 6,008,636 A | 12/1999 | Miller et al. |
| 6,008,984 A | 12/1999 | Cunningham et al. |
| 6,011,689 A | 1/2000 | Wrycraft |
| 6,031,717 A | 2/2000 | Baddour et al. |
| 6,034,870 A | 3/2000 | Osborn et al. |
| 6,042,348 A | 3/2000 | Aakalu et al. |
| 6,045,113 A | 4/2000 | Itakura |
| 6,055,814 A | 5/2000 | Song |
| 6,066,822 A | 5/2000 | Nemoto et al. |
| 6,067,225 A | 5/2000 | Reznikov et al. |
| 6,069,792 A | 5/2000 | Nelik |
| 6,084,768 A | 7/2000 | Bologna |
| 6,094,342 A | 7/2000 | Dague et al. |
| 6,104,607 A | 8/2000 | Behl |
| 6,115,250 A | 9/2000 | Schmitt |
| 6,122,131 A | 9/2000 | Jeppson |
| 6,122,232 A | 9/2000 | Schell et al. |
| 6,124,707 A | 9/2000 | Kim et al. |
| 6,130,817 A | 10/2000 | Flotho et al. |
| 6,144,553 A | 11/2000 | Hileman et al. |
| 6,166,901 A | 12/2000 | Gamble et al. |
| 6,169,413 B1 | 1/2001 | Pack et al. |
| 6,169,930 B1 | 1/2001 | Blachek et al. |
| 6,177,805 B1 | 1/2001 | Pih |
| 6,178,835 B1 | 1/2001 | Orriss et al. |
| 6,181,557 B1 | 1/2001 | Gatti |
| 6,185,065 B1 | 2/2001 | Hasegawa et al. |
| 6,185,097 B1 | 2/2001 | Behl |
| 6,188,191 B1 | 2/2001 | Frees et al. |
| 6,192,282 B1 | 2/2001 | Smith et al. |
| 6,193,339 B1 | 2/2001 | Behl et al. |
| 6,209,842 B1 | 4/2001 | Anderson et al. |
| 6,227,516 B1 | 5/2001 | Webster, Jr. et al. |
| 6,229,275 B1 | 5/2001 | Yamamoto |
| 6,231,145 B1 | 5/2001 | Liu |
| 6,233,148 B1 | 5/2001 | Shen |
| 6,236,563 B1 | 5/2001 | Buican et al. |
| 6,247,944 B1 | 6/2001 | Bologna et al. |
| 6,249,824 B1 | 6/2001 | Henrichs |
| 6,252,769 B1 | 6/2001 | Tullstedt et al. |
| 6,262,863 B1 | 7/2001 | Ostwald et al. |
| 6,272,007 B1 | 8/2001 | Kitlas et al. |
| 6,272,767 B1 | 8/2001 | Botruff et al. |
| 6,281,677 B1 | 8/2001 | Cosci et al. |
| 6,282,501 B1 | 8/2001 | Assouad |
| 6,285,524 B1 | 9/2001 | Boigenzahn et al. |
| 6,289,678 B1 | 9/2001 | Pandolfi |
| 6,297,950 B1 | 10/2001 | Erwin |
| 6,298,672 B1 | 10/2001 | Valicoff, Jr. |
| 6,302,714 B1 | 10/2001 | Bologna et al. |
| 6,304,839 B1 | 10/2001 | Ho et al. |
| 6,307,386 B1 | 10/2001 | Fowler et al. |
| 6,327,150 B1 | 12/2001 | Levy et al. |

(56) References Cited

U.S. PATENT DOCUMENTS

| | | | |
|---|---|---|---|
| 6,330,154 B1 | 12/2001 | Fryers et al. | |
| 6,351,379 B1 | 2/2002 | Cheng | |
| 6,354,792 B1 | 3/2002 | Kobayashi et al. | |
| 6,356,409 B1 | 3/2002 | Price et al. | |
| 6,356,415 B1 | 3/2002 | Kabasawa | |
| 6,384,995 B1 | 5/2002 | Smith | |
| 6,388,437 B1 | 5/2002 | Wolski et al. | |
| 6,388,875 B1 | 5/2002 | Chen | |
| 6,388,878 B1 | 5/2002 | Chang | |
| 6,389,225 B1 | 5/2002 | Malinoski et al. | |
| 6,411,584 B2 | 6/2002 | Davis et al. | |
| 6,421,236 B1 | 7/2002 | Montoya et al. | |
| 6,434,000 B1 | 8/2002 | Pandolfi | |
| 6,434,498 B1 | 8/2002 | Ulrich et al. | |
| 6,434,499 B1 | 8/2002 | Ulrich et al. | |
| 6,464,080 B1 | 10/2002 | Morris et al. | |
| 6,467,153 B2 | 10/2002 | Butts et al. | |
| 6,473,297 B1 | 10/2002 | Behl et al. | |
| 6,473,301 B1 | 10/2002 | Levy et al. | |
| 6,476,627 B1 | 11/2002 | Pelissier et al. | |
| 6,477,044 B2 | 11/2002 | Foley et al. | |
| 6,477,442 B1 | 11/2002 | Valerino, Sr. | |
| 6,480,380 B1 | 11/2002 | French et al. | |
| 6,480,382 B2 | 11/2002 | Cheng | |
| 6,487,071 B1 | 11/2002 | Tata et al. | |
| 6,489,793 B2 * | 12/2002 | Jones et al. | 324/750.09 |
| 6,494,663 B2 | 12/2002 | Ostwald et al. | |
| 6,525,933 B2 | 2/2003 | Eland | |
| 6,526,841 B1 | 3/2003 | Wanek et al. | |
| 6,535,384 B2 | 3/2003 | Huang | |
| 6,537,013 B2 | 3/2003 | Emberty et al. | |
| 6,544,309 B1 | 4/2003 | Hoefer et al. | |
| 6,546,445 B1 | 4/2003 | Hayes | |
| 6,553,532 B1 | 4/2003 | Aoki | |
| 6,560,107 B1 | 5/2003 | Beck et al. | |
| 6,565,163 B2 | 5/2003 | Behl et al. | |
| 6,566,859 B2 | 5/2003 | Wolski et al. | |
| 6,567,266 B2 | 5/2003 | Ives et al. | |
| 6,570,734 B2 | 5/2003 | Ostwald et al. | |
| 6,577,586 B1 | 6/2003 | Yang et al. | |
| 6,577,687 B2 | 6/2003 | Hall et al. | |
| 6,618,254 B2 | 9/2003 | Ives | |
| 6,626,846 B2 | 9/2003 | Spencer | |
| 6,628,518 B2 | 9/2003 | Behl et al. | |
| 6,635,115 B1 | 10/2003 | Fairbairn et al. | |
| 6,640,235 B1 | 10/2003 | Anderson | |
| 6,644,982 B1 | 11/2003 | Ondricek et al. | |
| 6,651,192 B1 | 11/2003 | Viglione et al. | |
| 6,654,240 B1 | 11/2003 | Tseng et al. | |
| 6,679,128 B2 | 1/2004 | Wanek et al. | |
| 6,693,757 B2 | 2/2004 | Hayakawa et al. | |
| 6,718,164 B1 | 4/2004 | Korneluk et al. | |
| 6,741,529 B1 | 5/2004 | Getreuer | |
| 6,744,269 B1 * | 6/2004 | Johnson et al. | 324/750.09 |
| 6,746,648 B1 | 6/2004 | Mattila et al. | |
| 6,751,093 B1 | 6/2004 | Hsu et al. | |
| 6,791,785 B1 | 9/2004 | Messenger et al. | |
| 6,791,799 B2 | 9/2004 | Fletcher | |
| 6,798,651 B2 | 9/2004 | Syring et al. | |
| 6,798,972 B1 | 9/2004 | Ito et al. | |
| 6,801,834 B1 | 10/2004 | Konshak et al. | |
| 6,806,700 B2 | 10/2004 | Wanek et al. | |
| 6,811,427 B2 | 11/2004 | Garrett et al. | |
| 6,826,046 B1 * | 11/2004 | Muncaster et al. | 361/679.33 |
| 6,830,372 B2 | 12/2004 | Liu et al. | |
| 6,832,929 B2 | 12/2004 | Garrett et al. | |
| 6,861,861 B2 | 3/2005 | Song et al. | |
| 6,862,173 B1 | 3/2005 | Konshak et al. | |
| 6,867,939 B2 | 3/2005 | Katahara et al. | |
| 6,892,328 B2 | 5/2005 | Klein et al. | |
| 6,904,479 B2 | 6/2005 | Hall et al. | |
| 6,908,330 B2 | 6/2005 | Garrett et al. | |
| 6,928,336 B2 | 8/2005 | Peshkin et al. | |
| 6,937,432 B2 | 8/2005 | Sri-Jayantha et al. | |
| 6,957,291 B2 | 10/2005 | Moon et al. | |
| 6,965,811 B2 | 11/2005 | Dickey et al. | |
| 6,974,017 B2 | 12/2005 | Oseguera | |
| 6,976,190 B1 | 12/2005 | Goldstone | |
| 6,980,381 B2 | 12/2005 | Gray et al. | |
| 6,982,872 B2 | 1/2006 | Behl et al. | |
| 7,006,325 B2 | 2/2006 | Emberty et al. | |
| 7,039,924 B2 | 5/2006 | Goodman et al. | |
| 7,054,150 B2 | 5/2006 | Orriss et al. | |
| 7,070,323 B2 | 7/2006 | Wanek et al. | |
| 7,076,391 B1 | 7/2006 | Pakzad et al. | |
| 7,077,614 B1 | 7/2006 | Hasper et al. | |
| 7,088,541 B2 | 8/2006 | Orriss et al. | |
| 7,092,251 B1 | 8/2006 | Henry | |
| 7,106,582 B2 | 9/2006 | Albrecht et al. | |
| 7,123,477 B2 | 10/2006 | Coglitore et al. | |
| 7,126,777 B2 | 10/2006 | Flechsig et al. | |
| 7,130,138 B2 | 10/2006 | Lum et al. | |
| 7,134,553 B2 | 11/2006 | Stephens | |
| 7,139,145 B1 | 11/2006 | Archibald et al. | |
| 7,164,579 B2 | 1/2007 | Muncaster et al. | |
| 7,167,360 B2 | 1/2007 | Inoue et al. | |
| 7,181,458 B1 | 2/2007 | Higashi | |
| 7,203,021 B1 | 4/2007 | Ryan et al. | |
| 7,203,060 B2 | 4/2007 | Kay et al. | |
| 7,206,201 B2 | 4/2007 | Behl et al. | |
| 7,216,968 B2 | 5/2007 | Smith et al. | |
| 7,219,028 B2 | 5/2007 | Bae et al. | |
| 7,219,273 B2 | 5/2007 | Fisher et al. | |
| 7,227,746 B2 | 6/2007 | Tanaka et al. | |
| 7,232,101 B2 | 6/2007 | Wanek et al. | |
| 7,243,043 B2 | 7/2007 | Shin | |
| 7,248,467 B2 | 7/2007 | Sri-Jayantha et al. | |
| 7,259,966 B2 | 8/2007 | Connelly, Jr. et al. | |
| 7,273,344 B2 | 9/2007 | Ostwald et al. | |
| 7,280,353 B2 | 10/2007 | Wendel et al. | |
| 7,289,885 B2 | 10/2007 | Basham et al. | |
| 7,304,855 B1 | 12/2007 | Milligan et al. | |
| 7,315,447 B2 | 1/2008 | Inoue et al. | |
| 7,349,205 B2 | 3/2008 | Hall et al. | |
| 7,353,524 B1 | 4/2008 | Lin et al. | |
| 7,385,385 B2 | 6/2008 | Magliocco et al. | |
| 7,395,133 B2 | 7/2008 | Lowe | |
| 7,403,451 B2 | 7/2008 | Goodman et al. | |
| 7,437,212 B2 | 10/2008 | Farchmin et al. | |
| 7,447,011 B2 | 11/2008 | Wade et al. | |
| 7,457,112 B2 | 11/2008 | Fukuda et al. | |
| 7,467,024 B2 | 12/2008 | Flitsch | |
| 7,476,362 B2 | 1/2009 | Angros | |
| 7,483,269 B1 | 1/2009 | Marvin, Jr. et al. | |
| 7,505,264 B2 | 3/2009 | Hall et al. | |
| 7,554,811 B2 | 6/2009 | Scicluna et al. | |
| 7,568,122 B2 | 7/2009 | Mechalke et al. | |
| 7,570,455 B2 | 8/2009 | Deguchi et al. | |
| 7,573,715 B2 | 8/2009 | Mojaver et al. | |
| 7,584,851 B2 | 9/2009 | Hong et al. | |
| 7,612,996 B2 | 11/2009 | Atkins et al. | |
| 7,625,027 B2 | 12/2009 | Kiaie et al. | |
| 7,630,196 B2 | 12/2009 | Hall et al. | |
| 7,643,289 B2 | 1/2010 | Ye et al. | |
| 7,646,596 B2 | 1/2010 | Ng | |
| 7,834,648 B1 * | 11/2010 | Sheng et al. | 324/750.05 |
| 2001/0006453 A1 | 7/2001 | Glorioso et al. | |
| 2001/0044023 A1 | 11/2001 | Johnson et al. | |
| 2001/0046118 A1 | 11/2001 | Yamanashi et al. | |
| 2001/0048590 A1 | 12/2001 | Behl et al. | |
| 2002/0030981 A1 | 3/2002 | Sullivan et al. | |
| 2002/0044416 A1 | 4/2002 | Harmon, III et al. | |
| 2002/0051338 A1 | 5/2002 | Jiang et al. | |
| 2002/0071248 A1 | 6/2002 | Huang et al. | |
| 2002/0079422 A1 | 6/2002 | Jiang | |
| 2002/0090320 A1 | 7/2002 | Burow et al. | |
| 2002/0116087 A1 | 8/2002 | Brown | |
| 2002/0161971 A1 | 10/2002 | Dimitri et al. | |
| 2002/0172004 A1 | 11/2002 | Ives et al. | |
| 2003/0001605 A1 * | 1/2003 | Jones et al. | 324/760 |
| 2003/0035271 A1 | 2/2003 | Lelong et al. | |
| 2003/0043550 A1 | 3/2003 | Ives | |
| 2003/0121337 A1 * | 7/2003 | Wanek et al. | 73/865.6 |
| 2003/0206397 A1 | 11/2003 | Allgeyer et al. | |

(56) References Cited

U.S. PATENT DOCUMENTS

| | | |
|---|---|---|
| 2004/0165489 A1 | 8/2004 | Goodman et al. |
| 2004/0230399 A1 | 11/2004 | Shin |
| 2004/0236465 A1 | 11/2004 | Butka et al. |
| 2004/0264121 A1* | 12/2004 | Orriss et al. .............. 361/685 |
| 2005/0004703 A1 | 1/2005 | Christie |
| 2005/0010836 A1 | 1/2005 | Bae et al. |
| 2005/0018397 A1 | 1/2005 | Kay et al. |
| 2005/0055601 A1 | 3/2005 | Wilson et al. |
| 2005/0057849 A1 | 3/2005 | Twogood et al. |
| 2005/0069400 A1 | 3/2005 | Dickey et al. |
| 2005/0109131 A1 | 5/2005 | Wanek et al. |
| 2005/0116702 A1 | 6/2005 | Wanek et al. |
| 2005/0131578 A1 | 6/2005 | Weaver |
| 2005/0179457 A1 | 8/2005 | Min et al. |
| 2005/0207059 A1 | 9/2005 | Cochrane |
| 2005/0219809 A1 | 10/2005 | Muncaster et al. |
| 2005/0225338 A1 | 10/2005 | Sands et al. |
| 2005/0270737 A1* | 12/2005 | Wilson et al. .............. 361/685 |
| 2006/0023331 A1 | 2/2006 | Flechsig et al. |
| 2006/0028802 A1 | 2/2006 | Shaw et al. |
| 2006/0066974 A1 | 3/2006 | Akamatsu et al. |
| 2006/0077776 A1 | 4/2006 | Matsushima et al. |
| 2006/0130316 A1 | 6/2006 | Takase et al. |
| 2006/0190205 A1 | 8/2006 | Klein et al. |
| 2006/0227517 A1 | 10/2006 | Zayas et al. |
| 2006/0250766 A1 | 11/2006 | Blaalid et al. |
| 2006/0269384 A1 | 11/2006 | Kiaie et al. |
| 2007/0034368 A1 | 2/2007 | Atkins et al. |
| 2007/0035874 A1 | 2/2007 | Wendel et al. |
| 2007/0035875 A1 | 2/2007 | Hall et al. |
| 2007/0053154 A1 | 3/2007 | Fukuda et al. |
| 2007/0082907 A1 | 4/2007 | Canada et al. |
| 2007/0127202 A1 | 6/2007 | Scicluna et al. |
| 2007/0127206 A1 | 6/2007 | Wade et al. |
| 2007/0195497 A1 | 8/2007 | Atkins |
| 2007/0248142 A1* | 10/2007 | Rountree et al. .............. 374/141 |
| 2007/0253157 A1* | 11/2007 | Atkins et al. .............. 361/685 |
| 2007/0286045 A1 | 12/2007 | Onagi et al. |
| 2008/0007865 A1 | 1/2008 | Orriss et al. |
| 2008/0030945 A1 | 2/2008 | Mojaver et al. |
| 2008/0112075 A1 | 5/2008 | Farquhar et al. |
| 2008/0239564 A1 | 10/2008 | Farquhar et al. |
| 2008/0282275 A1 | 11/2008 | Zaczek et al. |
| 2008/0282278 A1 | 11/2008 | Barkley |
| 2009/0028669 A1 | 1/2009 | Rebstock |
| 2009/0082907 A1 | 3/2009 | Stuvel et al. |
| 2009/0122443 A1 | 5/2009 | Farquhar et al. |
| 2009/0142169 A1 | 6/2009 | Garcia et al. |
| 2009/0153992 A1 | 6/2009 | Garcia et al. |
| 2009/0153993 A1 | 6/2009 | Garcia et al. |
| 2009/0153994 A1 | 6/2009 | Merrow |
| 2009/0175705 A1 | 7/2009 | Nakao et al. |
| 2009/0261047 A1 | 10/2009 | Merrow |
| 2009/0261228 A1 | 10/2009 | Merrow |
| 2009/0261229 A1 | 10/2009 | Merrow |
| 2009/0262444 A1 | 10/2009 | Polyakov et al. |
| 2009/0262445 A1 | 10/2009 | Noble et al. |
| 2009/0262454 A1 | 10/2009 | Merrow |
| 2009/0262455 A1 | 10/2009 | Merrow |
| 2009/0265032 A1 | 10/2009 | Toscano et al. |
| 2009/0265043 A1 | 10/2009 | Merrow |
| 2009/0265136 A1 | 10/2009 | Garcia et al. |
| 2009/0297328 A1 | 12/2009 | Slocum, III |

FOREIGN PATENT DOCUMENTS

| | | |
|---|---|---|
| CN | 2341188 | 9/1999 |
| CN | 1114109 | 7/2003 |
| CN | 1192544 | 3/2005 |
| DE | 3786944 | 11/1993 |
| DE | 69111634 | 5/1996 |
| DE | 69400145 | 10/1996 |
| DE | 19701548 | 8/1997 |
| DE | 19804813 | 9/1998 |
| DE | 69614460 | 6/2002 |
| DE | 69626584 | 12/2003 |
| DE | 19861388 | 8/2007 |
| EP | 0210497 | 7/1986 |
| EP | 0242970 | 10/1987 |
| EP | 0 277 634 A | 8/1988 |
| EP | 0356977 | 8/1989 |
| EP | 0442642 | 2/1991 |
| EP | 0466073 | 7/1991 |
| EP | 0776009 | 11/1991 |
| EP | 0582017 | 2/1994 |
| EP | 0617570 | 9/1994 |
| EP | 0635836 | 1/1995 |
| EP | 741508 | 11/1996 |
| EP | 0757320 | 2/1997 |
| EP | 0757351 | 2/1997 |
| EP | 0840476 | 5/1998 |
| EP | 1 045 301 A | 10/2000 |
| EP | 1209557 | 5/2002 |
| EP | 1422713 | 5/2004 |
| EP | 1234308 | 5/2006 |
| EP | 1760722 | 3/2007 |
| EP | 1612798 | 11/2007 |
| GB | 2241118 | 8/1991 |
| GB | 2276275 | 9/1994 |
| GB | 2299436 | 10/1996 |
| GB | 2312984 | 11/1997 |
| GB | 2328782 | 3/1999 |
| GB | 2439844 | 7/2008 |
| JP | 61-115279 | 6/1986 |
| JP | 62-177621 | 8/1987 |
| JP | 62-239394 | 10/1987 |
| JP | 62-251915 | 11/1987 |
| JP | 63-002160 | 1/1988 |
| JP | 63-004483 | 1/1988 |
| JP | 63-016482 | 1/1988 |
| JP | 63-062057 | 3/1988 |
| JP | 63-201946 | 8/1988 |
| JP | 63-214972 | 9/1988 |
| JP | 63-269376 | 11/1988 |
| JP | 63-195697 | 12/1988 |
| JP | 64-089034 | 4/1989 |
| JP | 2-091565 | 3/1990 |
| JP | 2-098197 | 4/1990 |
| JP | 2-185784 | 7/1990 |
| JP | 2-199690 | 8/1990 |
| JP | 2-278375 | 11/1990 |
| JP | 2-297770 | 12/1990 |
| JP | 3-008086 | 1/1991 |
| JP | 3-078160 | 4/1991 |
| JP | 3-105704 | 5/1991 |
| JP | 3-207947 | 9/1991 |
| JP | 3-210662 | 9/1991 |
| JP | 3-212859 | 9/1991 |
| JP | 3-214490 | 9/1991 |
| JP | 3-240821 | 10/1991 |
| JP | 3-295071 | 12/1991 |
| JP | 4-017134 | 1/1992 |
| JP | 4-143989 | 5/1992 |
| JP | 4-172658 | 6/1992 |
| JP | 4-214288 | 8/1992 |
| JP | 4-247385 | 9/1992 |
| JP | 4-259956 | 9/1992 |
| JP | 4-307440 | 10/1992 |
| JP | 4-325923 | 11/1992 |
| JP | 5-035053 | 2/1993 |
| JP | 5-035415 | 2/1993 |
| JP | 5-066896 | 3/1993 |
| JP | 5-068257 | 3/1993 |
| JP | 5-073566 | 3/1993 |
| JP | 5-073803 | 3/1993 |
| JP | 5-101603 | 4/1993 |
| JP | 5-173718 | 7/1993 |
| JP | 5-189163 | 7/1993 |
| JP | 5-204725 | 8/1993 |
| JP | 5-223551 | 8/1993 |
| JP | 6-004220 | 1/1994 |
| JP | 6-004981 | 1/1994 |
| JP | 6-162645 | 6/1994 |

(56) References Cited

FOREIGN PATENT DOCUMENTS

| | | |
|---|---|---|
| JP | 6-181561 | 6/1994 |
| JP | 6-215515 | 8/1994 |
| JP | 6-274943 | 9/1994 |
| JP | 6-314173 | 11/1994 |
| JP | 7-007321 | 1/1995 |
| JP | 7-029364 | 1/1995 |
| JP | 7-037376 | 2/1995 |
| JP | 7-056654 | 3/1995 |
| JP | 7-111078 | 4/1995 |
| JP | 7-115497 | 5/1995 |
| JP | 7-201082 | 8/1995 |
| JP | 7-226023 | 8/1995 |
| JP | 7-230669 | 8/1995 |
| JP | 7-257525 | 10/1995 |
| JP | 1982246 | 10/1995 |
| JP | 7-307059 | 11/1995 |
| JP | 8007994 | 1/1996 |
| JP | 8-030398 | 2/1996 |
| JP | 8-030407 | 2/1996 |
| JP | 8-079672 | 3/1996 |
| JP | 8-106776 | 4/1996 |
| JP | 8-110821 | 4/1996 |
| JP | 8-167231 | 6/1996 |
| JP | 8-212015 | 8/1996 |
| JP | 8-244313 | 9/1996 |
| JP | 8-263525 | 10/1996 |
| JP | 8-263909 | 10/1996 |
| JP | 8-297957 | 11/1996 |
| JP | 2553315 | 11/1996 |
| JP | 9-044445 | 2/1997 |
| JP | 9-064571 | 3/1997 |
| JP | 9-082081 | 3/1997 |
| JP | 2635127 | 7/1997 |
| JP | 9-306094 | 11/1997 |
| JP | 9-319466 | 12/1997 |
| JP | 10-040021 | 2/1998 |
| JP | 10-049365 | 2/1998 |
| JP | 10-064173 | 3/1998 |
| JP | 10-098521 | 4/1998 |
| JP | 2771297 | 7/1998 |
| JP | 10-275137 | 10/1998 |
| JP | 10-281799 | 10/1998 |
| JP | 10-320128 | 12/1998 |
| JP | 10-340139 | 12/1998 |
| JP | 2862679 | 3/1999 |
| JP | 11-134852 | 5/1999 |
| JP | 11-139839 | 5/1999 |
| JP | 2906930 | 6/1999 |
| JP | 11-203201 | 7/1999 |
| JP | 11-213182 | 8/1999 |
| JP | 11-327800 | 11/1999 |
| JP | 11-353128 | 12/1999 |
| JP | 11-353129 | 12/1999 |
| JP | 2000-056935 | 2/2000 |
| JP | 2000-066845 | 3/2000 |
| JP | 2000-112831 | 4/2000 |
| JP | 2000-113563 | 4/2000 |
| JP | 2000-114759 | 4/2000 |
| JP | 2000-125290 | 4/2000 |
| JP | 3052183 | 4/2000 |
| JP | 2000-132704 | 5/2000 |
| JP | 2000-149431 | 5/2000 |
| JP | 2000-228686 | 8/2000 |
| JP | 2000-235762 | 8/2000 |
| JP | 2000-236188 | 8/2000 |
| JP | 2000-242598 | 9/2000 |
| JP | 2000-278647 | 10/2000 |
| JP | 3097994 | 10/2000 |
| JP | 2000-305860 | 11/2000 |
| JP | 2001-005501 | 1/2001 |
| JP | 2001-023270 | 1/2001 |
| JP | 2001-100925 | 4/2001 |
| JP | 2002-42446 | 2/2002 |
| JP | 2007-87498 | 4/2007 |
| JP | 2007-188615 | 7/2007 |
| JP | 2007-220184 | 8/2007 |
| JP | 2007-293936 | 11/2007 |
| JP | 2007-305206 | 11/2007 |
| JP | 2007-305290 | 11/2007 |
| JP | 2007-328761 | 12/2007 |
| JP | 2008-503824 | 2/2008 |
| KR | 10-1998-0035445 | 8/1998 |
| KR | 10-0176527 | 11/1998 |
| KR | 10-0214308 | 8/1999 |
| KR | 10-0403039 | 10/2003 |
| SG | 45223 | 1/1998 |
| TW | 387574 | 4/2000 |
| WO | WO 89/01682 | 8/1988 |
| WO | WO 97/06532 | 2/1997 |
| WO | WO 00/49487 | 2/2000 |
| WO | WO 00/67253 | 11/2000 |
| WO | WO 01/09627 | 2/2001 |
| WO | WO 01/41148 | 6/2001 |
| WO | WO 03 /013783 | 2/2003 |
| WO | WO 03 /021597 | 3/2003 |
| WO | WO 03 /021598 | 3/2003 |
| WO | WO 03 /067385 | 8/2003 |
| WO | WO 2004/006260 | 1/2004 |
| WO | WO 2004/114286 | 12/2004 |
| WO | WO 2005/024830 | 3/2005 |
| WO | WO 2005/024831 | 3/2005 |
| WO | WO 2005/109131 | 11/2005 |
| WO | WO 2006/030185 | 3/2006 |
| WO | WO 2006/048611 | 5/2006 |
| WO | WO 2006/100441 | 9/2006 |
| WO | WO 2006/100445 | 9/2006 |
| WO | WO 2007/031729 | 3/2007 |

OTHER PUBLICATIONS

Abramovitch, "Rejecting Rotational Disturbances on Small Disk Drives Using Rotational Accelerometers", Proceedings of the 1996 IFAC World Congress in San Francisco, CA, Jul. 1996 http://dabramovitch.com/pubs/amrfac_matj.pdf.

Ali et al., "Modeling and Simulation of Hard Disk Drive Final Assembly Using a HDD Template" Proceedings of the 2007 Winter Simulation Conference, IEEE pp. 1641-1650, 2007 http://portal.acm.org/citation.cfm?id=1351837.

Anderson et al., "Clinical chemistry: concepts and applications", The McGraw-Hill Companies, Inc., pp. 131-132, 2003.

Anderson et al., "High Reliability Variable Load Time Controllable Vibration Free Thermal Processing Environment", Delphion, hhttps://www.delphion.com/tdbs/tdb?order=93A+63418, 3 pages, Mar. 18, 2009.

Asbrand, "Engineers at One Company Share the Pride and the Profits of Successful Product Design", Professional Issues, 4 pages, 1987.

Bair et al., "Measurements of Asperity Temperatures of a Read/Write Head Slider Bearing in Hard Magnetic Recording Disks", Journal of Tribology 113:547-554, Jul. 1991.

Bakken et al., "Low Cost, Rack Mounted, Direct Access Disk Storage Device", www.ip.com, 4 pages, Mar. 3, 2005.

Biber et al., "Disk Drive Drawer Thermal Management", Advances in Electronic Packaging vol. 1:43-46, 1995.

Christensen, "How Can Great firms Fail? Insights from the hard Disk Drive Industry", Harvard Business School Press, pp. 1-26, 2006.

Chung et al., "Vibration Absorber for Reduction of the In-plane Vibration in an Optical Disk Drive", IEEE Transactions on Consumer Electronics, Vo. 48, May 2004.

Curtis et al., "InPhase Professional Archive Drive Architecture" Dec. 17, 2007 http://www.science.edu/TechoftheYear/Nominees/InPhase/Holographic%20Storage.pdf.

Findeis et al., "Vibration Isolation Techniques Sutiable for Portable Electronic Speckle Pattern Interferometry", Proc. SPIE vol. 4704, pp. 159-167, 2002 http://www.ndt.uct.ac.za/Papers/spiendt2002.pdf.

FlexStar Technology, 30E/Cascade Users Manual, Doc #98-36387-00 Rev. 1.8, pp. 1-33, Jun. 1, 2004.

FlexStar Technology, "A World of Storage Testing Solutions," http://www.flexstar.com, 1 page (1999).

FlexStar Technology, "Environment Chamber Products," http://www.flexstar.com, 1 page (1999).

(56) References Cited

OTHER PUBLICATIONS

FlexStar Technology, "FlexStar's Family of Products," http://www.flexstar.com, 1 page (1999).
Frankovich, "The Basics of Vibration Isolation Using Elastomeric Materials", EARSC, 2005 http://www.isoloss.com/pdfs/engineering/BasicsofVibrationIsolation.pdf.
Grochowski et al., "Future Trends in Hard Disk Drives" IEEE Transactions on Magnetics, vol. 32, No. 3, pp. 1850-1854, May, 1996 http://svn.tribler.org/abc/branches/leo/dataset/preferences/johan/johan-68.pdf.
Gurumurthi et al., "Disk Drive Roadmap from the Thermal Perspective: A Case for Dynamic Thermal Management", International Symposium on Computer Architecture, Proceedings of the $32^{nd}$ Annual International Symposium on Computer Architecture, IEEE Computer Society, pp. 38-49, 2005 http://portal.acm.org/citation.cfm?id=1069807.1069975.
Gurumurthi, "The Need for temperature-Aware Storage Systems", The Tenth Intersociety conference on Thermal and Thermomechanical Phenomena in Electronics, ITHERM pp. 387-394, 2006.
Gurumurthi et al., "Thermal Issues in Disk Drive Design: Challenges and Possible Solutions", ACM Transactions on Storage 2:41-73, Feb. 2006.
Haddad et al., "A new Mounting Adapter for Computer Peripherals with Improved Reliability, Thermal Distribution, Low Noise and Vibration Reduction", ISPS, Advances in Information Storage and Processing Systems, 1:97-108, 1995.
Henderson, "HAD High Aerial Densities Require Solid Test Fixtures", Flexstar Technology, Feb. 26, 2007.
HighBeam Research website "ACT debuts six-zone catalytic gas heater. (American Catalytic Technologies offers new heaters)" www.highbeam.com, 4 pages, 1998.
HighBeam Research website "Asynchronous Testing Increases Throughput." www.highbeam.com, 7 pages, 2000.
HighBeam Research website "Credence announces Production Release of the EPRO AQ Series for Integrated Test and Back-end Processing." www.highbeam.com, 4 pages, 1995.
HighBeam Research website "Test Multiple Parts At Once for Air Leaks. (Brief Article)", www.highbeam.com, 1 page, 1999.
Iwamiya, "Hard Drive Cooling Using a Thermoelectric Cooler", EEP-vol. 19-2, Advances in Electronic Packaging, vol. 2:2203-2208, ASME 1997.
Johnson et al., "Performance Measurements of Tertiary Storage Devices", Proceedings of the $24^{th}$ VLDB Conference, New York, pp. 50-61, 1998.
Ku, "Investigation of Hydrodynamic Bearing Friction in Data Storage information System Spindle Motors", ISPSVo1. 1, Advances in Information Storage and Processing Systems, pp. 159-165, ASME 1995.
Lindner, "Disk drive mounting", IBM Technical Disclosure Brochure, vol. 16, No. 3, pp. 903-904, Aug., 1973.
McAuley, "Recursive Time Trapping for Synchronization of Product and Chamber Profiles for Stress Test", Delphion, www.delphion.com/tdbs/tdb?order=88A+60957. 3 pages, Mar. 18, 2009.
Morgenstern, Micropolis Drives Target High-end Apps; Technology Provides Higher Uninterrupted Data Transfer. (Applications; Microdisk AV LS 3020 and 1050AV and 1760AV LT Stackable Hard Drive Systems) (Product Announcement) MacWeek, vol. 8, No. 6, p. 8; Feb. 7, 1994.
Morris, "Zero Cost Power and Cooling Monitor System", www.delphion.com/tdbs/tdb?order=94A+61950, 3 pages, Jan. 15, 2008.
Nagarajan, "Survey of Cleaning and cleanliness Measurement in Disk Drive Manufacture", North Carolina Department of Environment and Natural Resources, Feb. 1997.
Notification of Transmittal of the International Search Report and the Written Opinion of the International Searching Authority, or the Declaration, PCT/US2008/086181, 15 pages, Mar. 16, 2009.
Park, "Vibration and Noise Reduction of an Optical Disk Drive by Using a Vibration Absorber Methods and Apparatus for Securing Disk Drives in a Disk", IEEE Transactions on Consumer Electronics, vol. 48, Nov. 2002.
Prater et al., "Thermal and Heat-Flow Aspects of Actuators for Hard Disk Drives", InterSociety Conference on Thermal Phenomena, pp. 261-268, 1994.
Ruwart et al., "Performance Impact of External Vibration on Consumer-grade and enterprise-class Disk Drives", Proceedings of the $22^n$IEEE/$13^{th}$Goddard Conference on Mass Storage Systems and Technologies, 2005.
Seagate Product Marketing, "Seagate's Advanced Multidrive System (SAMS) Rotational Vibration Feature", Publication TP-229D, Feb. 2000.
Schroeder et al., "Disk Failures in the Real World: What does an MTTP of 1,000,000 hours mean to you?", In FAST'07: $5^{th}$USENIX Conference on File and Storage Technologies, San Jose, CA, Feb. 14-16, 2007.
Schulze et al., "How Reliable is a Raid?," COMPCON Spring apos; 89. Thirty-Fouth IEEE Computer Society International Conference: Intellectual Leverage, Digest of papers; pp. 118-123, Feb. 27—Mar. 3, 1989.
Terwiesch et al., "An Exploratory Study of International Product Transfer and Production Ramp-Up in the Data Storage Industry", The Information Storage Industry Center, University of California, www-irps.ucsd.edu/~sloan/, pp. 1-31, 1999.
Tzeng, "Dynamic Torque Characteriestics of Disk-Drive Spindle Bearings", ISPS-vol. 1, Advances in Information Storage and Processing Systems, pp. 57-63, ASME 1995.
Tzeng, "Measurements of Transient Thermal Strains in a Disk-Drive Actuator", InterSociety conference on Thermal Phenomena, pp. 269-274, 1994.
Wilson—7000 disk Drive Analyzer Product Literature, date accessed Jan. 28, 2009, 2 pages.
Winchester, "Automation Specialists Use Machine Vision as a System Development Tool", IEE Computing & Control Engineering, Jun./Jul. 2003.
Xyratex website "Storage Infrastructure" www.xyratex.com/Products/storageinfrastructure/default.aspx 1995-2008.
Xyratex website "Production Test Systems" www.xyratex.com/Products/production-test-systems/default.aspx 1995-2008.
Xyratex website "Single cell—Production Test Systems" www.xyratex.com/products/production-test-systems/single-cell.aspx 1995-2008.
Xyratex website "Continuous Innovation—Production Test Systems" www.xyratex.com/products/production-test-systems/continuous-innovation.aspx 1995-2008.
Xyratex website "Key Advantages—Production Test Systems" www.xyratex.com/products/production-test-systems/advantages.aspx 1995-2008.
Xyratex website "Testing Drives Colder—Production Test Systems" www.xyratex.com/products/productino-test-systems/colder.aspx 1995-2008.
"Xyratex to Debut its New Automated Test Solution for 2.5—Inch Disk Drives at DISKCON USA 2004" 2004 PR Newswire Europe www.prnewswire.co.uk/cgi/news/release?id=130103.
"Automated Production Test Solutions", Xyratex Product Test brochure, 2006.
Xyratex "Process Challenges in the Hard Drive Industry" slide presentation, 2006 Asian Diskcon.
Suwa et al., "Evaluation System for Residual Vibration from HDD Mounting Mechanism" IEEE Transactions on Magnetics, vol. 35, No. 2, pp. 868-873, Mar. 1999.
Suwa et al., "Rotational Vibration Suppressor" IBM Technical Disclosure Bulletin Oct. 1991.
Yee Leong Low et al., "Thermal network model for temperature prediction in hard disk drive" Journal Microsystem Technologies, vol. 15, No. 10-11, pp. 1653-1656, Oct. 2009 http://www.springerlink.com/content/20668jn67pk426r5/.
European Examiner Claudia Gaur, Annex to Form PCT/ASA/206 Communication Relating to the Results of the Partial International Search, for International Application No. PCT/US2008/086814, dated Apr. 3, 2009, 5 pages.
European Examiner Claudia Gaur, Annex to Form PCT/ASA/206 Communication Relating to the Results of the Partial International Search, for International Application No. PCT/US2008/086809, dated Apr. 3, 2009, 1 page.

(56) References Cited

OTHER PUBLICATIONS

Korean Examiner Park Jang Hwan, Notification of Transmittal of the International Search Report and the Written Opinion of the International Searching Authority, or the Declaration, for International Application No. PCT/US2009/039926, Sep. 1, 2009, 13 pages.
Korean Examiner, Park Tang Hwan, Notification of Transmittal of the International Search Report and the Written Opinion of the International Searching Authority, or the Declaration, for International Application No. PCT/US2009/039591, Aug. 31, 2009, 10 pages.
European Examiner, Claudia Gaur, Notification of Transmittal of the International Search Report and the Written Opinion of the International Searching Authority, or the Declaration, for International Application No. PCT/US2008/086814, Sep. 18, 2009, 17 pages.
Korean Examiner Tae Wook Park, Notification of Transmittal of the International Search Report and the Written Opinion of the International Searching Authority, or the Declaration, for International Application No. PCT/US2009/039888, Sep. 28, 2009, 13 pages.
Korean Examiner Tae Wook Park, Notification of Transmittal of the International Search Report and the Written Opinion of the International Searching Authority, or the Declaration, for International Application No. PCT/US2009/039921, Sep. 25, 2009, 14 pages.
Korean Examiner Tae Wook Park, Notification of Transmittal of the International Search Report and the Written Opinion of the International Searching Authority, or the Declaration, for International Application No. PCT/US2009/040058, Sep. 29, 2009, 13 pages.
Korean Examiner Tae Wook Park, Notification of Transmittal of the International Search Report and the Written Opinion of the International Searching Authority, or the Declaration, for International Application No. PCT/US2009/040829, Oct. 28, 2009, 13 pages.
Korean Examiner, Park Jang Hwan, Notification of Transmittal of the International Search Report and the Written Opinion of the International Searching Authority, or the Declaration, for International Application No. PCT/US2009/039590, Oct. 30, 2009, 10 pages.
Korean Examiner Tae Wook Park, Notification of Transmittal of the International Search Report and the Written Opinion of the International Searching Authority, or the Declaration, for International Application No. PCT/US2009/040835, Oct. 30, 2009, 13 pages.
Korean Examiner So Yeon Jeong, Notification of Transmittal of the International Search Report and the Written Opinion of the International Searching Authority, or the Declaration, for International Application no. PCT/US2009/040757, Nov. 24, 2009, 12 pages.
Korean Examiner So Yeon Jeong, Notification of Transmittal of the International Search Report and the Written Opinion of the International Searching Authority, or the Declaration, for International Application No. PCT/US2009/039898, Nov. 24, 2009, 12 pages.
Korean Examiner So Yeon Jeong, Notification of Transmittal of the International Search Report and the Written Opinion of the International Searching Authority, or the Declaration, for International Application No. PCT/US2009/040795, Nov. 26, 2009, 13 pages.
Korean Examiner So Yeon Jeong, Notification of Transmittal of the International Search Report and the Written Opinion of the International Searching Authority, or the Declaration, for International Application No. PCT/US2009/045583, Nov. 27, 2009, 13 pages.
Korean Examiner So Yeon Jeong, Notification of Transmittal of the International Search Report and the Written Opinion of the International Searching Authority, or the Declaration, for International Application No. PCT/US2009/040888, Dec. 29, 2009, 14 pages.
Korean Examiner Tae Wook Park, Notification of Transmittal of the International Search Report and the Written Opinion of the International Searching Authority, or the Declaration, for International Application No. PCT/US2009/040894, Dec. 22, 2009, 12 pages.
Korean Examiner Tae Wook Park, Notification of Transmittal of the International Search Report and the Written Opinion of the International Searching Authority, or the Declaration, for International Application No. PCT/US2009/039934, Dec. 23, 2009, 12 pages.
Korean Examiner Tae Wook Park, Notification of Transmittal of the International Search Report and the Written Opinion of the International Searching Authority, or the Declaration, for International Application No. PCT/US2009/040965, Dec. 23, 2009, 12 pages.
Korean Examiner Eung Gie Oh, Notification of Transmittal of the International Search Report and the Written Opinion of the International Searching Authority, or the Declaration, for International Application No. PCT/US2009/040973, Jan. 11, 2010, 13 pages.
Cardinal Intellectual Property's search report including the results of a search for the features of the claims included in the U.S. patent application entitled "Transferring Disk Drives Within Disk Drive Testing Systems", inventors: Polyakov et al, and having assigned U.S. Appl. No. 12/727,150. The foregoing U.S. patent application is a continuation of U.S. Appl. No. 12/104,536. Revised as of May 27, 2010.
Cardinal Intellectual Property's search report including the results of a search for the features of the claims included in the U.S. patent application entitled "Transferring Storage Devices Within Storage Device Testing Systems", inventors: John P. Toscano et al., and having assigned U.S. Appl. No. 12/727,201. The foregoing U.S. patent application is a continuation of U.S. Appl. No. 12/424,980. Revised as of Jan. 4, 2010.
Cardinal Intellectual Property's search report including the results of a search for the features of the claims included in the U.S. patent application entitled "Processing Storage Devices", inventors: Richard W. Slocum III., and having assigned U.S. Appl. No. 12/727,619. The foregoing U.S. patent application is a continuation of U.S. Appl. No. 12/474,388. Revised as of Jan. 5, 2009.
Cardinal Intellectual Property's search report including the results of a search for the features of the claims included in the U.S. patent application entitled "Bulk Feeding Disk Drives to Disk Drive Testing Systems", inventors: Noble et al., and having assigned U.S. Appl. No. 12/726,856. The foregoing U.S. patent application is a continuation of U.S. Appl. No. 12/104,869. Revised as of Jan. 15, 2010.
Cardinal Intellectual Property's search report including the results of a search for the features of the claims included in the U.S. patent application entitled "Dependent Temperature Control Within Disk Drive Testing Systems", inventors: Merrow et al., and having assigned U.S. Appl. No. 12/727,207. The foregoing U.S. patent application is a continuation of U.S. Appl. No. 12/105,069. Revised as of Jan. 13, 2010.
Cardinal Intellectual Property's search report including the results of a search for the features of the claims included in the U.S. patent application entitled "Test Slot Cooling System for a Storage Device Testing System", inventors: Merrow et al., and having assigned U.S. Appl. No. 12/727,700. The foregoing U.S. patent application is a continuation of U.S. Appl. No. 12/503,567. Revised as of Jan. 13, 2010.
Cardinal Intellectual Property's search report including the results of a search for the features of the claims included in the U.S. patent application entitled "Storage Device Testing System Cooling", inventors: Brian S. Merrow and having assigned U.S. Appl. No. 12/775,560. The foregoing U.S. patent application is a continuation of U.S. Appl. No. 12/698,575. Revised as of Feb. 17, 2010.
Cardinal Intellectual Property's search report including the results of a search for the features of the claims included in the U.S. patent application entitled " Conductive Heating" ,inventors: Brian S. Merrow et al., and having assigned U.S. Appl. No. 12/760,164. The foregoing U.S. patent application is a continuation of U.S. Appl. No. 12/ 503,593. Revised as of Jan. 6, 2010.
Cardinal Intellectual Property's search report including the results of a search for the features of the claims included in the U.S. patent application entitled "Storage Device Temperature Sensing", inventors: Brian S. Merrow et al., and having assigned U.S. Appl. No. 12/760,305. The foregoing U.S. patent application is a continuation of U.S. Appl. No. 12/503,687. Revised as of Jan. 7, 2010.
Cardinal Intellectual Property's search report including the results of a search for the features of the claims included in the U.S. patent application entitled "Solid State Temperature Control of Hard Drive Tester", inventors Brian S. Merrow and having assigned U.S. Appl. No. 12/856,056. The foregoing U.S. patent application is a continuation of U.S. Appl. No. 12/105,103. Revised as of Jan. 14, 2010.
Cardinal Intellectual Property's search report including the results of a search for the features of the claims included in the U.S. patent application entitled "Vibration Isolation Within Disk Drive Testing Systems ", inventors: Brian S. Merrow and having assigned U.S.

(56) References Cited

OTHER PUBLICATIONS

Appl. No. 12/767,142. The foregoing U.S. patent application is a continuation of U.S. Appl. No. 12/105,105. Revised as of Jan. 12, 2010.

Cardinal Intellectual Property's search report including the results of a search for the features of the claims included in the U.S. patent application entitled "Disk Drive Clamping Transport and Testing", inventors: Brian S. Merrow et al., and having assigned U.S. Appl. No. 12/766,680. The foregoing U.S. patent application is a continuation of U.S. Appl. No. 11/959,133. Revised as of Jan. 14, 2010.

Cardinal Intellectual Property's search report including the results of a search for the features of the claims included in the U.S. patent application entitled "Chilled Water Temp Control of Disk Drive Tester", inventors: Brian S. Merrow and having assigned U.S. Appl. No. 12/766,680. The forgoing U.S. patent application is a continuation of U.S. Appl. No. 12/105,061. Revised as of Feb. 18, 2010.

Cardinal Intellectual Property's search report including the results of a search for the features of the claims included in the U.S. patent application entitled "Vibration Isolation Within Disk Drive Testing Systems," inventors: Brian S. Merrow and having assigned U.S. Appl. No. 12/767,142. The foregoing U.S. patent application is a continuation of U.S. Appl. No. 12/105,105. Revised as of Mar. 30, 2010.

Cardinal Intellectual Property's search report including the results of a search for the features of the claims included in the U.S. patent application entitled "Disk Drive Clamping Transport and Testing," inventors: Brian S. Merrow et al., and having assigned U.S. Appl. No. 12/767,113. The foregoing U.S. patent application is a continuation of U.S. Appl. No. 11/959,133. Revised as of Apr. 4, 2010.

Cardinal Intellectual Property's search report including the results of a search for the features of the claims included in the U.S. patent application entitled "Disk Drive Clamping Transport and Testing," inventors: Brian S. Merrow et al., and having assigned U.S. Appl. No. 12/766,680. The foregoing U.S. patent application is a continuation of U.S. Appl. No. 11/959,133. Revised as of April 1, 2010.

Exhibit 1 in Xyratex Technology, LTD v. Teradyne, Inc.; Newspaper picture that displays the CSO tester; 1990.

Exhibit 2 in Xyratex Technology, LTD v. Teradyne, Inc.; Photos of the CSO tester obtained from Hitachi; 1990.

Exhibit 1326 in Xyratex Technology, LTD v. Teradyne, Inc.; Image of the back of Exhibit 1 and Exhibit 2 photos, which display the photos' dates; 1990.

Exhibit 1314 in Xyratex Technology, LTD. V. Teradyne, Inc.; Case, "Last products of Disk-File Development at Hursley and Millbrook," IBM, Oct. 12, 1990.

Exhibit 1315 in Xyratex Technology, LTD. V. Teradyne, Inc.; Case, "History of Disk-File Development at Hursley and Millbrook," IBM, Oct. 17, 1990.

Xyratex Technology, LTD. V. Teradyne, Inc., Teradyne, Inc's Prior Art Notice Pursuant to 35 U.S.C. Section 282. Case No. CV 08-04545 SJO (PLAx), Oct. 16, 2009.

Xyratex Technology, LTD. V. Teradyne, Inc., Amended Joint Trial Exhibit List of Xyratex and Teradyne. Case No. CV 08-04545 SJO (PLAx), Nov. 12, 2009.

Europeon examiner Nora Lindner, Notification of Transmittal of the International Search Report and the Written Opinion of the International Searching Authority, or the Declaration, for International Application No. PCT/GB2005/003490, Jan. 26, 2006, 10 pages.

International Search Report and Written Opinion for International Application No. PCT/US2010/042122, dated Feb. 7, 2011.

International Preliminary Report on Patentability, dated Jan. 26, 2012, received in International Application No. PCT/US2010/042122, 7 pgs.

\* cited by examiner

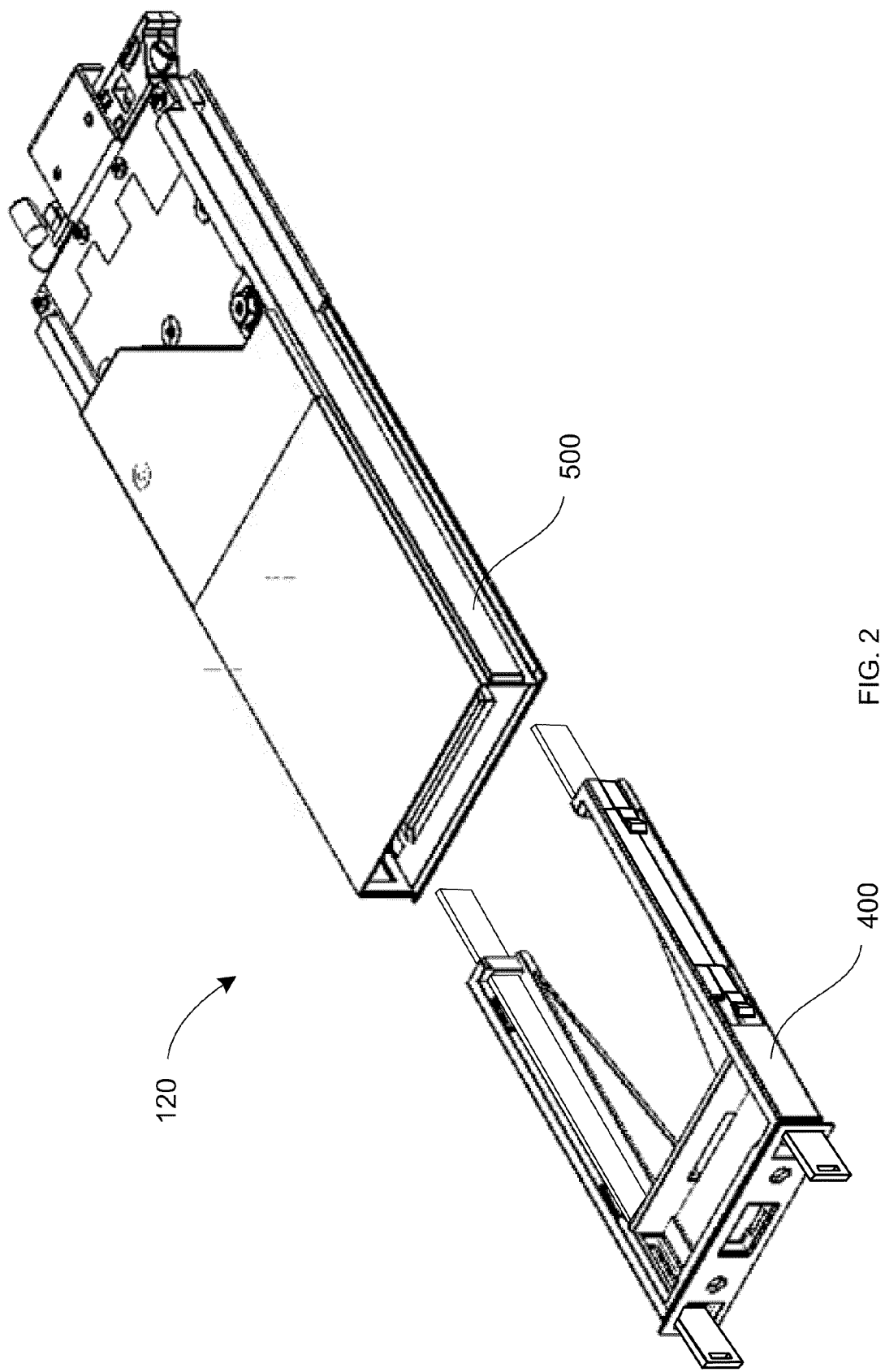

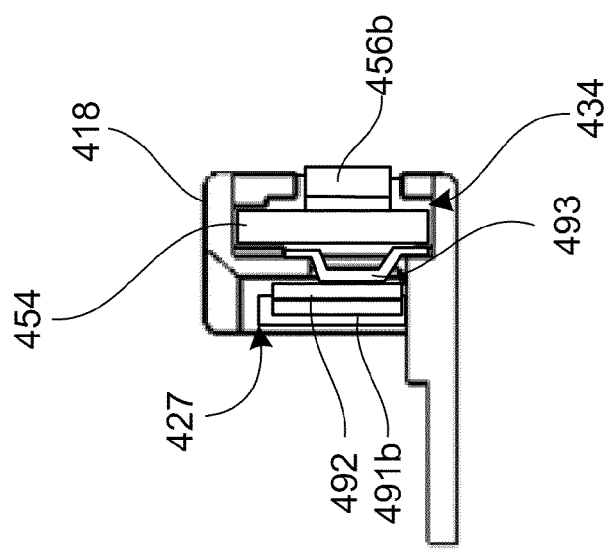
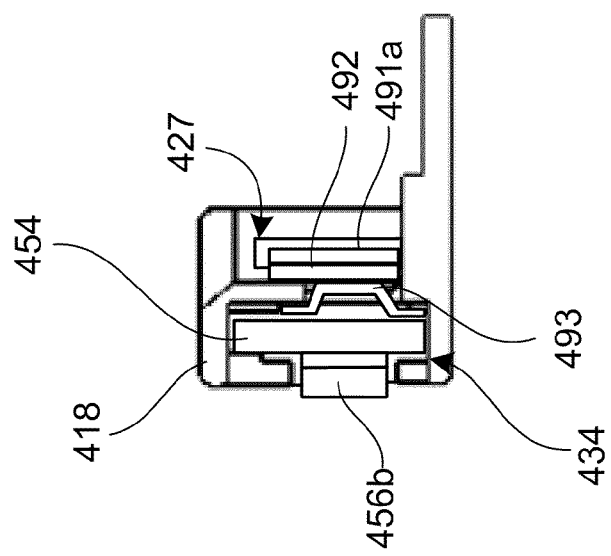
FIG.15D

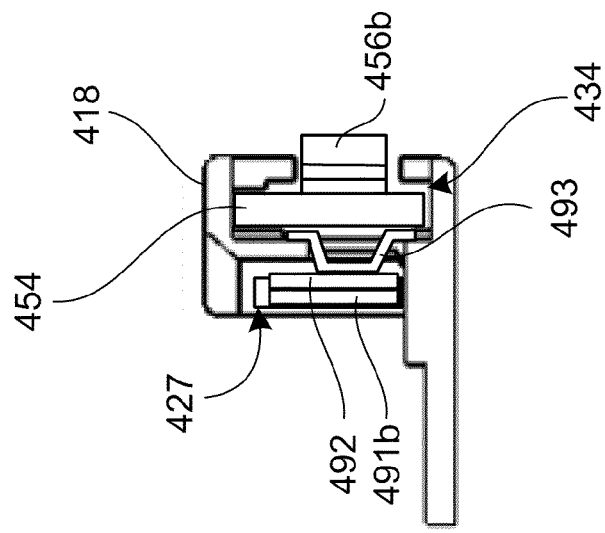
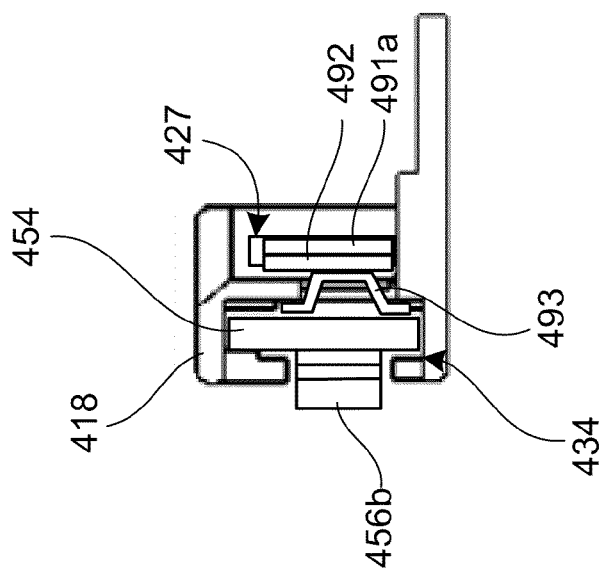
FIG. 16C

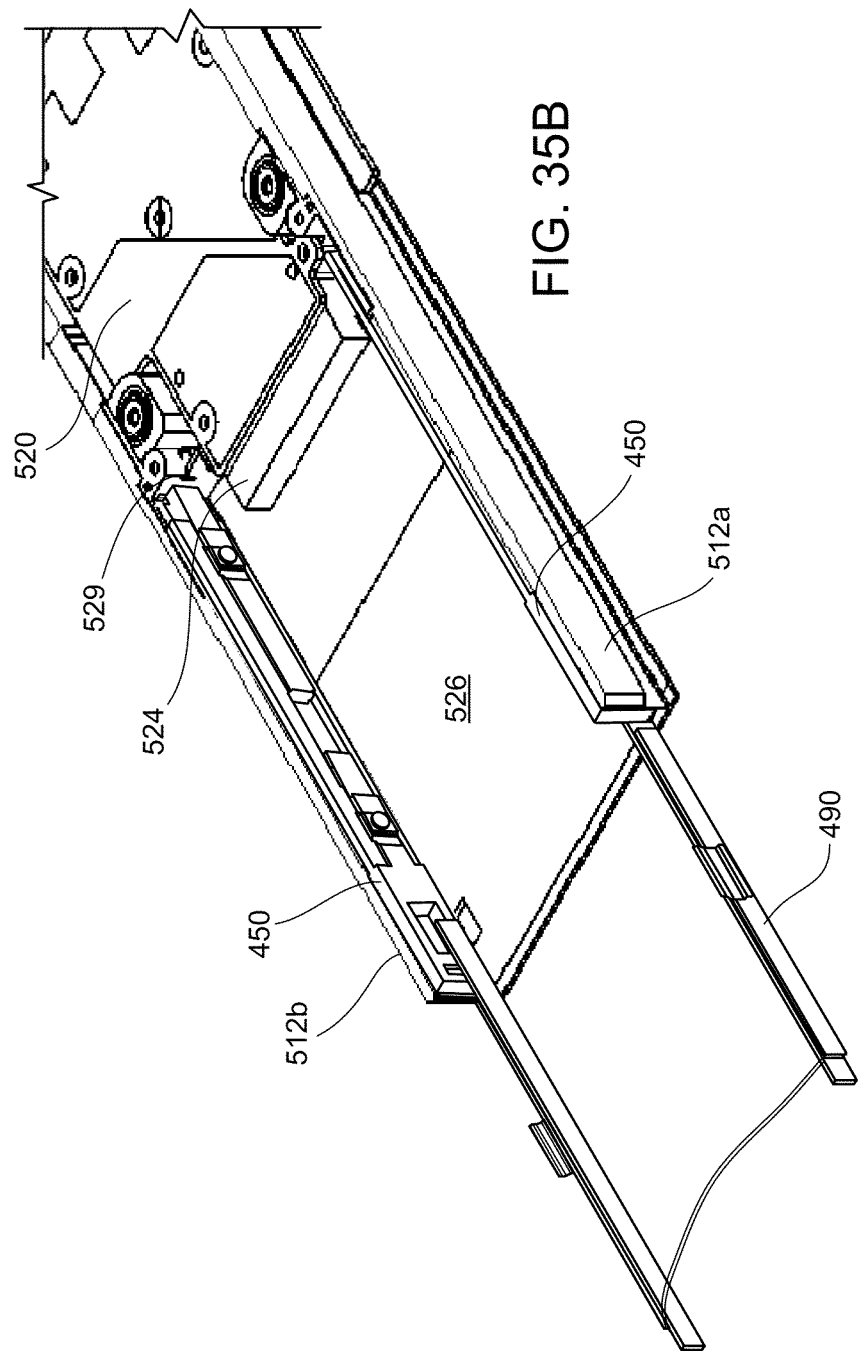

STORAGE DEVICE TEMPERATURE SENSING

CROSS REFERENCE TO RELATED APPLICATIONS

This application is a continuation-in-part and claims the benefit of priority under 35 U.S.C. §120 of U.S. application Ser. No. 12/503,687, filed Jul. 15, 2009 now U.S. Pat. No. 7,995,349. The disclosure of the prior application is considered part of, and is incorporated by reference in, the disclosure of this application.

TECHNICAL FIELD

This disclosure relates to sensing the temperature of storage devices during testing.

BACKGROUND

Disk drive manufacturers typically test manufactured disk drives for compliance with a collection of requirements. Test equipment and techniques exist for testing large numbers of disk drives serially or in parallel. Manufacturers tend to test large numbers of disk drives simultaneously. Disk drive testing systems typically include one or more racks having multiple test slots that receive disk drives for testing.

The testing environment immediately around the disk drive is regulated. The latest generations of disk drives, which have higher capacities, faster rotational speeds and smaller head clearance, are more sensitive to vibration. Excess vibration can affect the reliability of test results and the integrity of electrical connections. Under test conditions, the drives themselves can propagate vibrations through supporting structures or fixtures to adjacent units. This vibration "cross-talking," together with external sources of vibration, contributes to bump errors, head slap and non repeatable run-out (NRRO), which may result in lower test yields and increased manufacturing costs.

During the manufacture of disk drives or other storage devices, it is common to control the temperature of the storage devices, e.g., to ensure that the storage devices are functional over a predetermined temperature range. For this reason, the testing environment immediately around the storage devices is regulated. Minimum temperature fluctuations in the testing environment can be critical for accurate test conditions and for safety of the storage devices. In some known testing systems, the temperature of plural disk drive devices is adjusted by using cooling or heating air which is common to all of the disk drive devices.

SUMMARY

In general, this disclosure relates to sensing the temperature of storage devices during testing.

In one aspect, a test slot assembly is provided for housing a storage device during testing. The test slot assembly includes a housing that receives and supports the storage device, and provides a controlled environment for regulating the storage device temperature during testing.

In another aspect, the test slot assembly also includes a temperature sensing assembly that is associated with the housing. The temperature sensing assembly is arranged to measure a temperature of a storage device contained by the housing by way of physical contact. In a further aspect, a storage device transporter is provided for transporting a storage device and for mounting a storage device within a test slot. The storage device transporter includes a frame that is configured to receive and support a storage device. In this aspect, the test slot assembly includes a test compartment for receiving and supporting the storage device transporter.

In a further aspect, a storage device testing system includes a test slot and test electronics. The test slot includes a test compartment configured to receive a storage device and a temperature sensing assembly. The temperature sensing assembly is associated with the test compartment and is arranged to measure a temperature of a storage device contained by the test compartment by way of physical contact. The test electronics are configured to communicate one or more test routines to a storage device disposed within the test compartment.

In a further aspect, the test slot of a storage device testing system is configured to accept and mount a storage device supported by a storage device transporter. The storage device transporter includes a frame that is configured to receive and support a storage device.

According to another aspect, a method includes testing functionality of a storage device; and measuring the temperature of the storage device during the testing.

Embodiments of the disclosed methods, systems and devices may include one or more of the following features.

In some embodiments, a clamping mechanism is operatively associated with the test slot. The clamping mechanism is operable to move the temperature sensing assembly into contact with a storage device. The clamping mechanism can be configured to clamp the storage device within the test compartment of the test slot.

In some embodiments, a clamping mechanism is operatively associated with the test slot. The clamping mechanism can be configured to clamp the storage device and a storage device transporter within the test compartment of the test slot. The clamping mechanism is operable to move the temperature sensing assembly into contact with a storage device while it is supported by the storage device transporter.

In some cases, the temperature sensing assembly can include one or more thermocouples. The temperature sensing assembly can alternatively include one or more temperature sensors known in the art, including but not limited to resistive temperature sensors, semiconductor diode sensors, infrared thermometers and silicon bandgap temperature sensors. In some embodiments, the temperature sensing assembly can include printed circuitry (e.g., a printed wiring board, flexible printed circuitry, etc.). The printed circuitry can include one or more electrically conductive layers. The one or more temperature sensors can be integrated in the one or more electrically conductive layers.

The test slot assembly can also include a conductive heating assembly (e.g., a resistive heater). The conductive heating assembly can be arranged to heat the storage device. In some examples, a clamping mechanism is operatively associated with the test slot. The clamping mechanism is operable to move the conductive heating assembly and the temperature sensor into contact with a storage device supported.

In some cases the temperature sensing assembly can include one or more temperature sensors, and the test slot can include a connection interface circuit in electrical communication with the connection interface circuit.

Some embodiments have a connection interface board. The connection interface board can be configured to provide electrical communication with the test electronics, and the test electronics can be configured to monitor a temperature of a storage device based on signals received from the temperature sensing assembly. The connection interface board can be configured to monitor a temperature of a storage device based on signals received from the temperature sensing assembly. In some embodiments, the test slot assembly includes a conductive heating assembly (e.g., a resistive heater) and the connection interface board is configured to provide electrical communication between the temperature sensing assembly and the test electronics, and the connection interface board is configured to control a current flow to the conductive heating assembly based, at least in part, on signals received from the temperature sensing assembly. Alternatively or additionally, a separate temperature sensing assembly could be provided on the connection interface board that could serve as the control point. It is also possible to have a temperature sensing device that is attached to a ground line that connects to the storage device that correlates to the temperature of the storage device. In some configurations, the test electronics are configured to measure a power draw of the storage device and compensate for any error between an actual temperature of the storage device and a temperature measured by the temperature sensing assembly. In some configurations, the connection interface board provides electrical communication with the temperature sensing assembly when the storage device is disposed within the test compartment.

Methods can include measuring a temperature of the storage device with a temperature sensing assembly. Methods can also include contacting the storage device with the temperature sensing assembly. In some cases, contacting the storage device with the temperature sensing assembly can include actuating a clamping mechanism to move the temperature sensing assembly into contact with the storage device.

Methods can also include inserting a storage device into a test slot. Measuring a temperature of the storage device can include measuring the temperature of the storage device by way of physical contact while the supported storage device is disposed within the test slot.

Methods can also include inserting a storage device transporter, supporting a storage device, into a test slot. Measuring a temperature of the storage device can include measuring the temperature of the storage device by way of physical contact while the storage device transporter and the supported storage device are disposed within the test slot.

Embodiments can include one or more of the following advantages.

Direct temperature measurement of a storage device during testing can be more accurate than indirect temperature measurement methods, which can include measuring the temperature of an air flow that passes over the storage device.

Combining a temperature sensor with a clamping assembly that is capable of applying a clamping force to a storage device under test can help to ensure secure, direct contact between the temperature sensor and the storage device, and thus, can help to provide consistent and accurate measurements. Combining a temperature sensor with a clamping assembly in a test slot also obviates the need for a separate mechanism for creating physical contact between a storage device and a temperature sensor, thus allowing more consistent and controlled clamping, and reducing the cost and complexity of the test slot.

DESCRIPTION OF DRAWINGS

FIG. 2 is a perspective view of a test slot assembly.
FIG. 15D is a cross-sectional view of the storage device transporter of FIG. 15A taken along line 15D-15D.
FIG. 16C is a sectioned front view a storage device transporter with a temperature sensing assembly in an engaged position.

FIG. 35B is a perspective view of a test slot.

Like reference symbols in the various drawings indicate like elements.

DETAILED DESCRIPTION

System Overview

Figure 1:
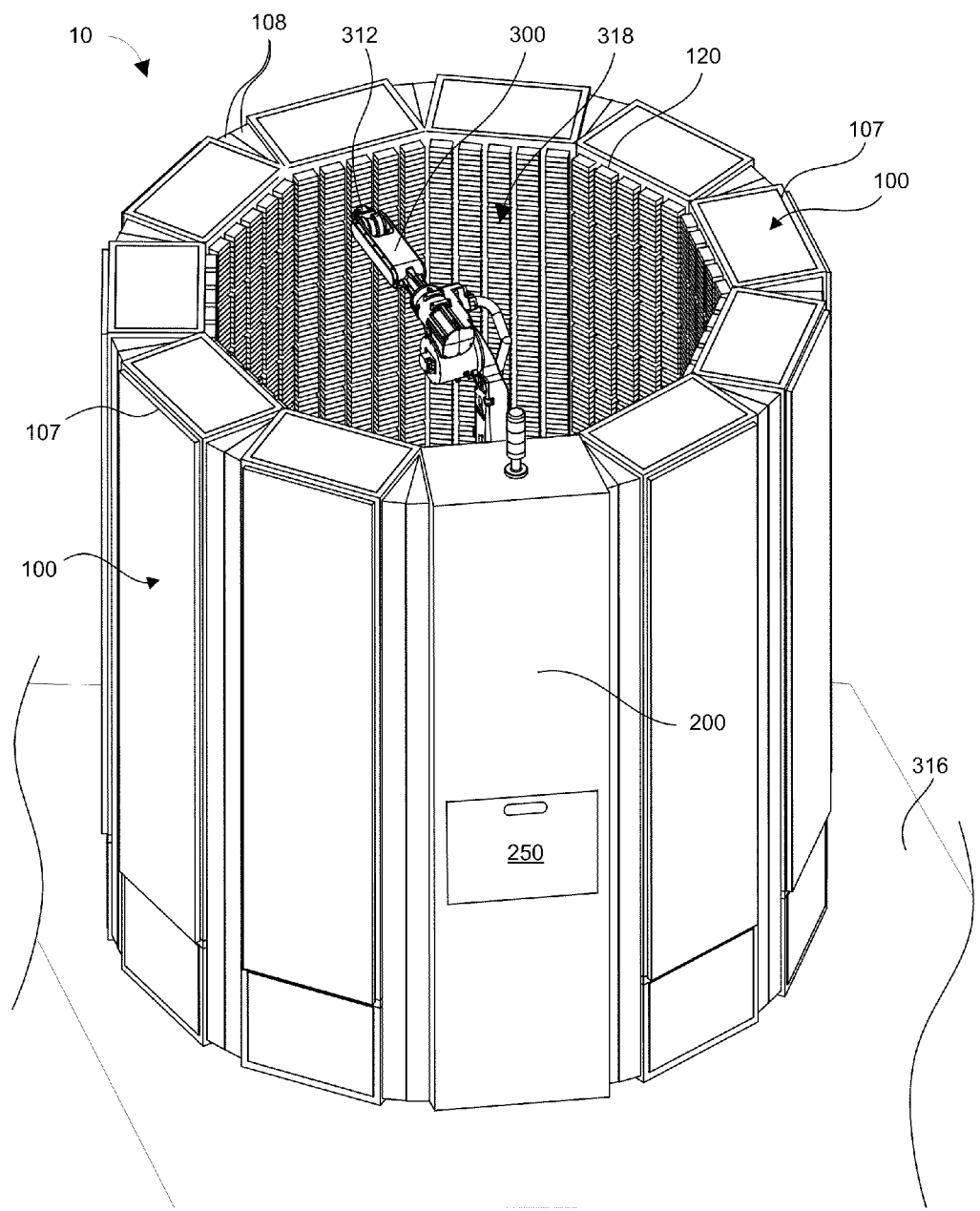
FIG. 1 is a is a perspective view of a storage device testing system.

As shown in FIG. 1, a storage device testing system 10 includes a plurality of test racks 100 (e.g., 10 test racks shown), a loading station 200, and a robot 300. Each test rack 100 holds a plurality of test slot assemblies 120. As shown in FIG. 2, each test slot assembly 120 includes a storage device transporter 400 and a test slot 500. The storage device transporter 400 is used for capturing storage devices 600 (FIG. 5) (e.g., from the loading station) and for transporting the storage devices 600 to one of the test slots 500 for testing.

A storage device, as used herein, includes disk drives, solid state drives, memory devices, and any device that requires asynchronous testing for validation. A disk drive is generally a non-volatile storage device which stores digitally encoded data on rapidly rotating platters with magnetic surfaces. A solid-state drive (SSD) is a data storage device that uses solid-state memory to store persistent data. An SSD using SRAM or DRAM (instead of flash memory) is often called a RAM-drive. The term solid-state generally distinguishes solid-state electronics from electromechanical devices.

Figure 3A:
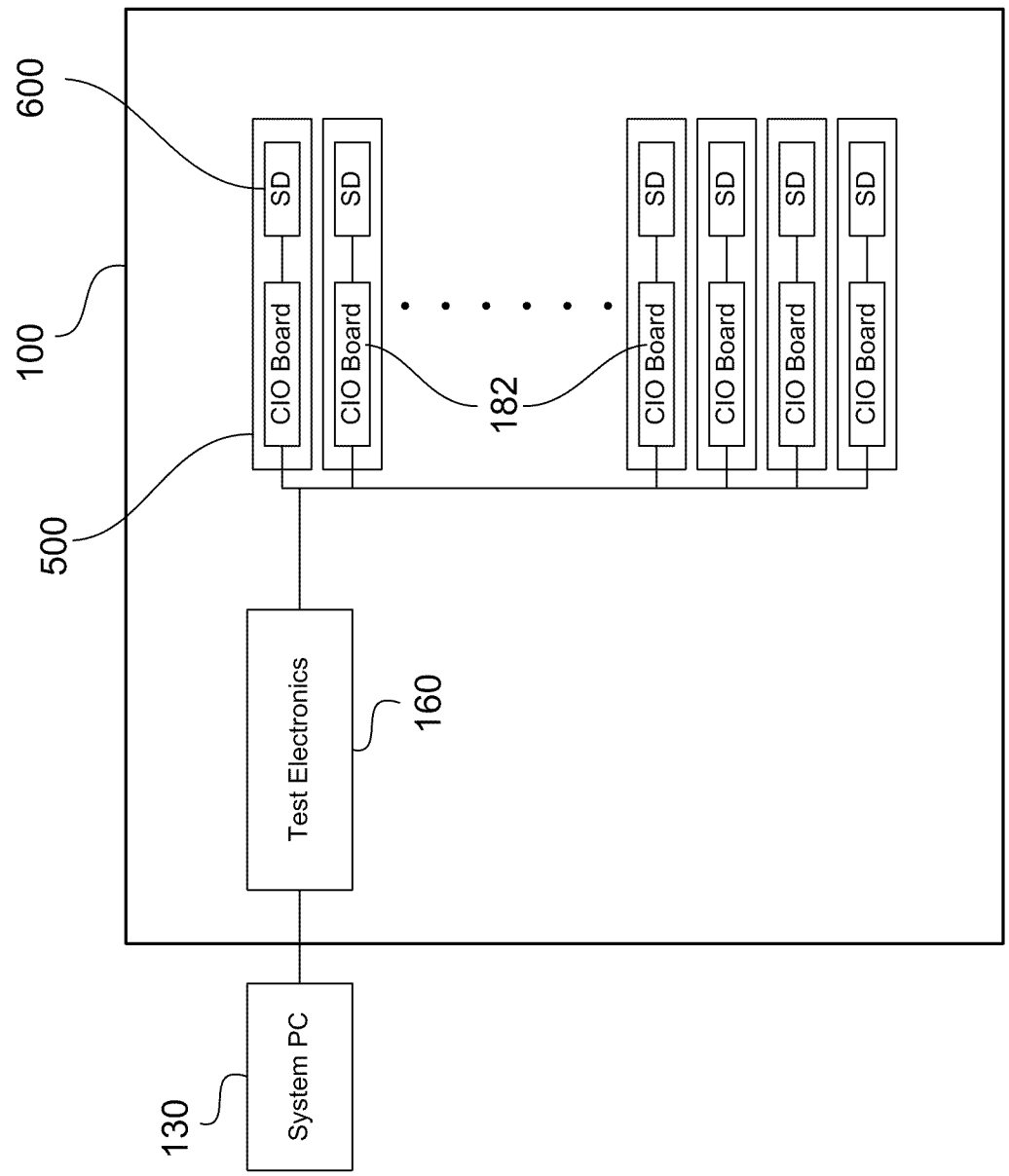
FIGS. 3A and 3B are schematic views of self-test and functional test circuitry.

Referring to FIG. 3A, in some implementations, the storage device testing system 10 also includes at least one computer 130 in communication with the test slots 500. The computer 130 may be configured to provide inventory control of the storage devices 600 and/or an automation interface to control the storage device testing system 10. Within each of the test racks 100, test electronics 160 are in communication with each test slot 500. The test electronics 160 are configured to communicate with a disk dive 600 received within the test slot 500. The test electronics 160 execute test algorithms and monitor the status (e.g., temperature) of storage devices under test.

Figure 3B:
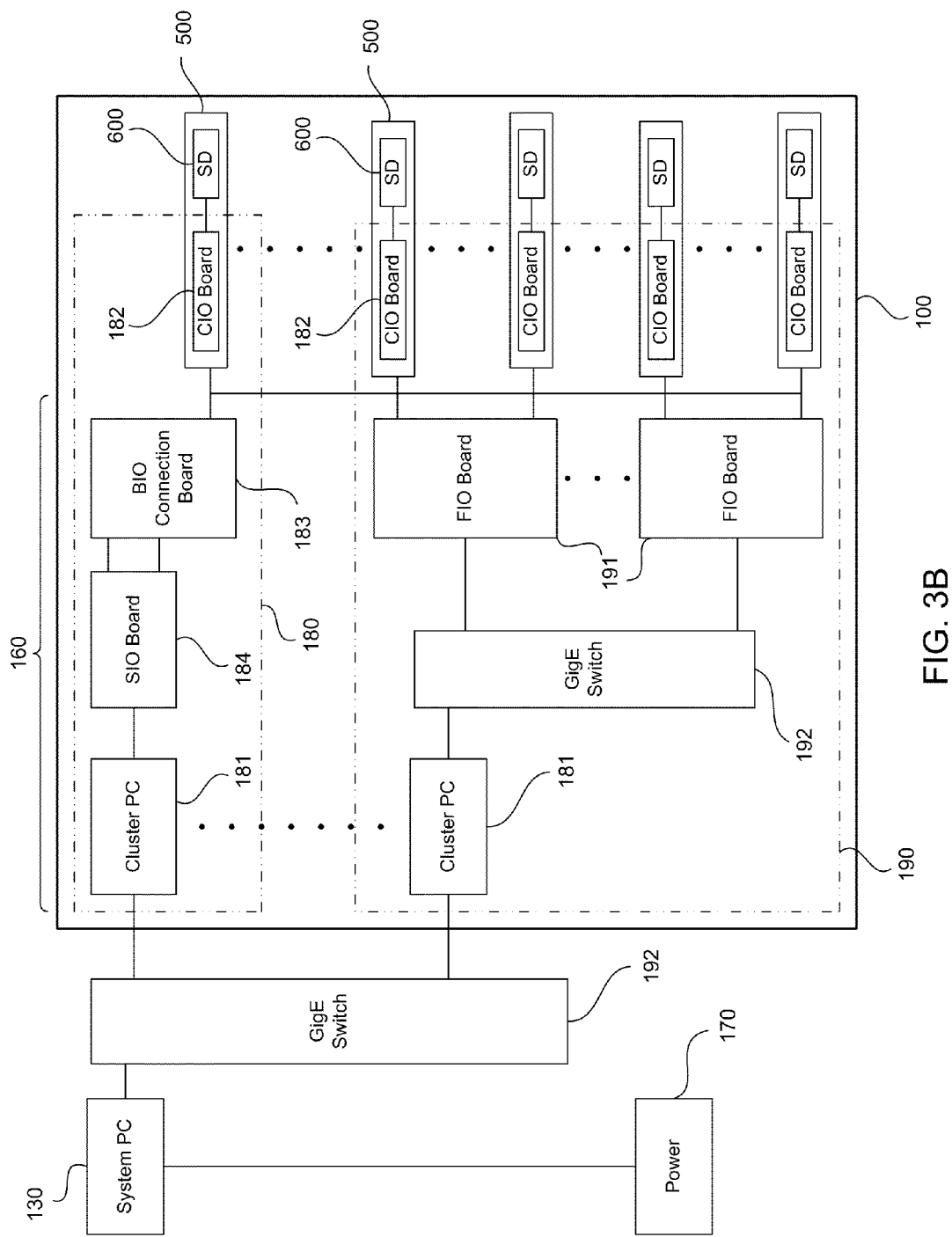

Referring to FIG. 3B, a power system 170 supplies power to the storage device testing system 10. The power system 170 may monitor and/or regulate power to the received storage device 600 in the test slot 500. In the example illustrated in FIG. 3B, the test electronics 160 within each test rack 100 include at least one self-testing system 180 in communication with at least one test slot 500. The self-testing system 180 tests whether the test rack 100 and/or specific sub-systems, such as the test slot 500, are functioning properly. The self-testing system 180 includes a cluster controller 181, one or more connection interface circuits 182 each in electrical communication with a storage device (SD) 600 received within the test slot 500, and one or more block interface circuits 183 in electrical communication with the connection interface circuit 182. The cluster controller 181, in some examples, is configured to run one or more testing programs with a capacity of approximately 120 self-tests and/or 60 functionality test of storage devices 600. The connection interface circuits 182 and the block interface circuit(s) 183 are configured to self-test. However, the self-testing system 180 may include a self-test circuit 184 configured to execute and control a self-testing routine on one or more components of the storage device testing system 10. The cluster controller 181 may communicate with the self-test circuit 184 via Ethernet (e.g. Gigabit Ethernet), which may communicate with the block interface circuit(s) 183 and onto the connection interface circuit(s) 182 and storage device(s) 600 via universal asynchronous receiver/transmitter (UART) serial links. A UART is usually an individual (or part of an) integrated circuit used for serial communications over a computer or peripheral device serial port. The block interface circuit(s) 183 is/are configured to control power to and temperature of the test slots 500, and each block interface circuit 183 may control one or more test slots 500 and/or storage devices 600.

In some examples, the test electronics 160 can also include at least one functional testing system 190 in communication with at least one test slot 500. The functional testing system 190 tests whether a received storage device 600, held and/or supported in the test slot 500 by the storage device transporter 400, is functioning properly. A functionality test may include testing the amount of power received by the storage device 600, the operating temperature, the ability to read and write data, and the ability to read and write data at different temperatures (e.g. read while hot and write while cold, or vice versa). The functionality test may test every memory sector of the storage device 600 or only random samplings. The functionality test may test an operating temperature of the storage device 600 and also the data integrity of communications with the storage device 600. The functional testing system 190 includes a cluster controller 181 and at least one functional interface circuit 191 in electrical communication with the cluster controller 181. A connection interface circuit 182 is in electrical communication with a storage device 600 received within the test slot 500 and the functional interface circuit 191. The functional interface circuit 191 is configured to communicate a functional test routine to the storage device 600. The functional testing system 190 may include a communication switch 192 (e.g. Gigabit Ethernet) to provide electrical communication between the cluster controller 181 and the one or more functional interface circuits 191. Preferably, the computer 130, communication switch 192, cluster controller 181, and functional interface circuit 191 communicate on an Ethernet network. However, other forms of communication may be used. The functional interface circuit 191 may communicate to the connection interface circuit 182 via Parallel AT Attachment (a hard disk interface also known as IDE, ATA, ATAPI, UDMA and PATA), SATA, or SAS (Serial Attached SCSI).

Figure 4:
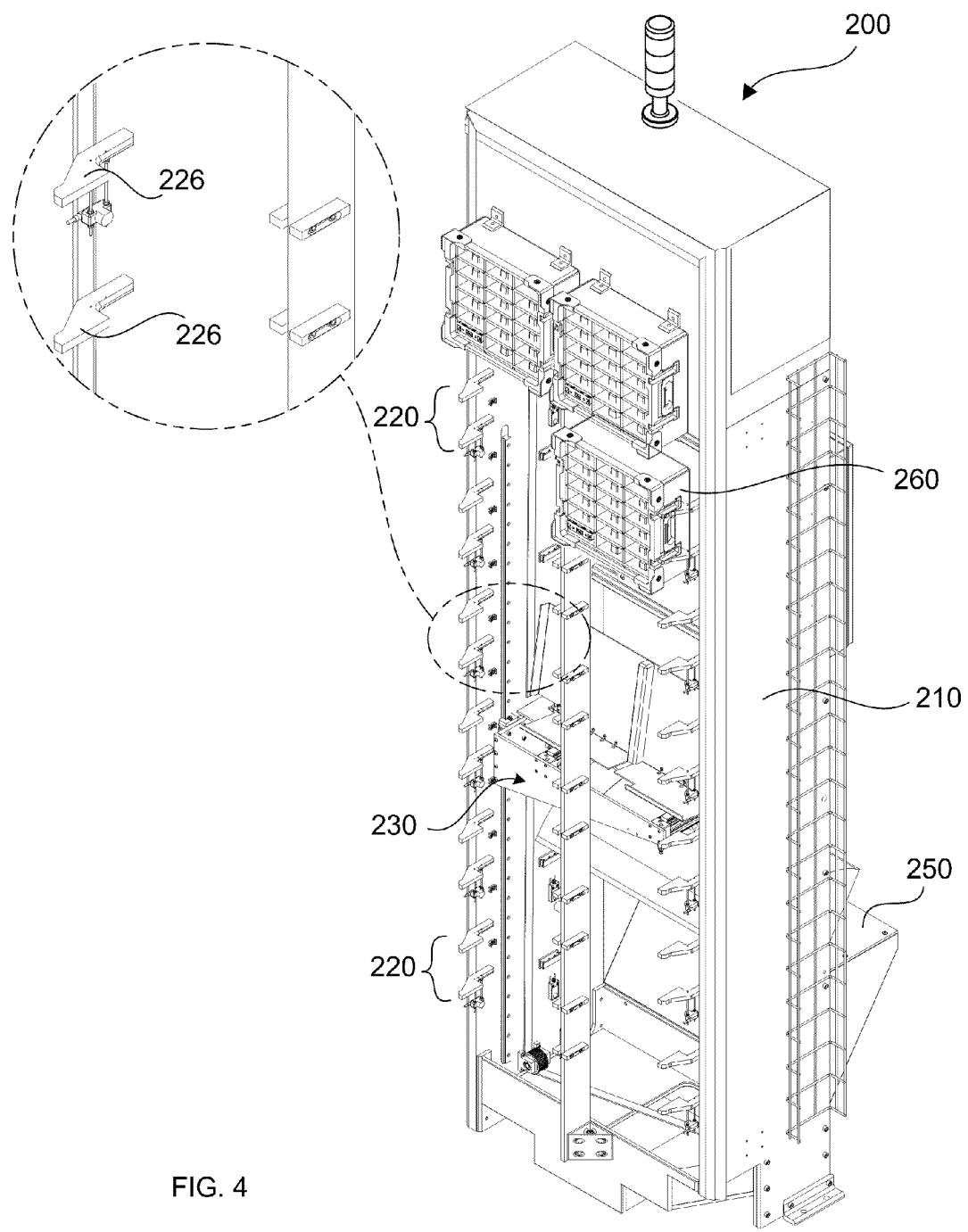
FIG. 4 is a perspective view of a transfer station.

Referring to FIG. 4, in some implementations, the transfer station 200 includes a transfer station housing 210 and multiple tote presentation support systems 220 disposed on the transfer station housing 210. Each tote presentation support system 220 is configured to receive and support a storage device tote 260 in a presentation position for servicing by the storage device testing system 10.

The tote presentation support systems 220 are each disposed on the same side of the transfer station housing 210 and arranged vertically with respect to each other. Each tote presentation support system 220 has a different elevation with respect to the others. In some examples, as shown in FIG. 4, the tote presentation support system 220 includes tote support arms 226 configured to be received by respective arm grooves 266 (FIG. 5) defined by the storage device tote 260.

A tote mover 230 is disposed on the transfer station housing 210 and is configured to move relative thereto. The tote mover 230 is configured to transfer the totes 260 between the tote presentation support systems 220 for servicing by the storage device testing system 10 (e.g. by the robot 300 (FIG. 1)) and a staging area 250 where the totes 260 can be loaded into and unloaded from the transfer station 200 (e.g., by an operator).

Figure 5:
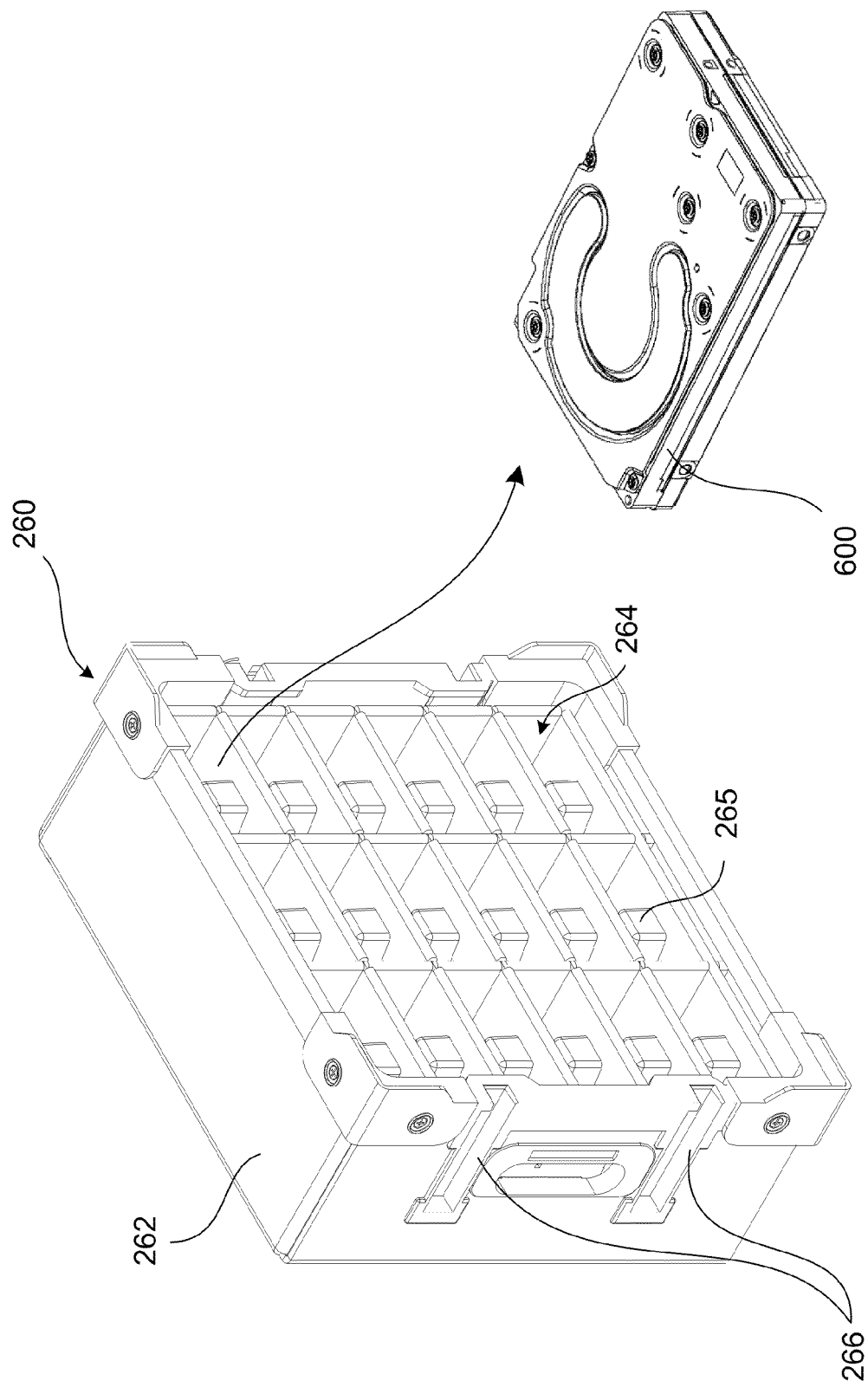
FIG. 5 is a perspective view of a tote and storage device.

As illustrated in FIG. 5, the totes 260 include a tote body 262 which defines multiple storage device receptacles 264 (e.g., 18 shown) that are each configured to house a storage device 600. Each of the storage device receptacles 264 includes a storage device support 265 configured to support a central portion of a received storage device 600 to allow manipulation of the storage device 600 along non-central portions (e.g., along side, front and/or back edges of the storage device). The tote body 262 also defines arm grooves 266 that are configured to engage the tote support arms 226 (FIG. 4) of the transfer station housing 210 thereby to support the tote 260 (e.g., for servicing by the robot 300 (FIG. 1)).

Figure 6A:
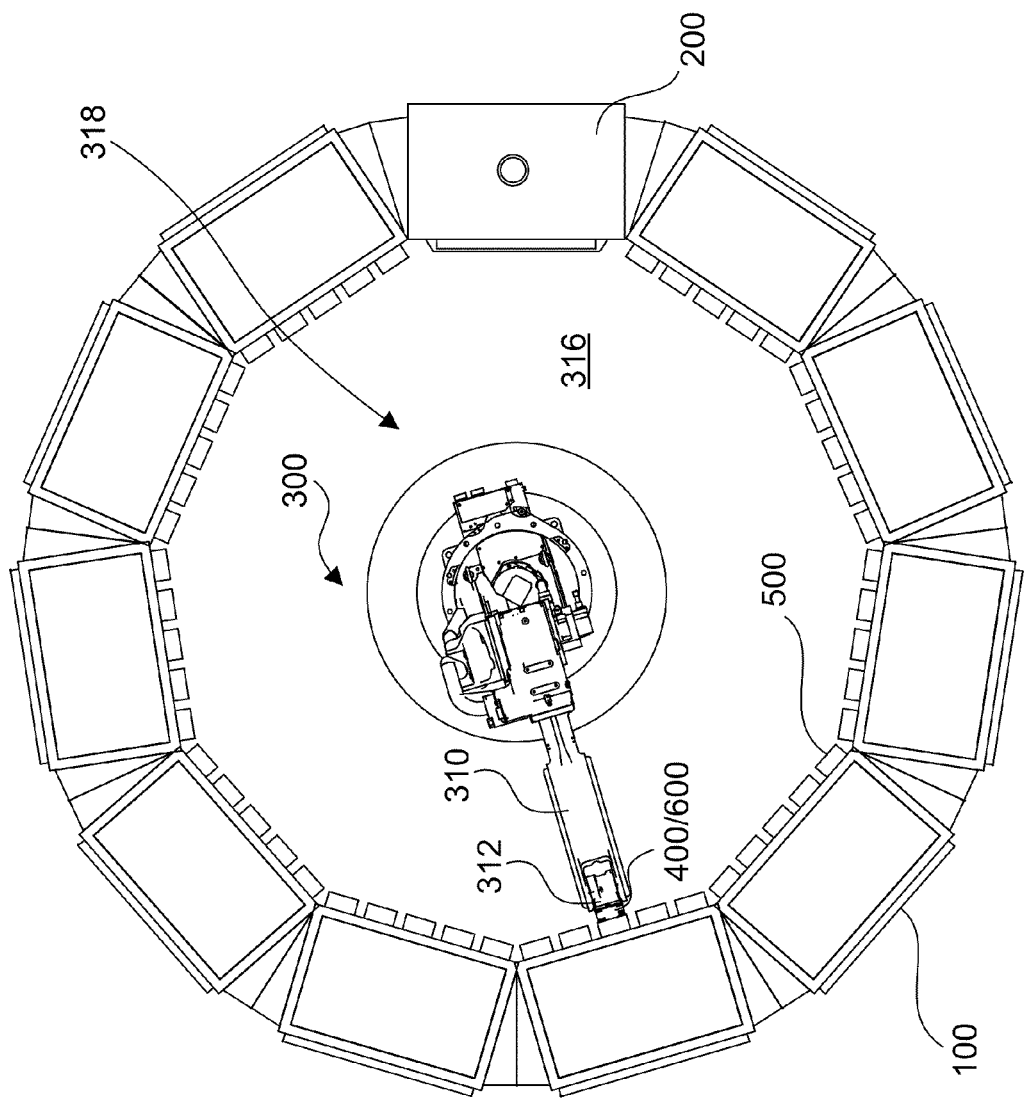
FIG. 6A is a top view of a storage device testing system.
Figure 6B:
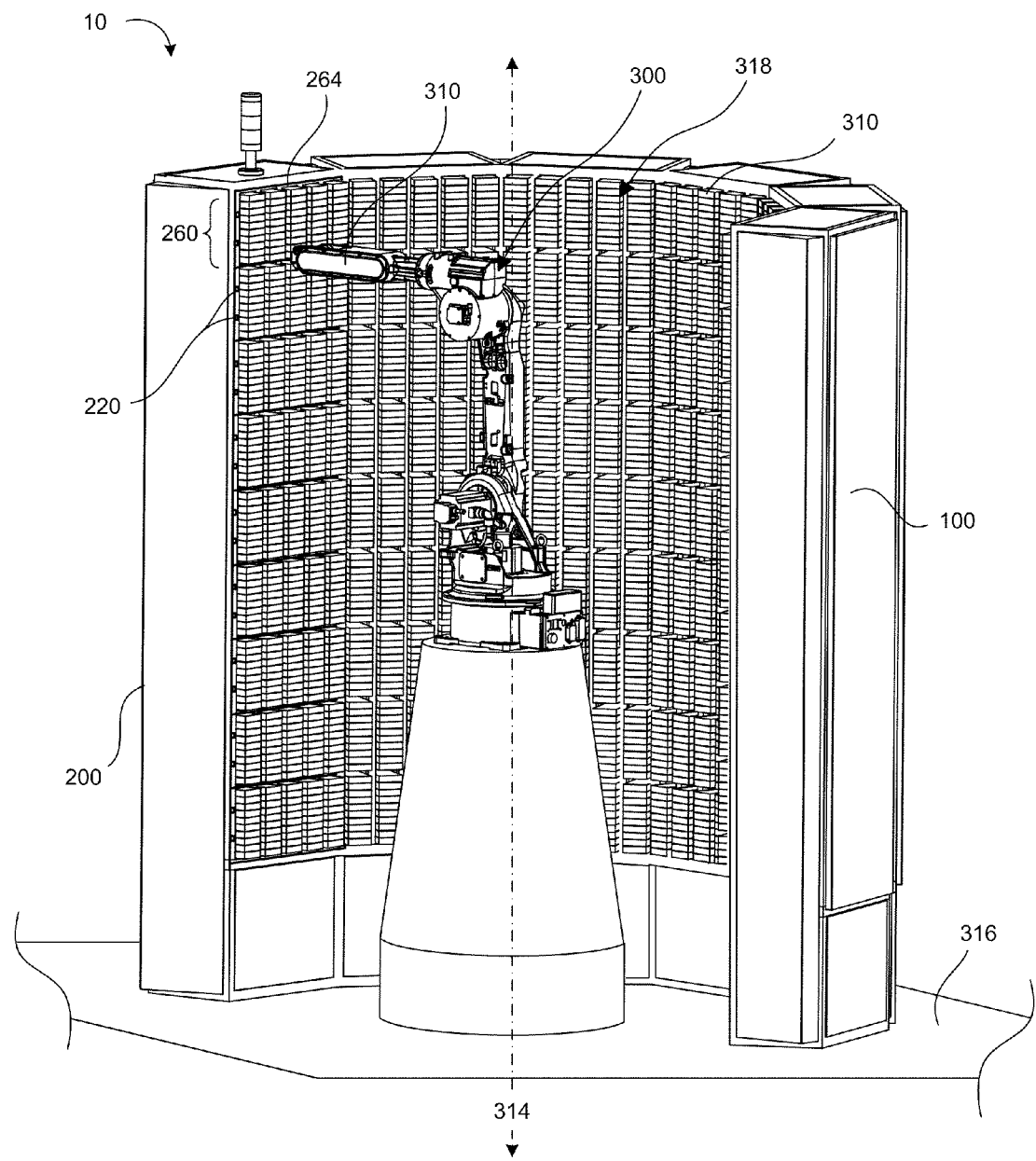
FIG. 6B is a perspective view of a storage device testing system.

Referring to FIGS. 6A and 6B, the robot 300 includes a robotic arm 310 and a manipulator 312 (FIG. 6A) disposed at a distal end of the robotic arm 310. The robotic arm 310 defines a first axis 314 (FIG. 6B) normal to a floor surface 316 and is operable to rotate through a predetermined arc about and extends radially from the first axis 314 within a robot operating area 318. The robotic arm 310 is configured to independently service each test slot 500 by transferring storage devices 600 between the totes 260 at the transfer station 200 and the test racks 100. In particular, the robotic arm 310 is configured to remove a storage device transporter 400 from one of the test slots 500 with the manipulator 312, then pick up a storage device 600 from one the storage device receptacles 264 at the transfer station 200 with the storage device transporter 400, and then return the storage device transporter 400, with a storage device 600 therein, to the test slot 500 for testing of the storage device 600. After testing, the robotic arm 310 retrieves the storage device transporter 400, along with the supported storage device 600, from one of the test slots 500 and returns it to one of the storage device receptacles 264 at the transfer station 200 (or moves it to another one of the test slots 500) by manipulation of the storage device transporter 400 (i.e., with the manipulator 312).

Storage Device Transporter

Figure 7:
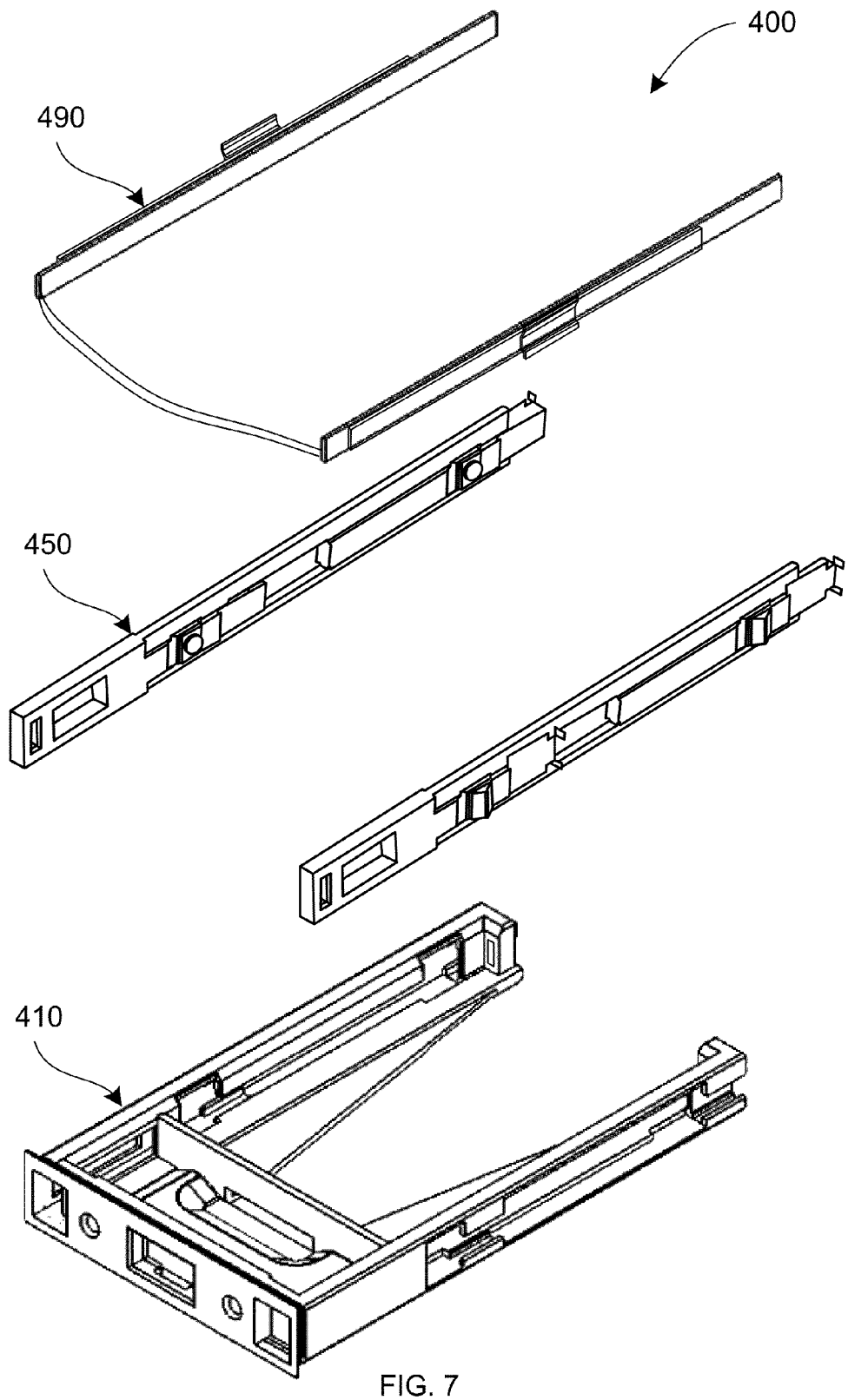
FIG. 7 is an exploded perspective view of a storage device transporter.

As shown in FIG. 7, the storage device transporter 400 includes a frame 410, a clamping mechanism 450, and a temperature sensing assembly 490. The temperature sensing assembly allows the temperature of the storage device supported by the frame to be measured (e.g., directly measured via contact with the storage device).

Figure 8:
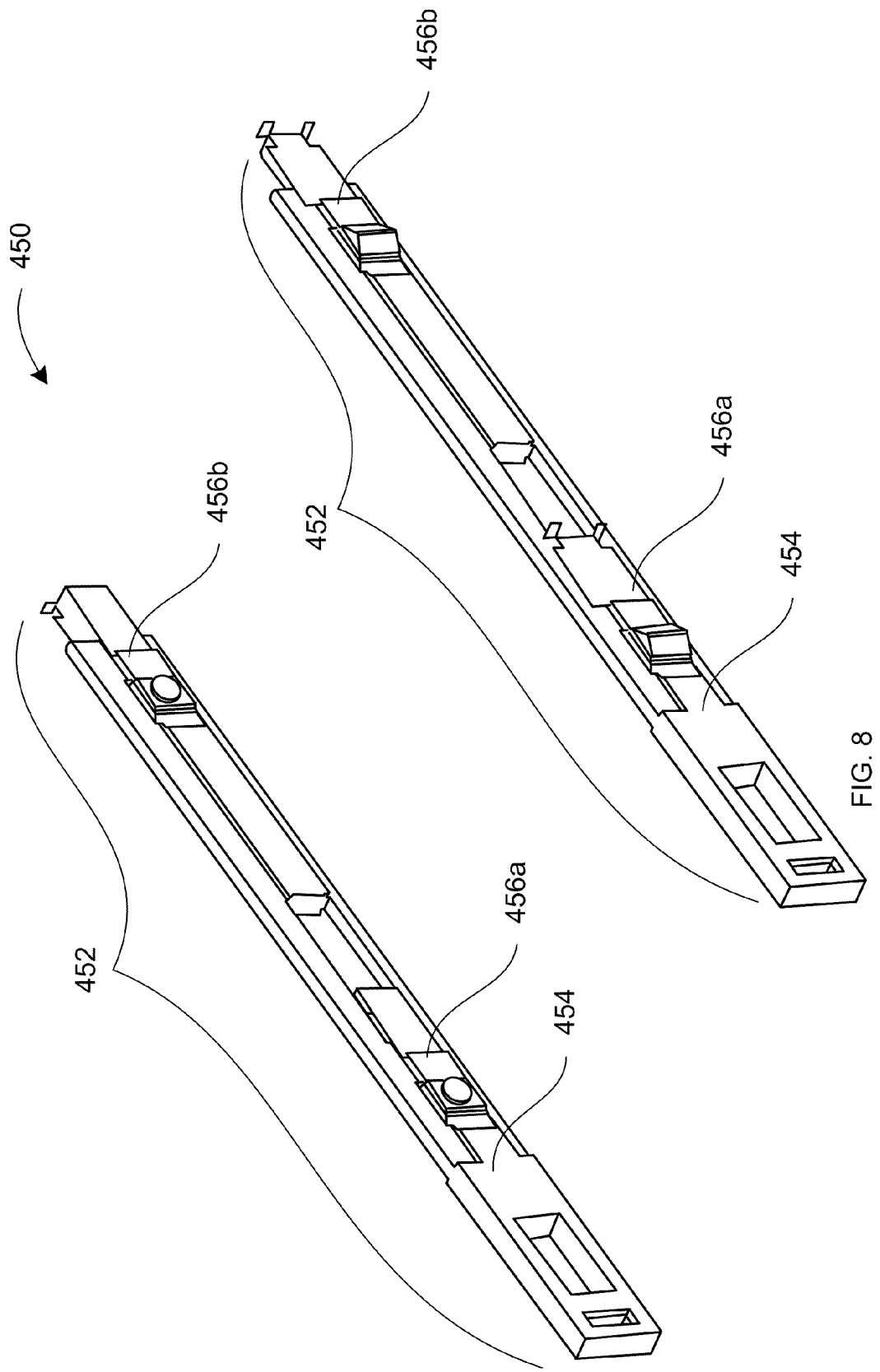
FIG. 8 is a perspective view of a clamping mechanism.
Figure 9A:
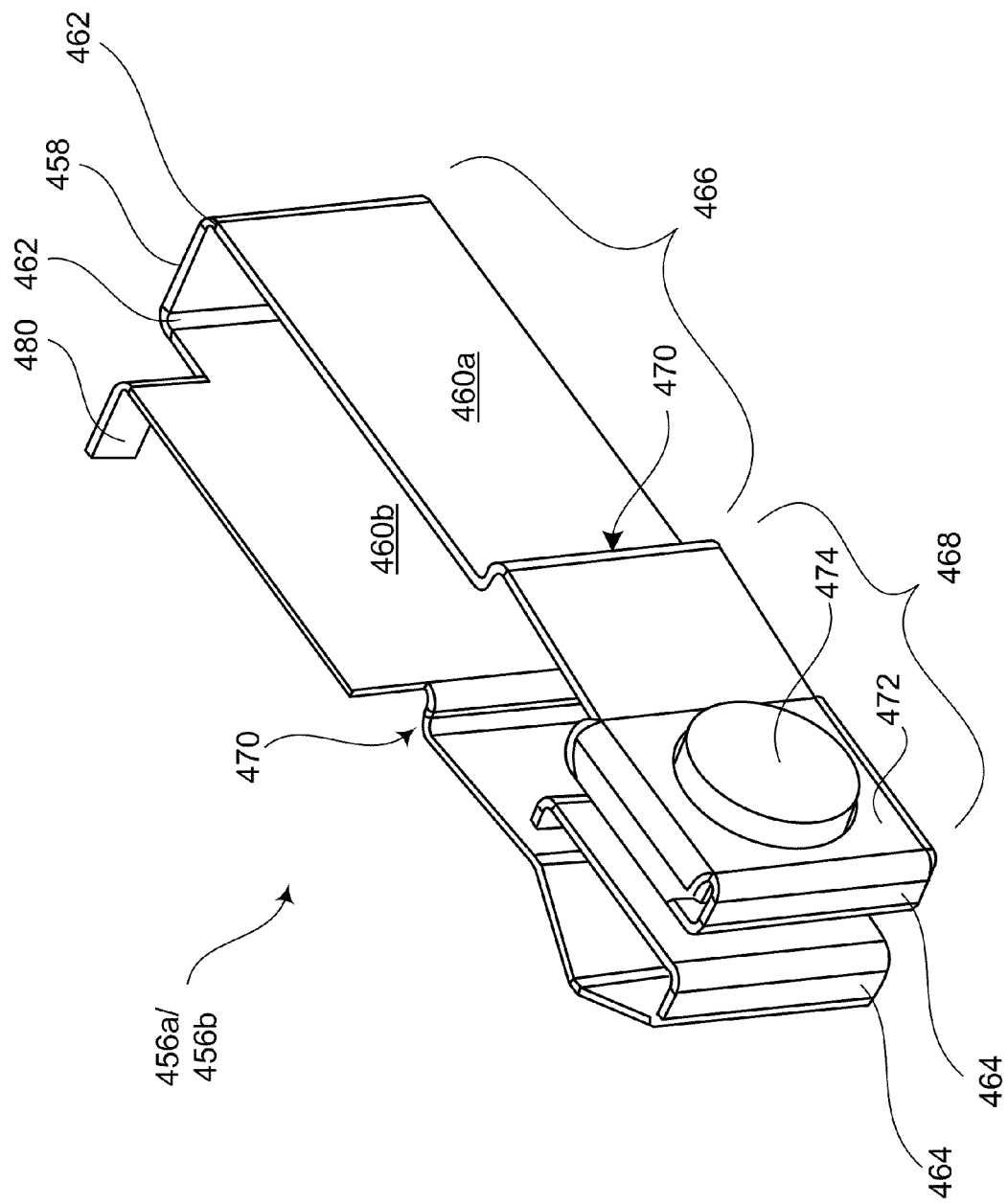
FIGS. 9A and 9B are perspective views of a spring clamp.
Figure 9B:
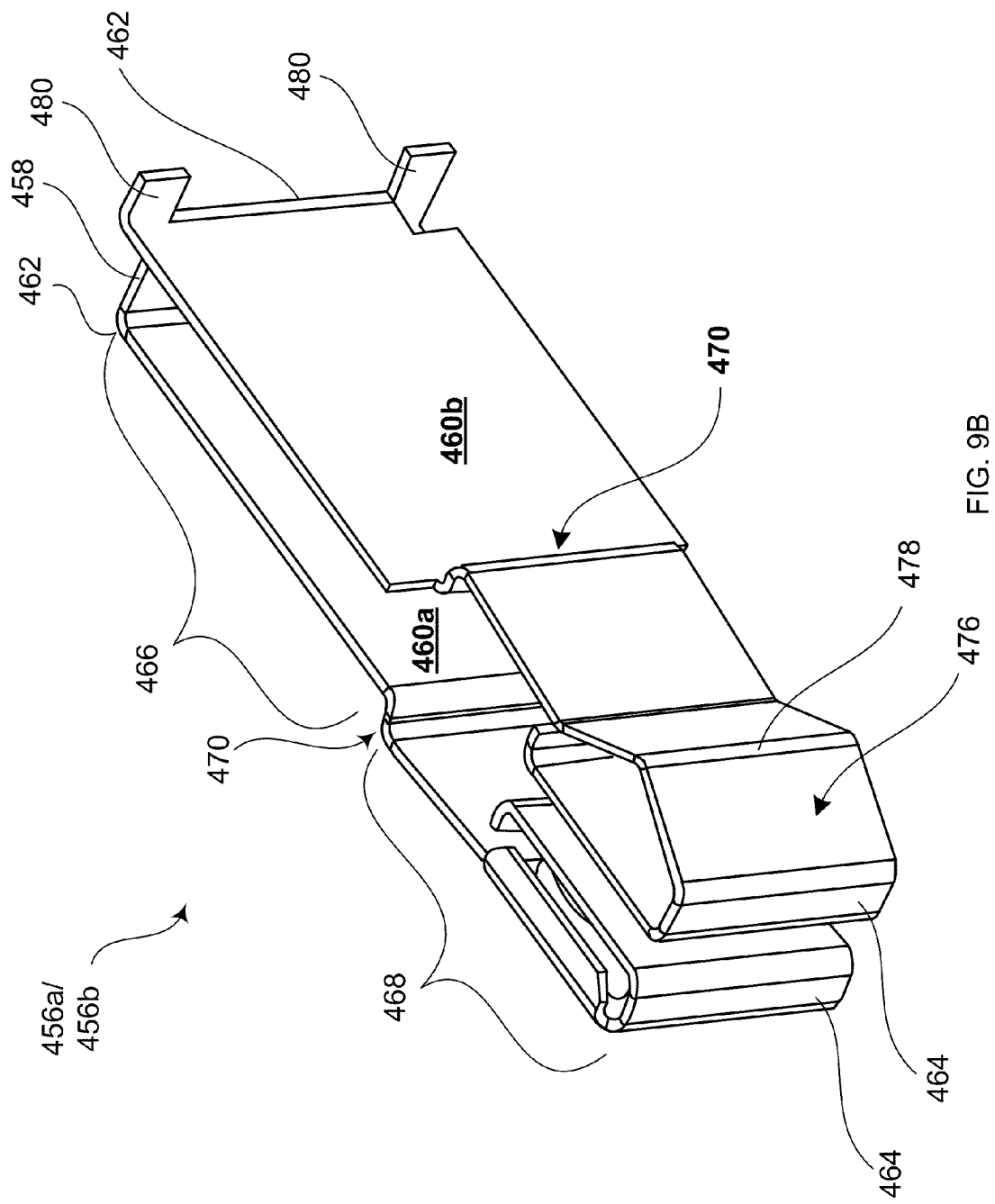

As shown in FIG. 8, the clamping mechanism 450 includes a pair of clamping assemblies 452 each including an actuator 454 and a pair of spring clamps (i.e., proximal and distal spring clamps 456a, 456b). Referring to FIGS. 9A and 9B, the spring clamps 456a, 456b include a base portion 458 and first and second spring arms 460a, 460b each having a proximal end 462 connected to the base portion 458 and a displaceable distal end 464. The spring clamps 456a, 456b can be formed from sheet metal, e.g., stainless steel. Between their proximal and distal ends 462, 464 the spring arms 460a, 460b define a narrow region 466, a broad region 468 and a pair of edges 470 therebetween. As illustrated in FIG. 9A, the first spring arm 460a includes a first engagement member 472 having a damper 474. The damper 474 can be formed from, e.g., thermoplastics, thermosets, etc. As shown in FIG. 9B, the second spring arm 460b includes a second engagement member 476 which defines a protuberance 478. Each of the spring clamps 456a, 456b also includes a pair of mounting tabs 480 that extends outwardly from the base portion 458. Following assembly with the frame 410, the edges 470 and mounting tabs 480 help to keep the spring clamps 456a, 456b in position within sidewalls 418 (FIGS. 11A and 11B) of the frame 410. As discussed in greater detail below, following assembly, the spring clamps 456a, 456b are mounted to the frame 410 and are operatively associated with the actuators 454 (e.g., for clamping a storage device 600 within the frame and/or for clamping the frame within one of the test slots 500).

Figure 10:
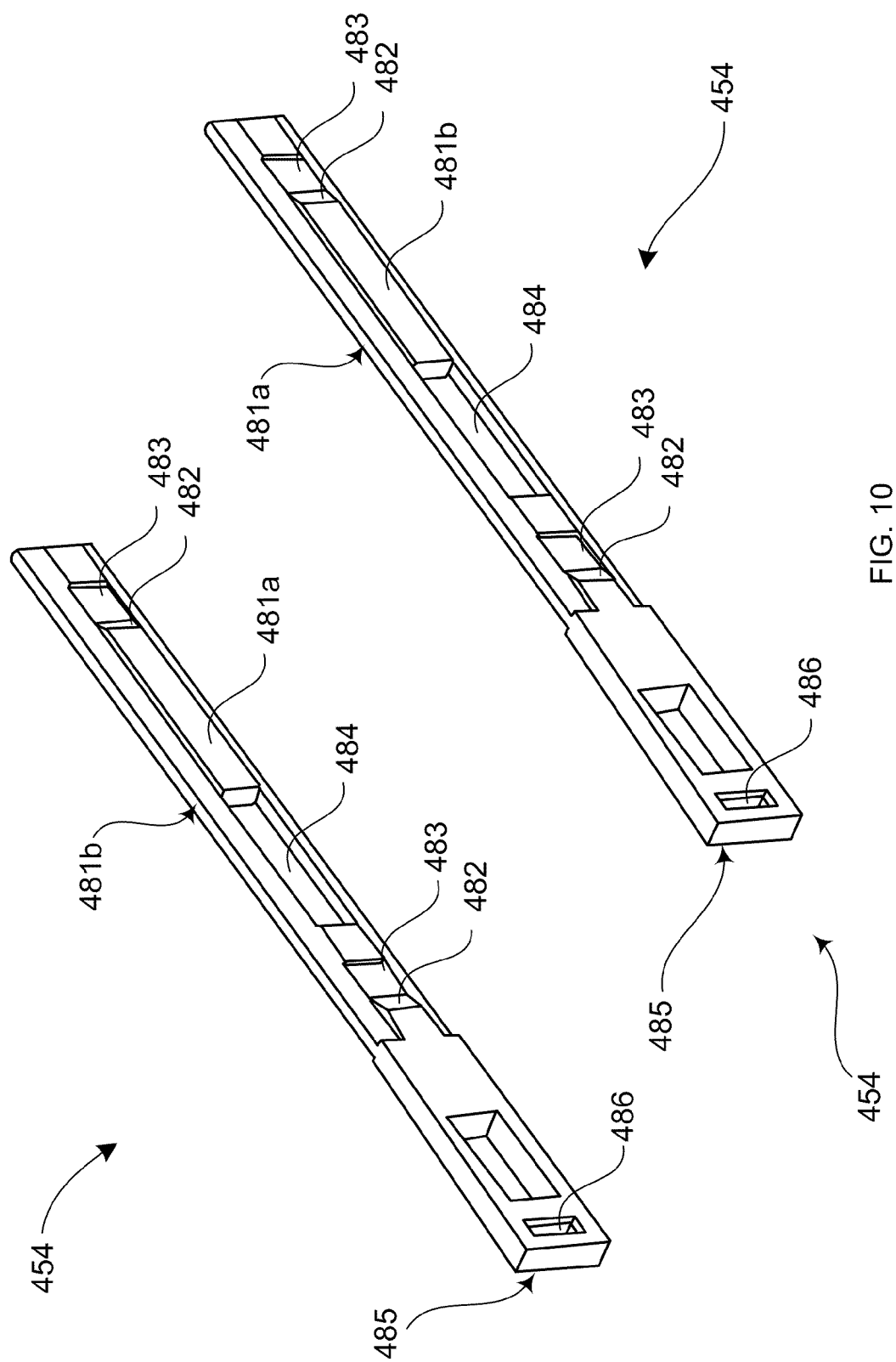
FIG. 10 is a perspective view of a pair of actuators.

Referring to FIG. 10, each of the actuators 454 includes inner and outer surfaces 481a, 481b which define actuating features. The actuating features include wedges 482 and recesses 483. The actuators 454 also define openings 484 which extend between the inner and outer surfaces 481a, 481b. At their proximal ends 485, the actuators 454 include actuator sockets 486 which are configured to be engageable with the manipulator 312 (FIG. 6A) for controlling movement of the actuators 454 relative to the frame 410.

Figure 11A:
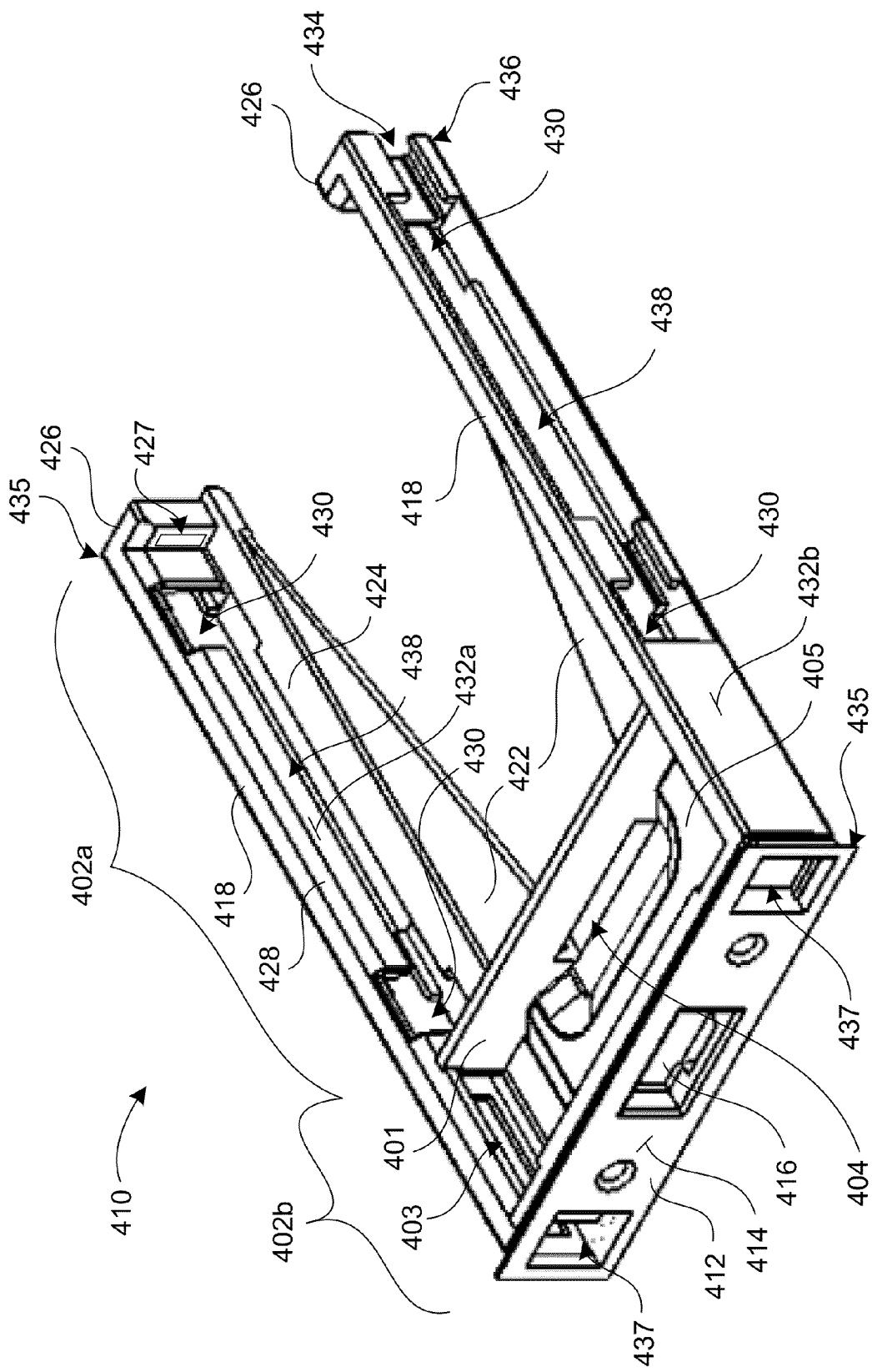
FIGS. 11A and 11B are perspective views of a storage device transporter frame.
Figure 11B:
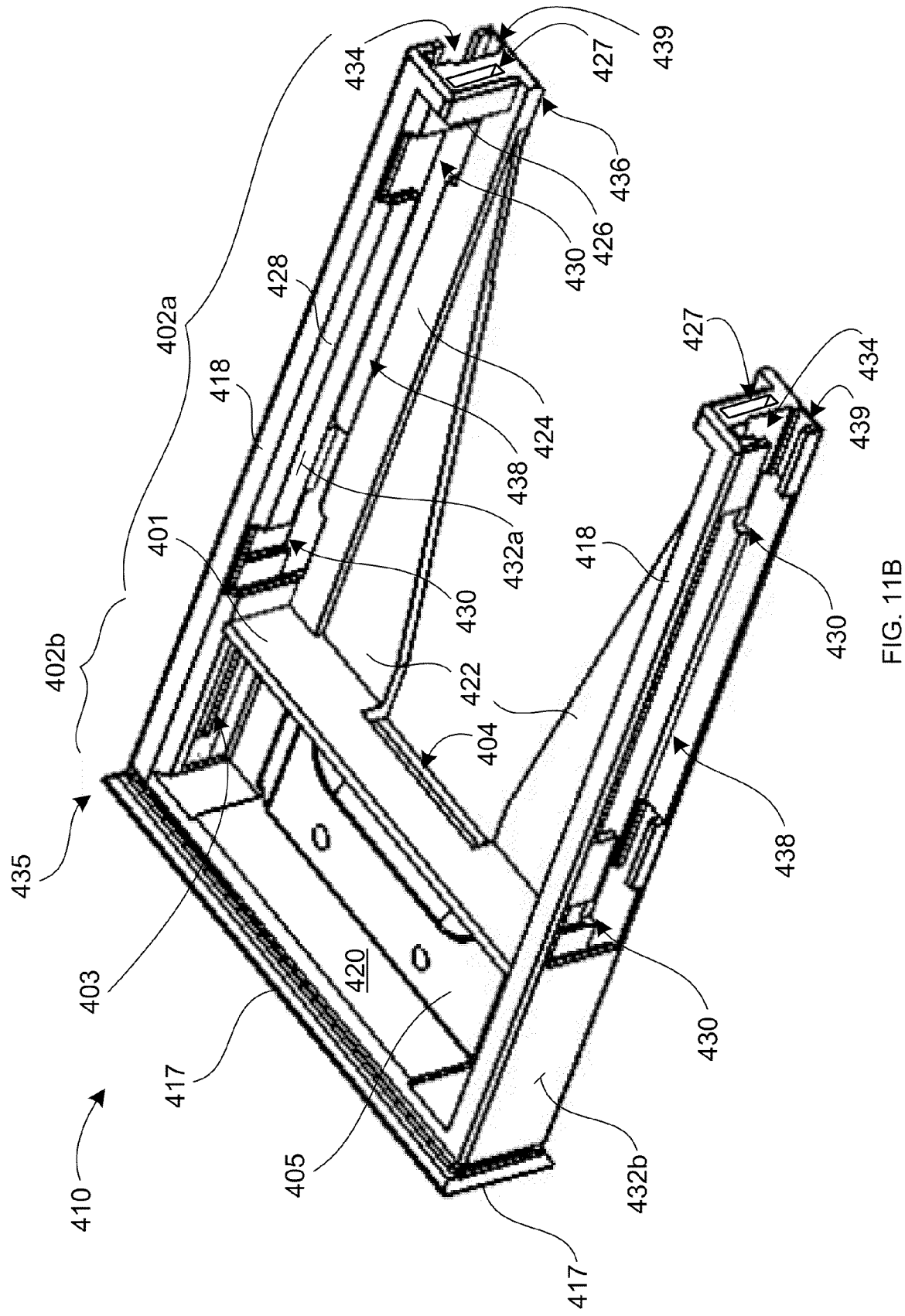

As illustrated in FIGS. 11A and 11B, the frame 410 includes a face plate 412. Along a first surface 414, the face plate 412 defines an indentation 416. The indentation 416 can be releaseably engaged by the manipulator 312 (FIG. 6A) of the robotic arm 310, which allows the robotic arm 310 to grab and move the storage device transporter 400. The face plate 412 also includes beveled edges 417 (FIG. 11B). When the storage device transporter 400 is inserted into one of the test slots 500, the beveled edges 417 of the face plate 412 abut complimentary beveled edges 515 (FIG. 19) of the test slot 500 to form a seal, which, as described below, helps to inhibit the flow of air into and out of the test slot 500.

The frame 410 also includes a pair of sidewalls 418, which extend outwardly from a second surface 420 of the face plate 412, and a base plate 422 that extends between and connects the sidewalls 418. The sidewalls 418 and the base plate 422 together define a substantially U-shaped opening, which allows the storage device transporter 400 to be used to capture a storage device 600 off of the storage device supports 226 in the totes 220.

The frame 410 also includes a plenum wall 401 that is disposed between a storage device region 402a and a plenum region 402b. An air flow (e.g., for cooling a storage device supported in the transporter 400) can be directed into the plenum region 402b via an inlet aperture 403 in one of the sidewalls 418. The air flow can then be delivered towards the storage device region 402a through an air flow aperture 404 in the plenum wall 401. The frame 410 can be formed of molded plastic.

A weight 405 (e.g., a copper block) is disposed within the plenum region 402b and is mounted to the base plate 422. The weight 405 can help to inhibit the transmission of vibration between a supported storage device and the test slot 500 during testing.

The sidewalls 418 are spaced to receive a storage device 600 (FIG. 5) therebetween, and define surfaces 424 for supporting the storage device 600. The sidewalls 418 also define back hooks 426, which can be useful for extracting the storage device 600 from a test slot 500 (e.g., for separating a connector on the storage device from a mating connector in the test slot 500). The back hooks 426 include openings 427, which can help to accommodate the temperature sensing assembly 490. The sidewalls 418 also define lead-ins 428 (e.g., chamfered edges), which can aid in centering a storage device 600 in the frame 410.

The sidewalls 418 each define a pair of pass-through apertures 430, which extend between inner and outer surfaces 432a, 432b of the sidewalls 418. Following assembly, a corresponding one of the spring clamps 456a, 456b is associated with each of the pass-through apertures 430. The sidewalls 418 also define actuator slots 434 which extend from a proximal end 435 to a distal end 436 of each sidewall 418. The face plate 412 defines a pair of apertures 437 (FIG. 11A) which extend between the first and second surfaces 414, 420 thereof, and which allow access to the actuator slots 434. When assembled, the actuators 454 (FIG. 8) are slidably disposed within the actuator slots 434 and are arranged to actuate movements of the spring arms 456a, 456b.

Referring still to FIGS. 11A and 11B, the sidewalls 418 also define through-holes 438. The through-holes 438 extend between the inner and outer surfaces 432a, 432b of the sidewalls 418 and allow for access to the actuator slots 434 in the region between the pass-through apertures 430. The temperature sensing assembly can be mounted to the frame 410 via these through holes 438.

Figure 12:
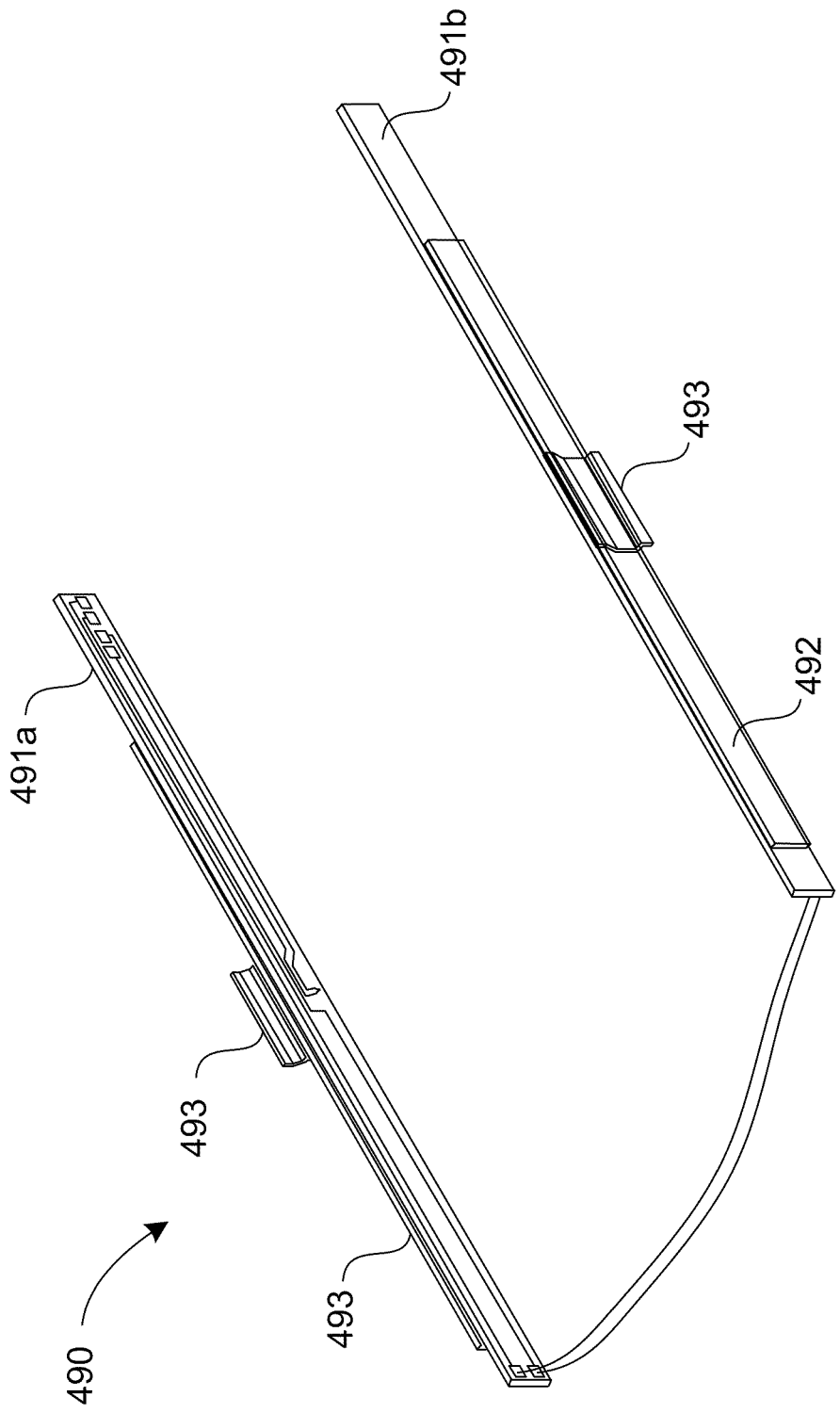
FIG. 12 is a perspective view of a temperature sensing assembly.
Figure 13:
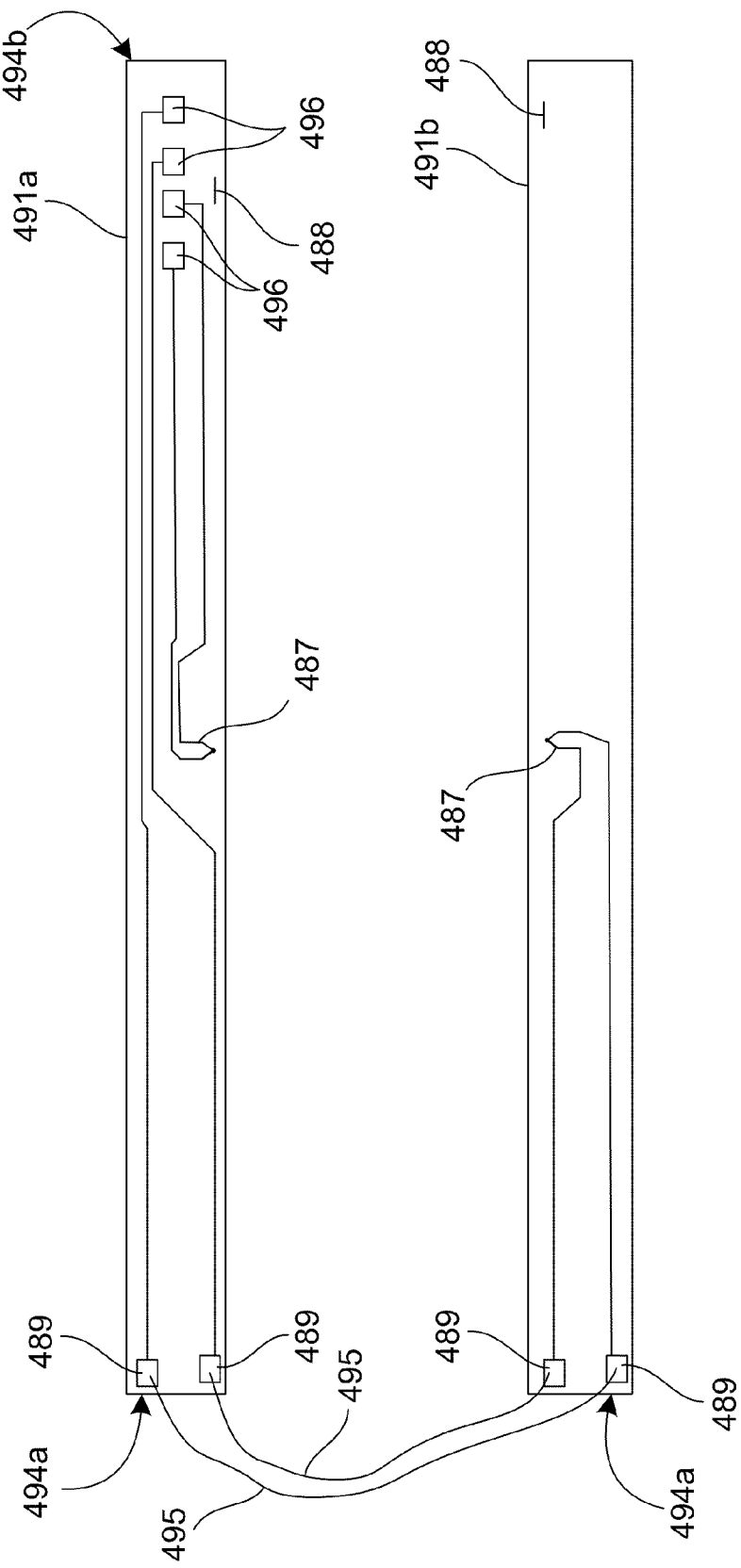
FIG. 13 is a plan view of a pair of printed wiring boards from the temperature sensing assembly of FIG. 12.

As shown in FIG. 12 the temperature sensing assembly 490 includes a pair of printed wiring boards (i.e., first and second printed wiring boards 491a, 491b), a pair of pressure plates 492, and a pair of resilient biasing mechanisms (shown in the form of spring plates 493) which operate to bias the printed wiring boards 491a, 491b toward the sidewalls 418 of the frame 410 following assembly. Referring to FIG. 13, each of the printed wiring boards 491a, 491b includes a thermocouple 487 integrated in an electrically conductive layer at respective first surfaces 488 of the printed wiring boards 491a, 491b. The printed wiring boards 491a, 491b include wiring pads 489 at their respective proximal ends 494a. The printed wiring boards 491a, 491b can be electrically connected to each other via wires 495 which are soldered to the printed wiring boards 491a, 491b at the wiring pads 489. The first printed wiring board 491a includes a pair of contact terminals 496 at its distal end 494b. The contact terminals 496 allow for electrical communication with a connection interface board 520 within the test slot 500. Each of the printed wiring boards 491a, 491b is mounted (e.g., via adhesive or mechanical fasteners) to an associated one of the pressure plates 492.

The pressure plates 492 are substantially flat and can be formed of metal or rigid plastic. The pressure plates 492 are each mounted to a corresponding one of the spring plates 493.

Figure 14:
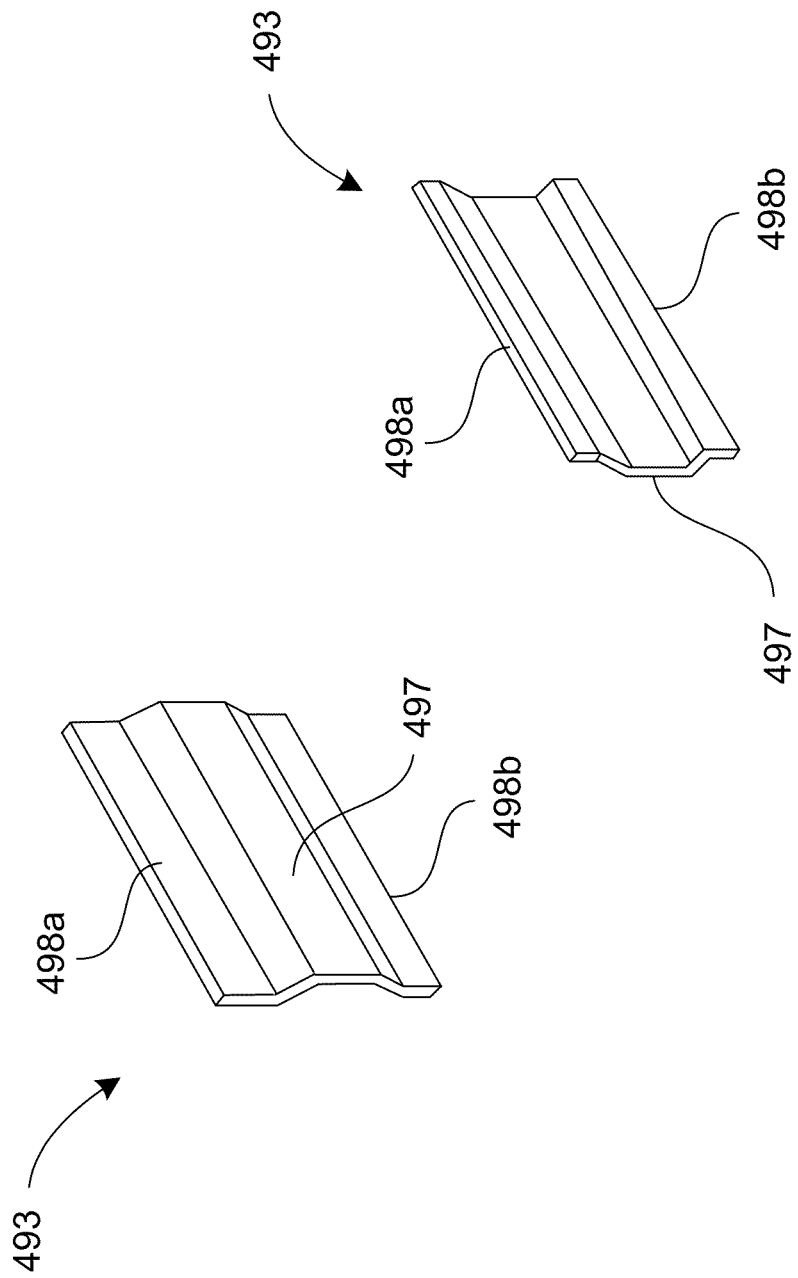
FIG. 14 is a perspective view of a pair of spring plates.

Referring to FIG. 14, the spring plates 493 each include a body member 497 and upper and lower edges 498a, 498b extending outwardly from opposing sides of the body member 497. The body member 497 is attached to one of the pressure plates 492 (e.g., via adhesive or mechanical fasteners). The spring plates 493 can be formed from sheet metal, e.g., stainless steel. When assembled with the frame 410, the upper and lower edges 498a, 498b of the spring plates 493 rest within the actuator slots 434 and the body members 497 extend through the through-holes 438 in the sidewalls 418 towards the U-shaped opening in the frame 410.

Figure 15A:
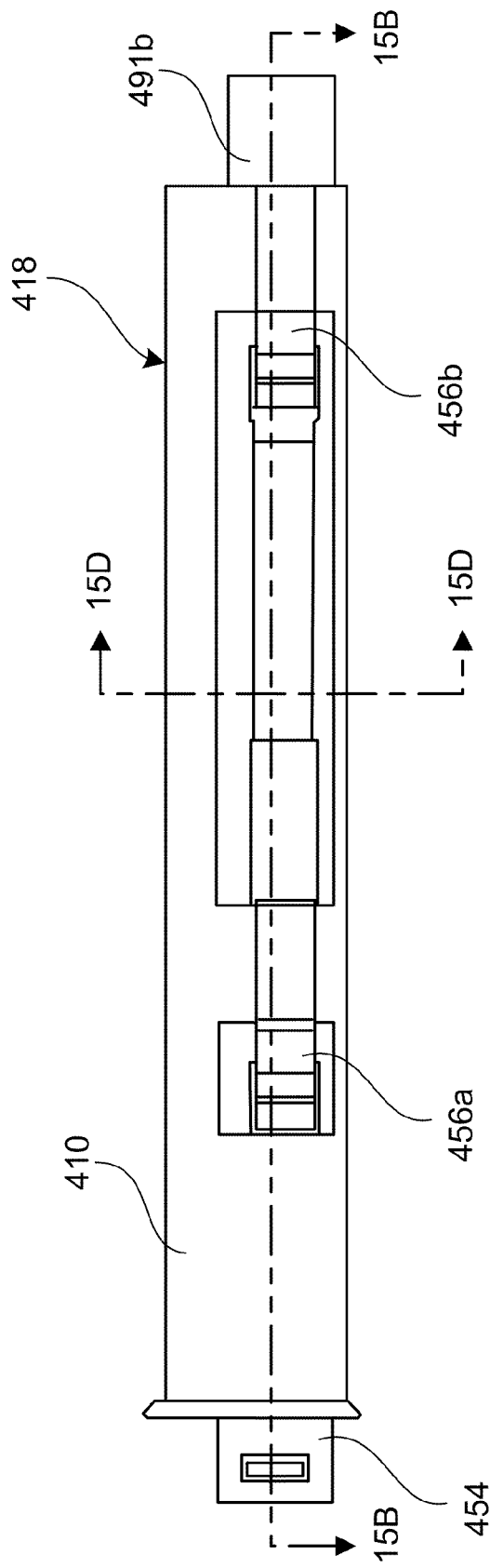
FIG. 15A is side view of a storage device transporter.
Figure 15B:
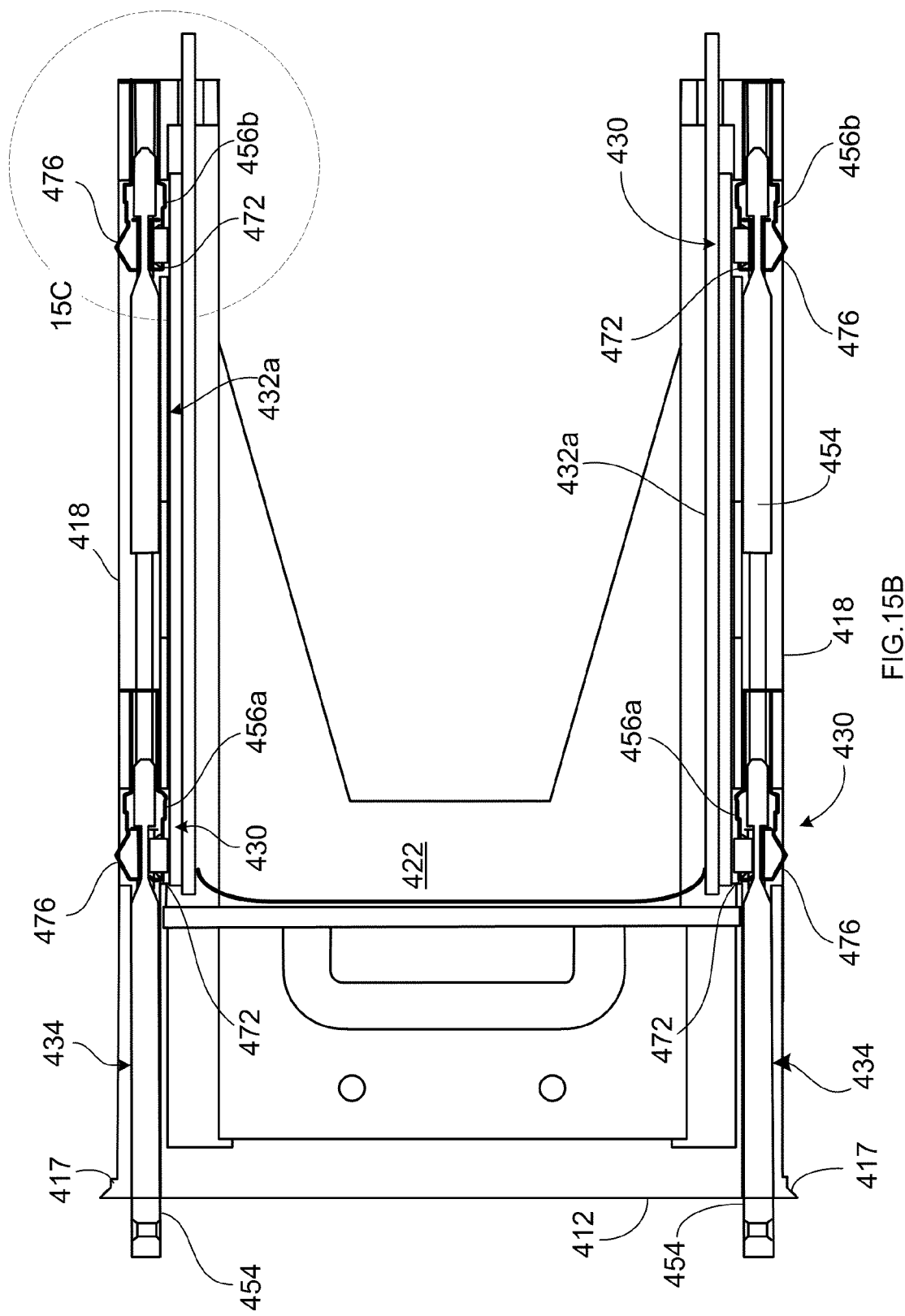
FIG. 15B is a cross-sectional view of the storage device transporter of FIG. 15A taken along line 15B-15B.
Figure 15C:
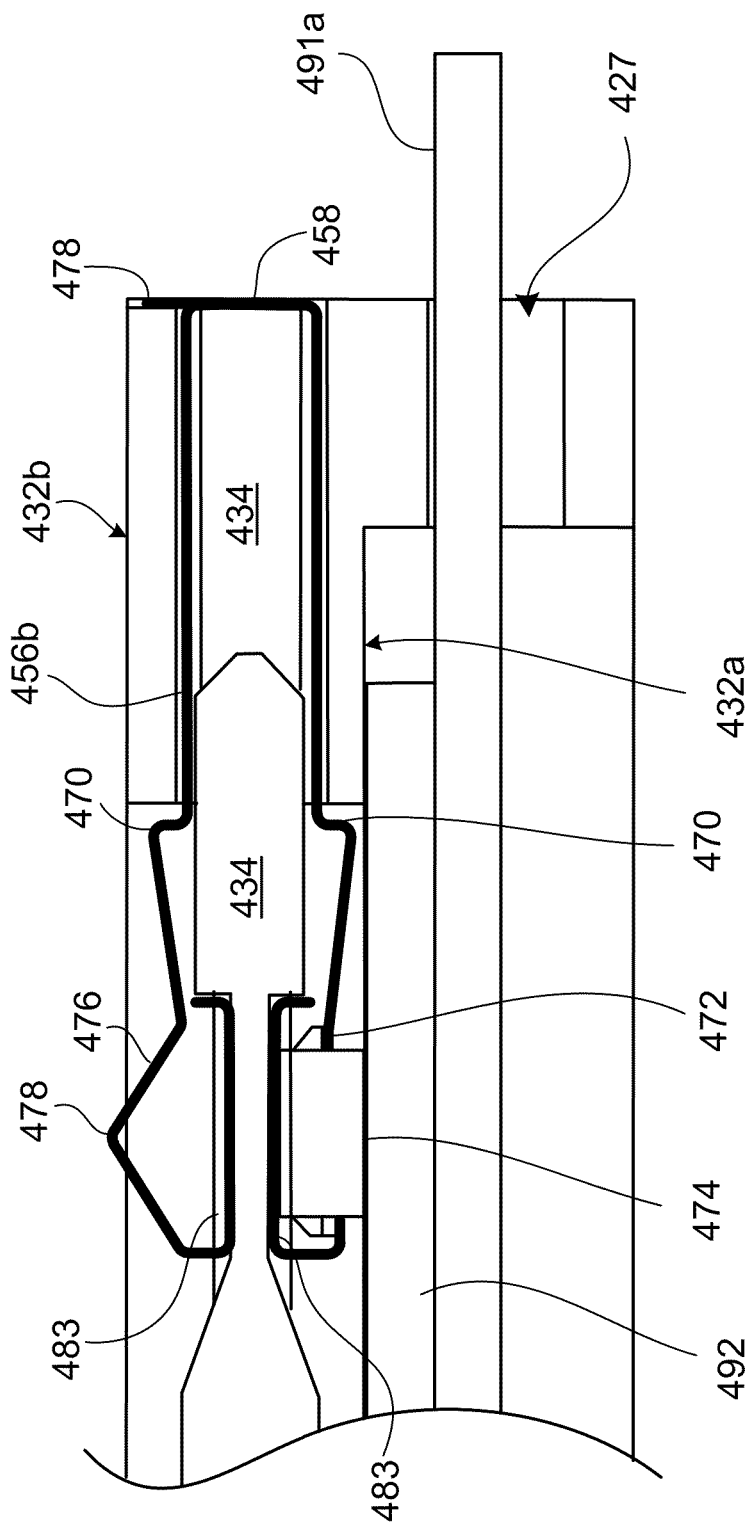
FIG. 15C is a detailed view from FIG. 15B.

Referring to FIG. 15A, following assembly of the temperature sensing assembly 490 and the clamping mechanism with the frame 410, the actuators 454 are each independently slidable within a corresponding one of the actuator slots 434 (FIG. 11A) and are moveable relative to the sidewalls 418 between a released and an engaged position. As illustrated in FIGS. 15B-15C, when the actuators 454 are in the released position, the engagement members 472, 476 are biased towards a rest position in which they are retracted within the recesses 483 (FIG. 15C) of the actuators 454. As illustrated in FIG. 15D, with the engagement members 472, 476 in the rest position, the spring plates 493 force the pressure plates 492 to rest against the sidewalls 418, as illustrated in FIG. 15D.

Figure 16A:
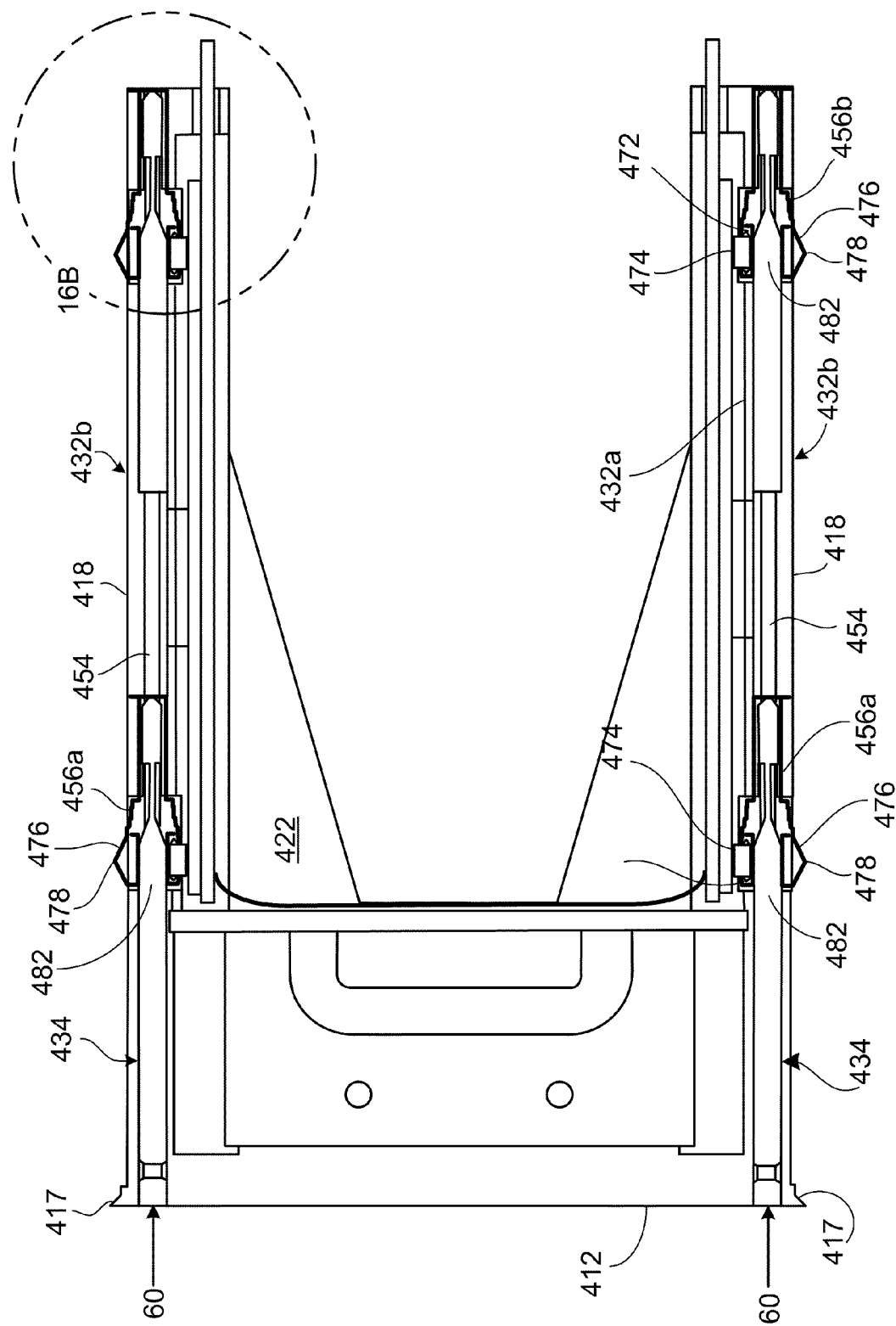
FIG. 16A is a sectioned plan view a storage device transporter with spring clamps in an engaged position.
Figure 16B:
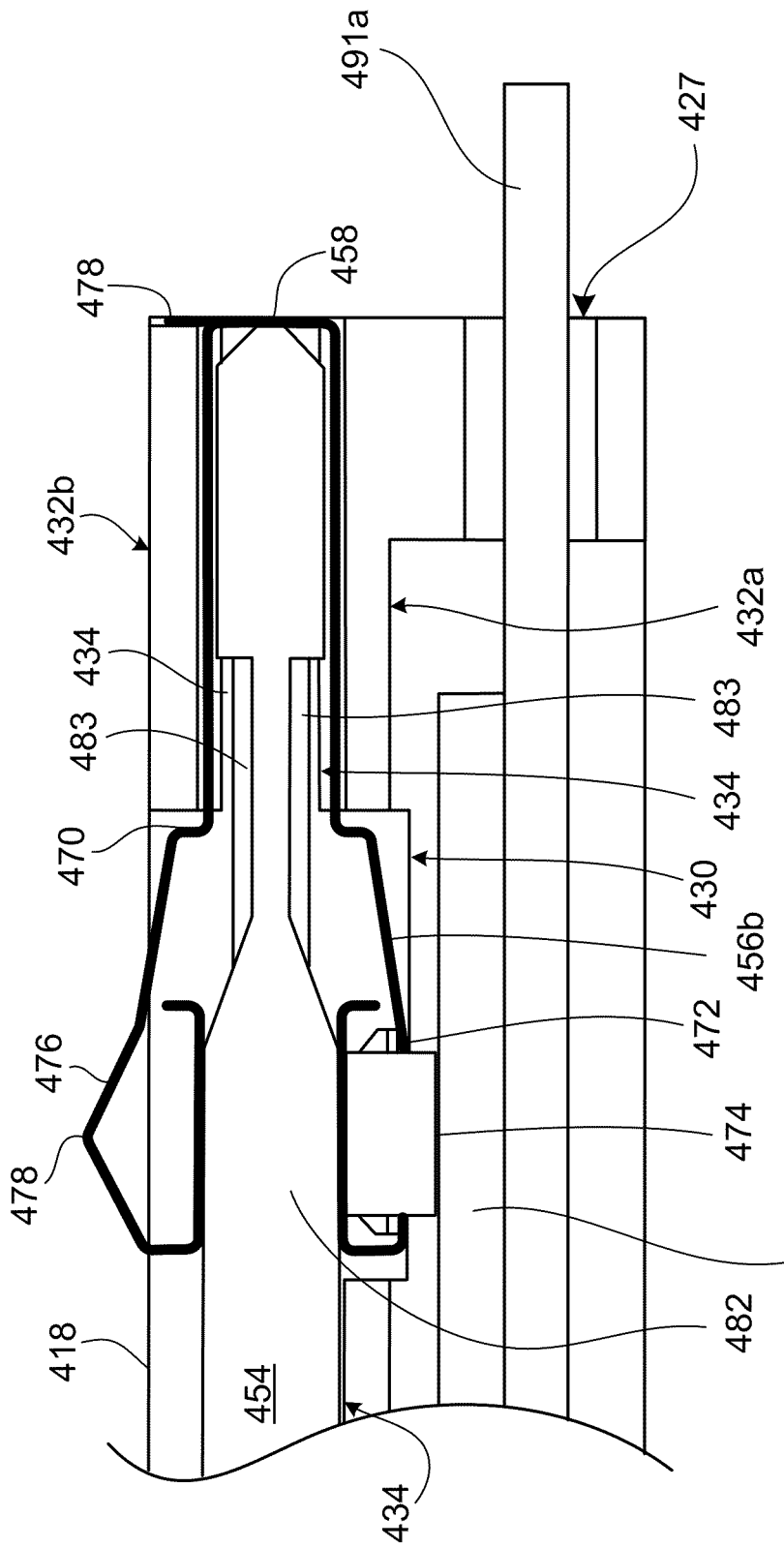
FIG. 16B is a detailed view from FIG. 16A.

The first and second engagement members 472, 476 of the spring clamps 456a, 456b can also be engaged by pushing the actuators 454 inwardly toward the first surface 414 of the face plate 414 (as indicated by arrow 60 in FIG. 16A). Referring to FIGS. 16A-16B, in the engaged position, the wedges 482 of the actuators 454 engage the spring clamps 456a, 456b to cause the first and second engagement members 472, 476 of the spring arms 460a, 460b to extend outwardly from the inner and outer surfaces 432a, 432b of the sidewalls 418. As shown in FIGS. 16B and 16C, in the engaged position, the dampers 474 (FIG. 16B) engage the pressure plates 492, thereby forcing the pressure plates 492 away from the sidewalls 418.

Figure 17A:
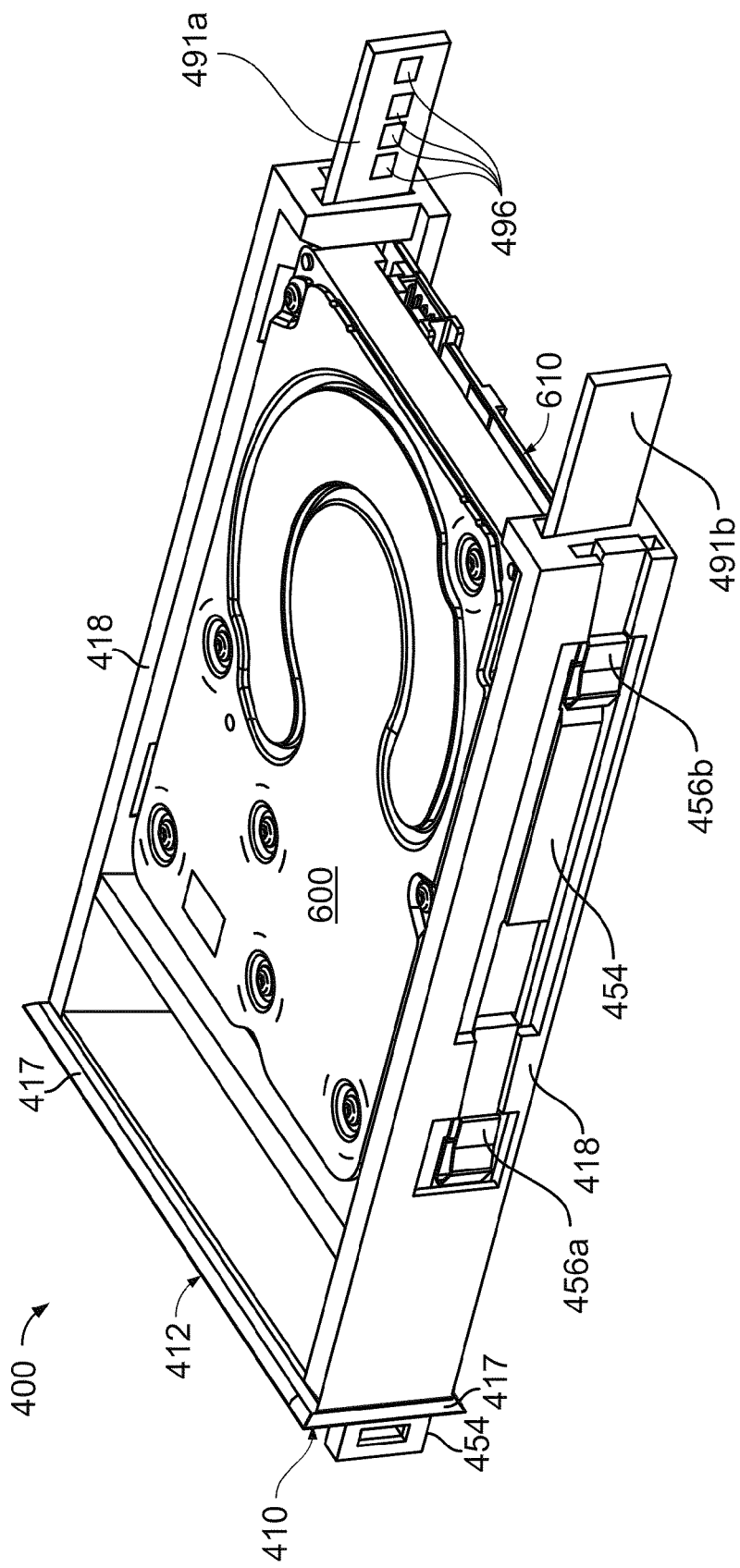
FIGS. 17A and 17B are perspective and plan views of a storage device transporter supporting a storage device.
Figure 17B:
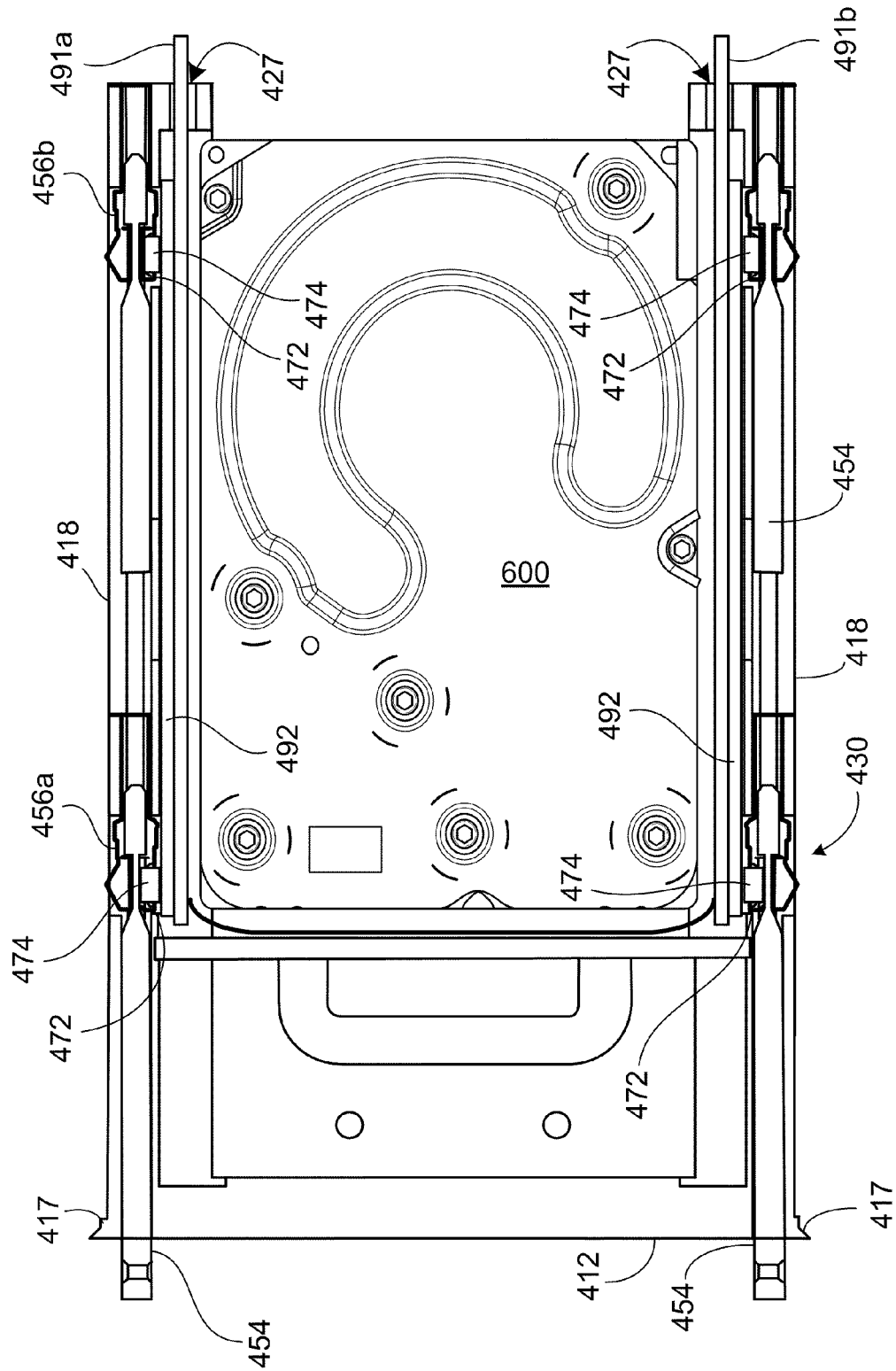
Figure 18:
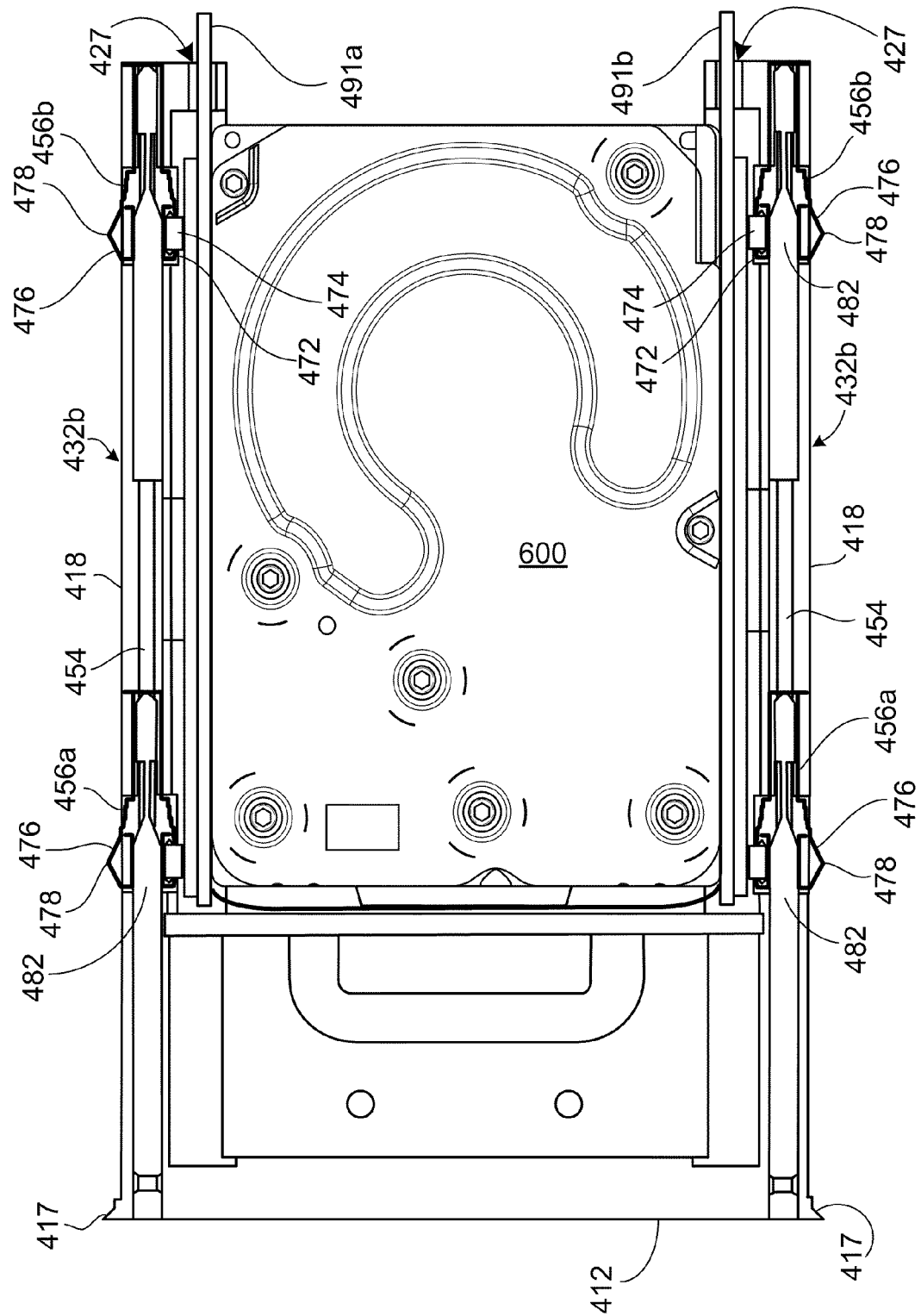
FIG. 18 is a plan view of a storage device transported clamped to a storage device.

As shown in FIGS. 17A and 17B, when the actuators 454 are in the release position, with the spring clamps 456a, 456b and pressure plates 492 refracted, a storage device 600 (shown hidden in FIG. 17B) can be inserted into the frame 410 between the printed wiring boards 491a, 491b. With a storage device 600 inserted in the frame 410, the actuators 454 can be moved towards the engaged position to displace the first engagement members 472 into contact with the pressure plates 492, thereby causing displacement of the pressure plates 492 and the attached printed wiring boards 491a, 491b, such that the printed wiring boards engage the storage device 600. This provides for direct contact of the printed wiring boards 491a, 491b with the storage device 600 for good contact between the thermocouples 487 and the storage device 600, and, at the same time, clamps the storage device 600 against movement relative to the frame 410, as shown in FIG. 18. The dampers 474 can also help to inhibit the transfer of vibrations between storage device transporter 400 and the storage device 600. It is also possible to add a compliant interface material between the thermocouple and the storage device to accommodate the surface irregularities of the storage device.

Test Slot

Figure 19:
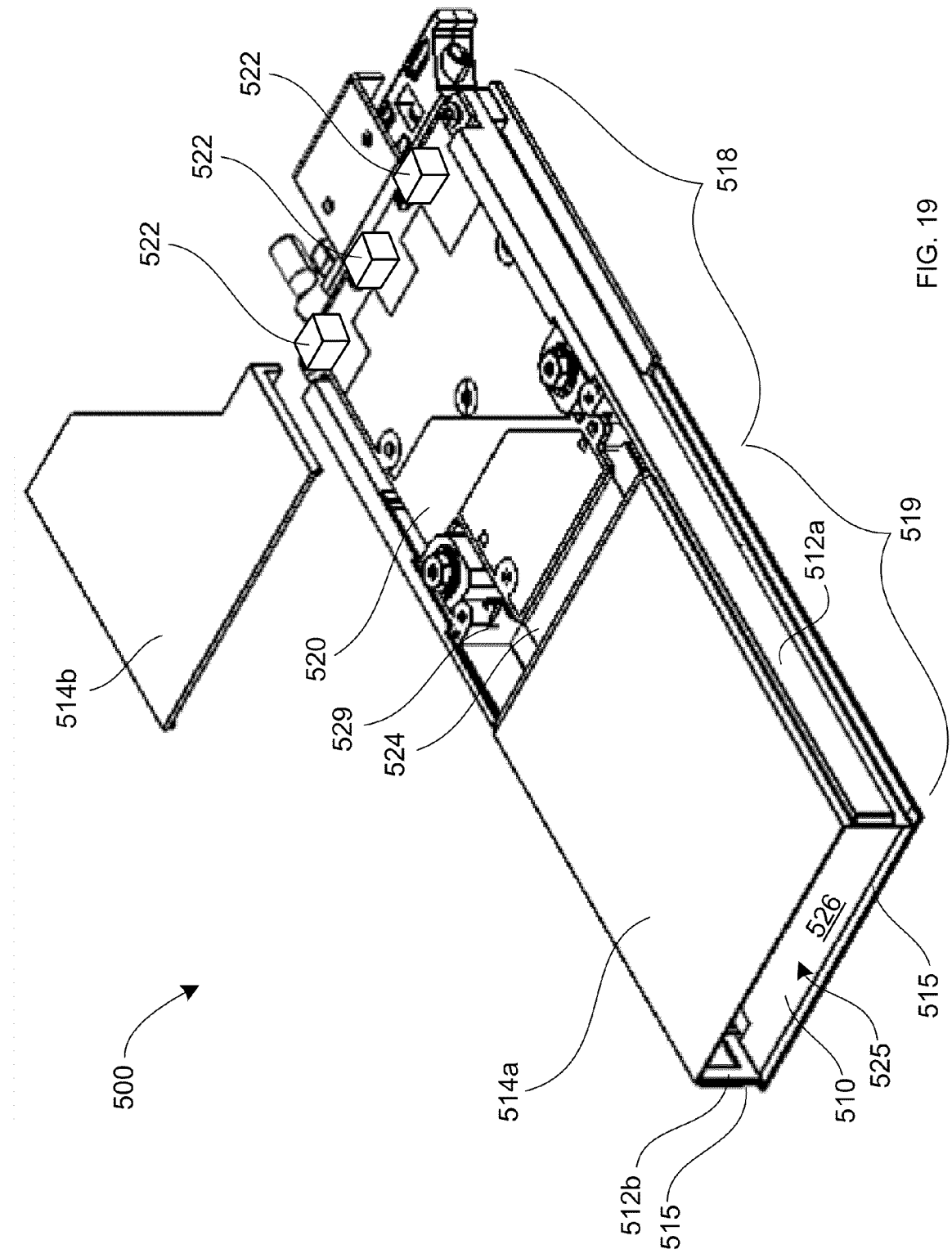
FIG. 19 is a perspective view of a test slot.
Figure 20:
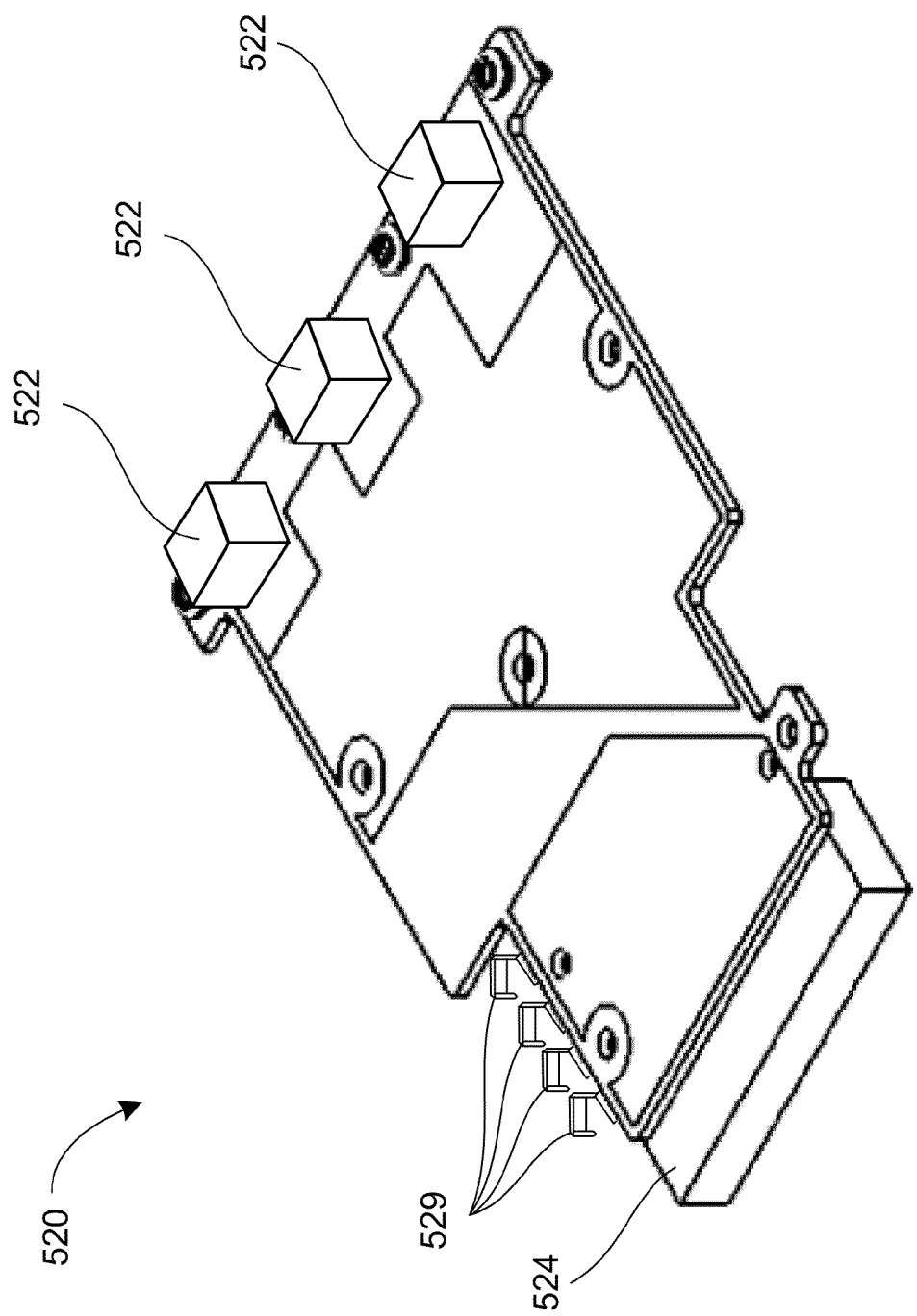
FIG. 20 is a perspective view of a connection interface board.

As shown in FIG. 19, the test slot 500 includes a base 510, upstanding walls 512a, 512b and first and second covers 514a, 514b. The first cover 514a is integrally molded with the base 510 and the upstanding walls 512a, 512b. The test slot 500 includes a rear portion 518 and a front portion 519. The rear portion 518 houses a connection interface board 520, which carries the connection interface circuit 182 (FIGS. 3A and 3B). As shown in FIG. 20, the connection interface board 520 includes electrical connectors 522 disposed along a distal end 573 of the connection interface board 520. The electrical connectors 522 provide for electrical communication between the connection interface circuit 182 (FIGS. 3A and 3B) and the test circuitry (e.g., self test system 180 and/or functional test system 190) in the associated test rack 100. The connection interface board 520 also includes a test slot connector 524, which provides for electrical communication between the connection interface circuit 182 and a storage device in the test slot 500.

The connection interface board 520 also includes spring contacts 529. The spring contacts 529 are arranged to engage the contact terminals 496 on the first printed wiring board 491a when the storage device transporter 400 is inserted in the test slot 500, thereby providing electrical communication between the printed wiring boards 491a, 491b and the connection interface board 520. Pogo pins can also be used as an alternative to, or in combination with, the spring contacts 529. Alternatively or additionally, mating (i.e., male and female) blind mate connectors can be utilized to provide electrical communication between the printed wiring boards 491a, 491b and the connection interface board 520.

The front portion 519 of the test slot 500 defines a test compartment 526 for receiving and supporting one of the storage device transporters 400. The base 510, upstanding walls 512a, 512b, and the first cover 514a together define a first open end 525, which provides access to the test compartment 526 (e.g., for inserting and removing the storage device transporter 400), and the beveled edges 515, which abut the face plate 412 of a storage device transporter 400 inserted in the test slot 500 to provide a seal that inhibits the flow of air into and out of the test slot 500 via the first open end 525.

Figure 21:
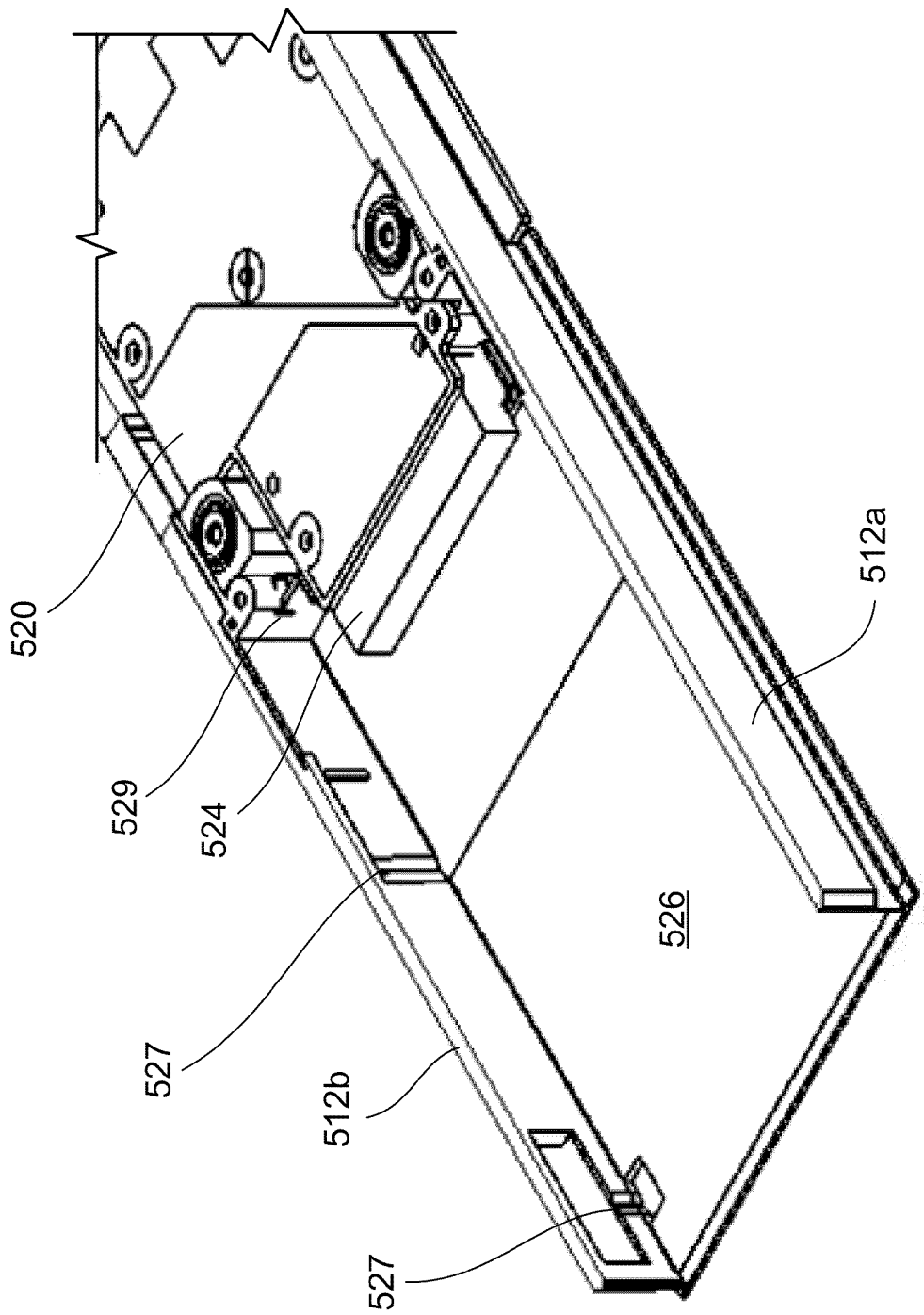
FIG. 21 is a perspective view of a test compartment from the test slot of FIG. 19 (with the front cover removed).

As shown in FIG. 21, in the region of the test compartment 526, the upstanding walls 512a, 512b define engagement features 527, which provide mating surfaces for the spring clamps 456a, 456b of the storage device transporter 400 allowing the storage device transporter 400 to be clamped within the test slot 500. For example, with a storage device 600 in the storage device transporter 400 and with the actuators 454 in the release position, the storage device transporter 400 can be inserted into a test slot 500 until a connector 610 (FIG. 17A) on the storage device 600 mates with the test slot connector 524.

Figure 22A:
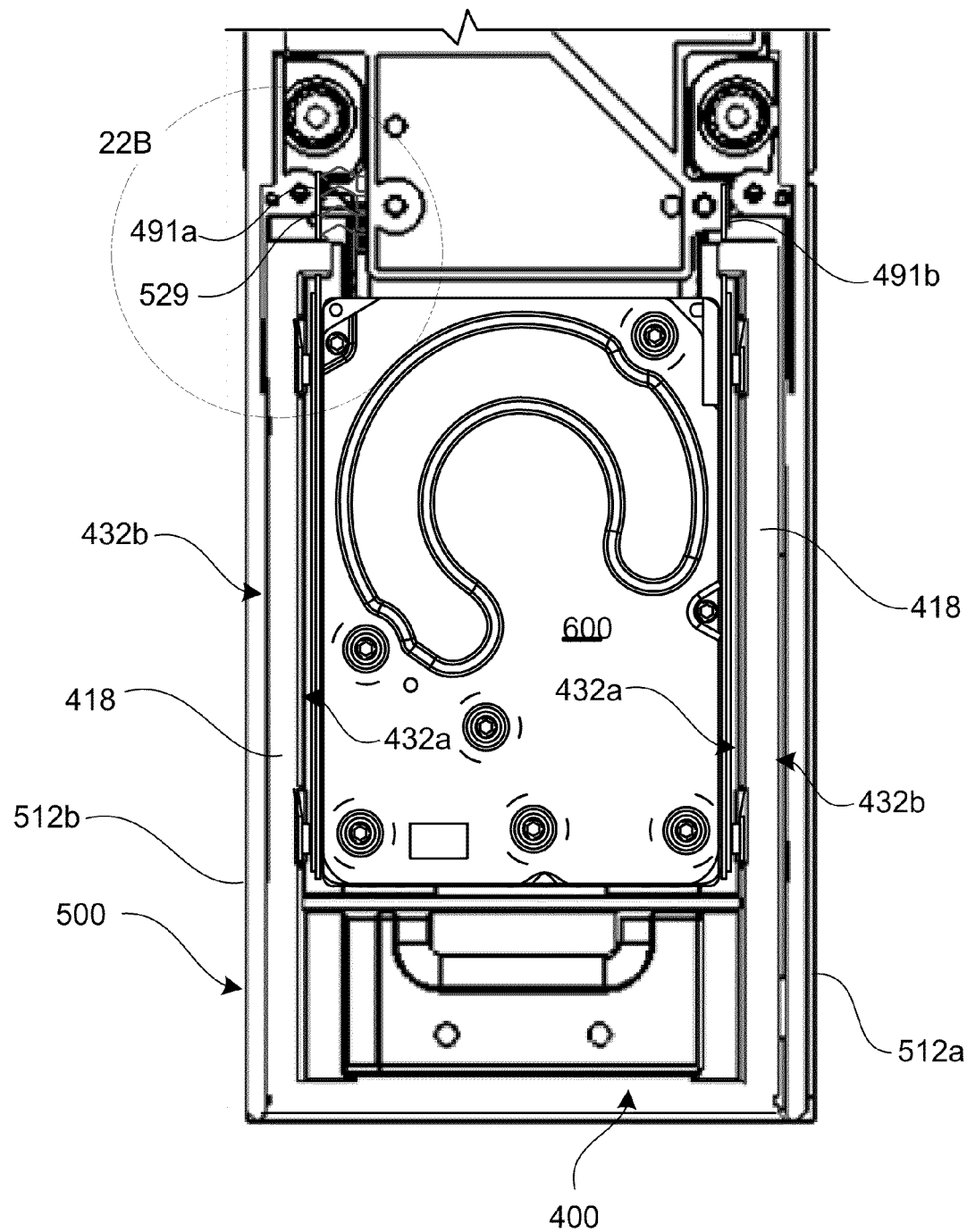
FIG. 22A is a plan view showing a storage device transporter, supporting a storage device, inserted in a test slot.
Figure 22B:
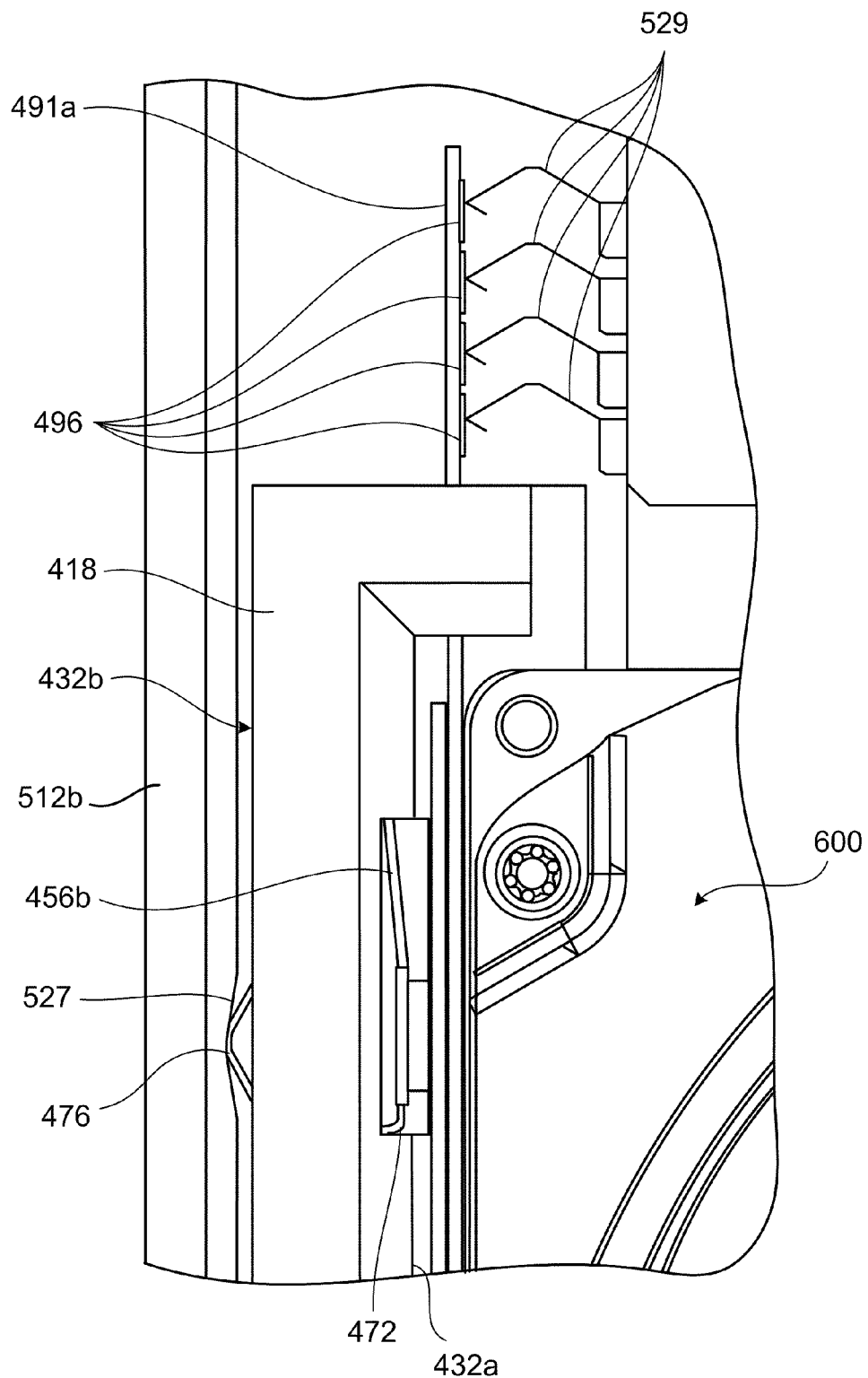
FIG. 22B is a detailed view from FIG. 22A.

With the storage device transporter 400 in a fully inserted position within the test slot 500 (i.e., with the storage device connector 610 mated with the test slot connector 524), the actuators 454 can be moved towards the engaged position to displace the first and second engagement members 472, 476 of the spring clamps 456a, 456b to extend outwardly from the inner and outer surfaces 432a, 432b of the sidewalls 418. Referring to FIGS. 22A and 22B, in the engaged position, the second engagement members 476 extend outwardly from the outer surfaces 432b of sidewalls 418 and engage the engagement features 527 in the test slot 500 to clamp the storage device transporter 400 against movement relative to the test slot 500. At the same time, the first engagement members 472 extend outwardly from the inner surfaces 432a of the sidewalls 418 and displace the printed wiring boards 491a, 491b of the temperature sensing assembly 490 towards the storage device 600 to clamp the storage device 600 against movement relative to the storage device transporter 400 and to provide physical contact between the printed wiring boards 491a, 491b and the storage device 600. This physical contact allows for a direct measurement of the temperature of the storage device 600 via the thermocouples 487 during testing. This clamping effect also brings the contact terminals 496 of the first printed wiring board 491a into firm contact with the spring contacts 529 on the connection interface board 520.

Methods of Operation

In use, the robotic arm 310 removes a storage device transporter 400 from one of the test slots 500 with the manipulator 312, then picks up a storage device 600 from one the storage device receptacles 264 at the transfer station 200 with the storage device transporter 400, and then returns the storage device transporter 400, with a storage device 600 therein, to the associated test slot 500 for testing of the storage device 600. During testing, the test electronics 160 execute a test algorithm that includes, inter alia, adjusting the temperature of the storage device 600 under test. For example, during testing the storage devices 600 are each tested over a temperature range from about 20° C. to about 70° C. The test electronics 160 can monitor the temperature of the storage devices 600 in each of the test slots 500 based on feedback received from the thermocouples 487. The test electronics 160 can also adjust the temperature of the storage devices 600 based on feedback from the thermocouples 487.

After testing, the robotic arm 310 retrieves the storage device transporter 400, along with the supported storage device 600, from the test slot 500 and returns it to one of the storage device receptacles 224 at the transfer station 200 (or moves it to another one of the test slots 500) by manipulation of the storage device transporter 400 (i.e., with the manipulator 312).

Other Embodiments

Other embodiments are within the scope of the following claims.

Figure 23:
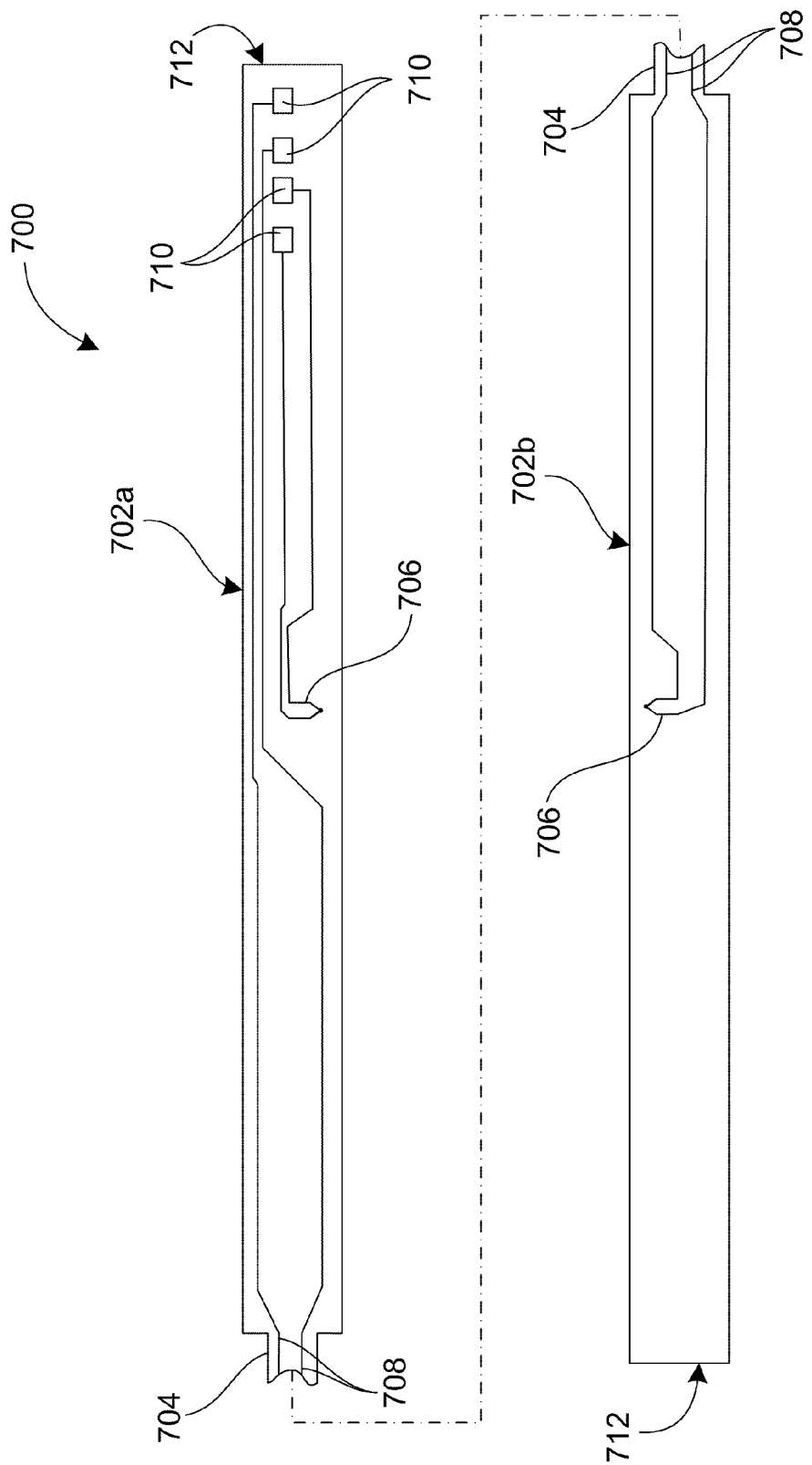
FIG. 23 is a plan view of a flexible printed circuit with integrated thermocouples.

For example, although an embodiment of a temperature sensing assembly has been described in which thermocouples are integrated into the circuitry on a pair of relatively rigid printed wiring boards that are hard wired together, in some embodiments, the thermocouples can be integrated into the circuitry of a flexible printed circuit. As an example, FIG. 23 illustrates a flexible printed circuit 700 that includes a pair of circuit portions (i.e., first and second circuit portions 702a, 702b) and a connecting portion 704 that is integral with the first and second circuit portions 702a, 702b.

Each of the first and second circuit portions 702a, 702b includes a thermocouple 706 that is defined by electrically conductive traces. The connecting portion 704 also includes electrically conductive traces 708 which provide an electrical connection between the thermocouples 706 of the first and second circuit portions 702a, 702b. The first circuit portion 702a includes a pair of contact terminals 710 at its distal end 712. The contact terminals 710 allow for electrical communication with the connection interface board 520 in the test slot 500. Suitable flexible printed circuits with integrated thermocouples are available from Watlow Electric Manufacturing Company of Columbia, Mo.

Figure 24:
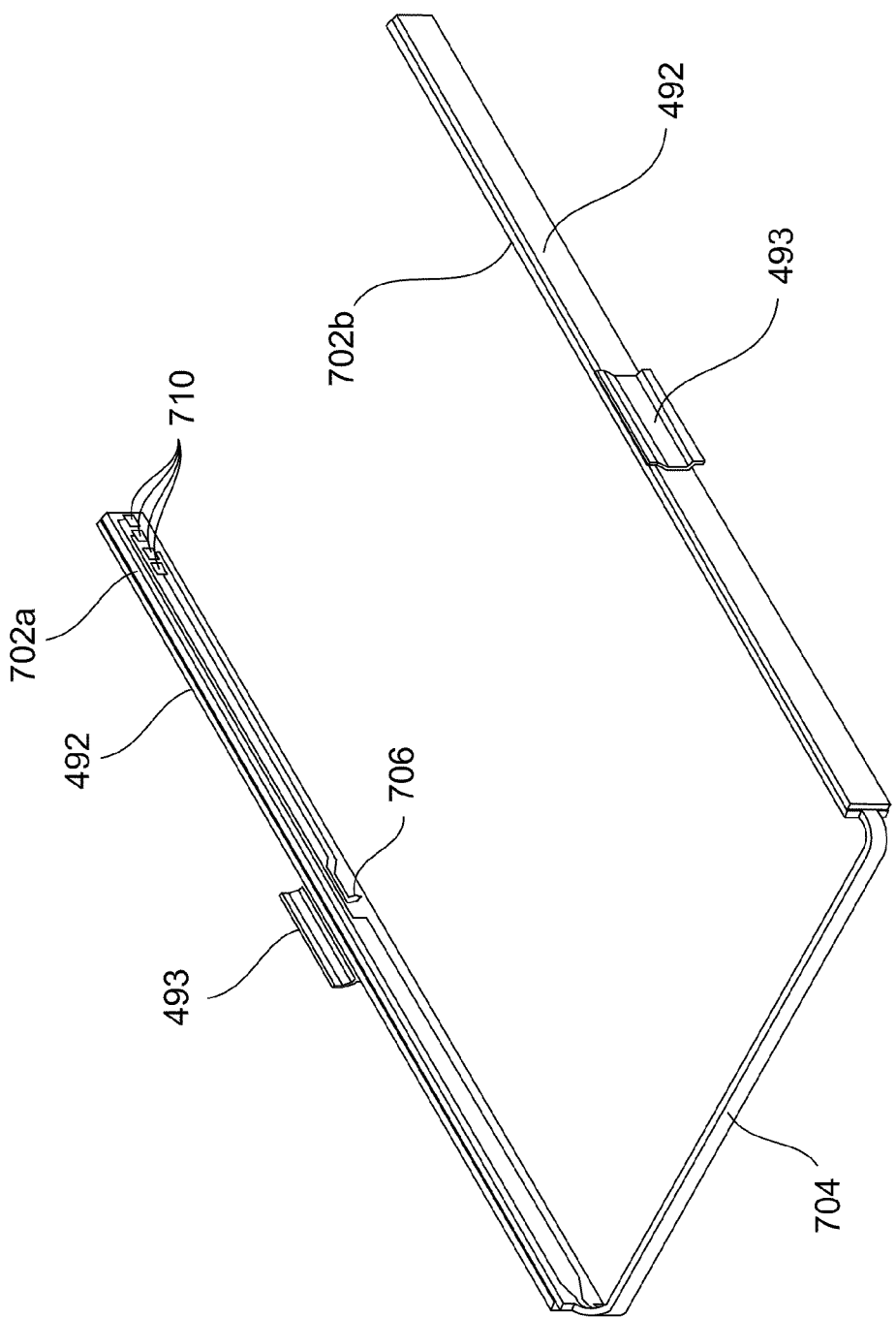
FIG. 24 is a perspective view of a temperature sensing assembly with the flexible printed circuit of FIG. 23.

As shown in FIG. 24, each of the first and second circuit portions 702a, 702b is mounted (e.g., via adhesive or mechanical fasteners) to an associated one of the pressure plates 492. The pressure plates 492 can extend along the entire back surfaces of the first and second circuit portions 702a, 702b for added stiffness and stability, e.g., to help provide good electrical connection between the contact terminals 710 on the flexible printed circuit 700 and the spring contacts 529 (FIG. 20) on the connection interface board 520 when the storage device transporter 400 is inserted into the test slot 500.

Figure 25:
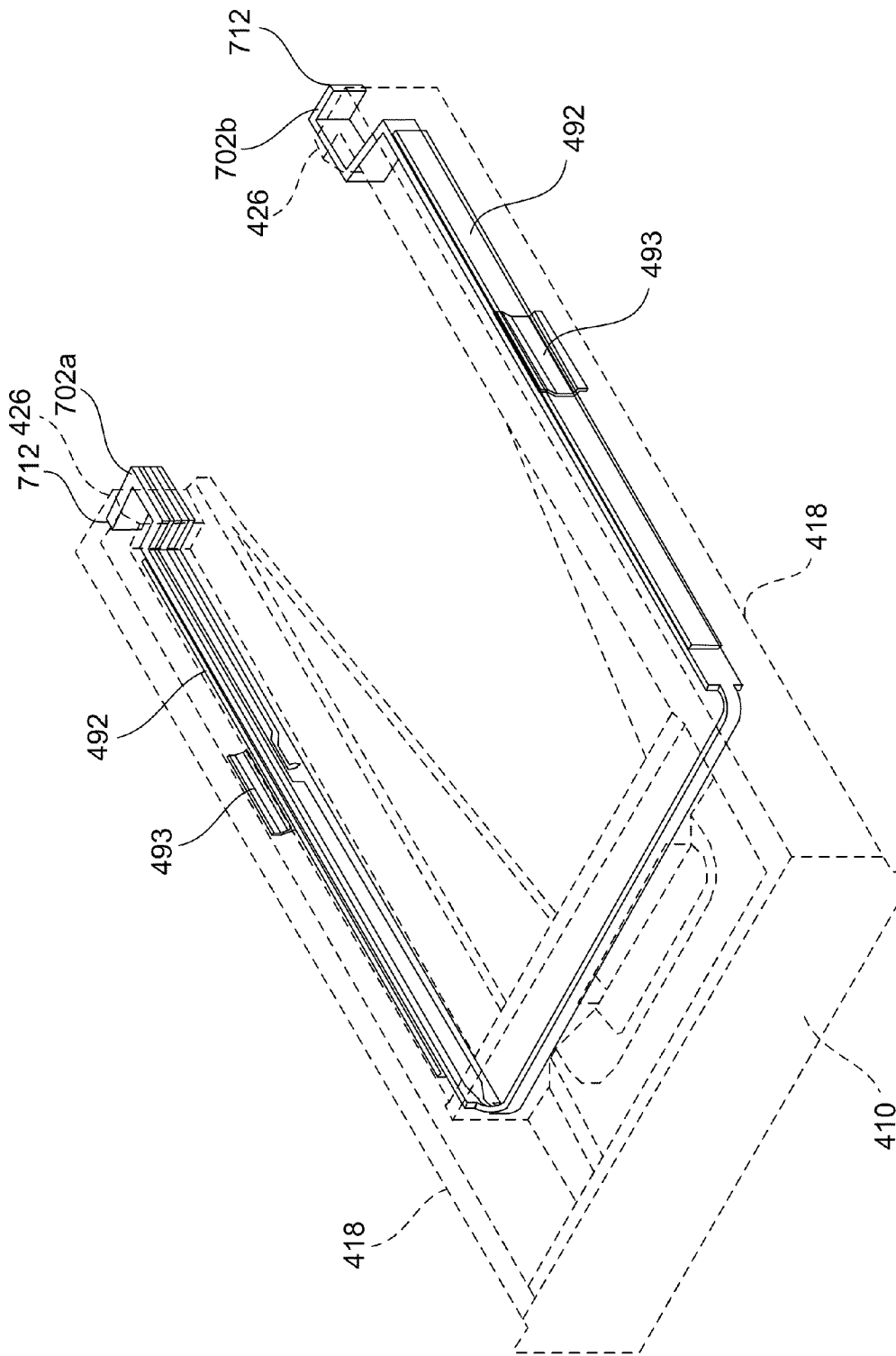
FIG. 25 is a perspective view of a temperature sensing assembly with the flexible printed circuit of FIG. 23 mounted to a transporter frame (shown in hidden lines).
Figure 26:
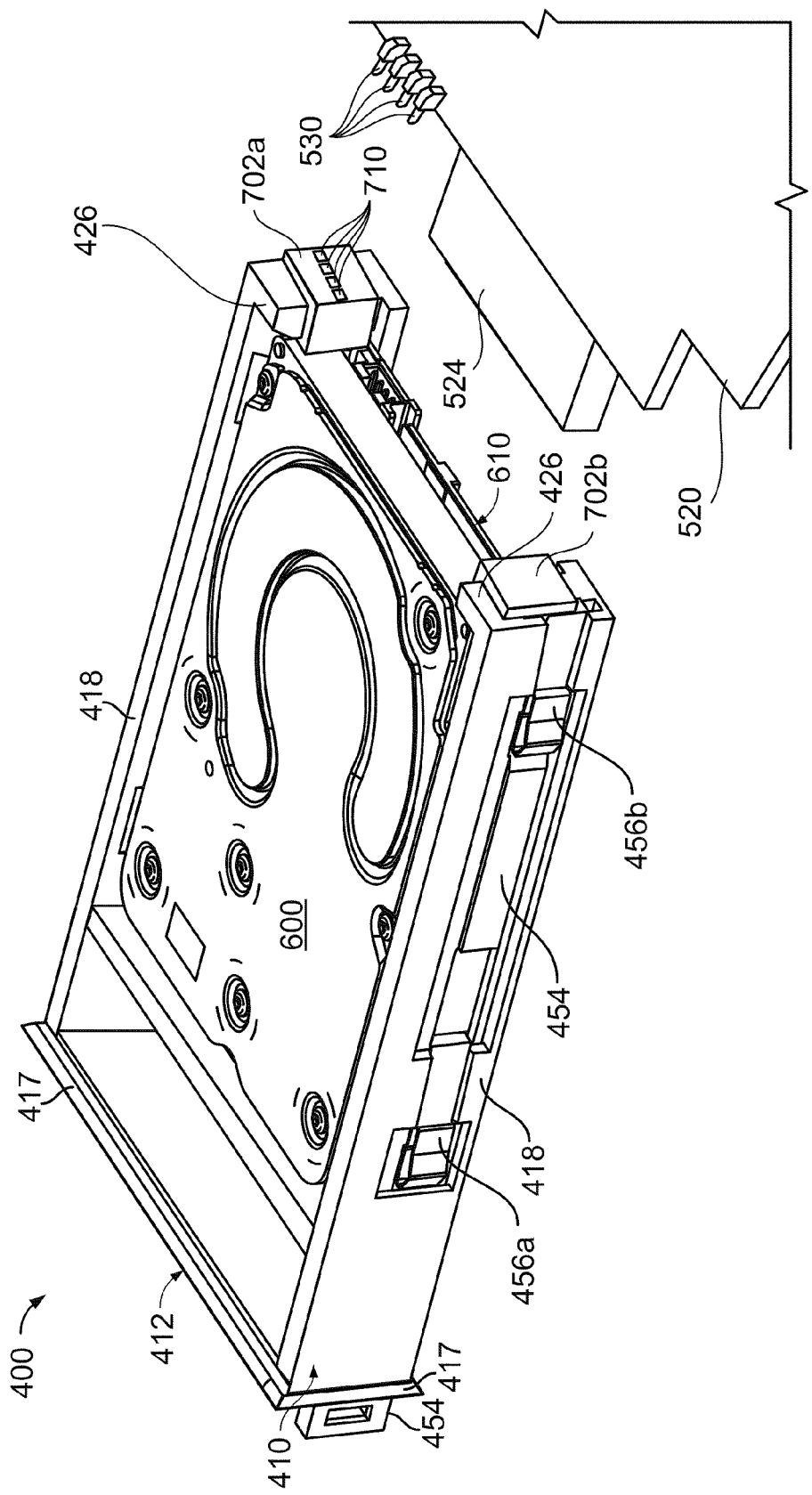
FIG. 26 is a perspective view of a storage device transporter, supporting a storage device, aligned for connection with a device interface board.

Alternatively, as illustrated in FIG. 25, distal ends 712 of the first and second circuit portions 702a, 702b can be left unsupported by the pressure plates 492 to allow the distal ends 712 to be wrapped around and conform to the shape of the back hooks 426 of the frame 410. The distal ends 712 of the first and second circuit portions 702a, 702b can be attached to the back hooks 426, e.g., with adhesive. As illustrated in FIG. 26, the connection interface board 520 can, in some embodiments, include pogo pins 530 for electrical contact with the contact terminals 710 of the flexible printed circuit 700.

Figure 27:
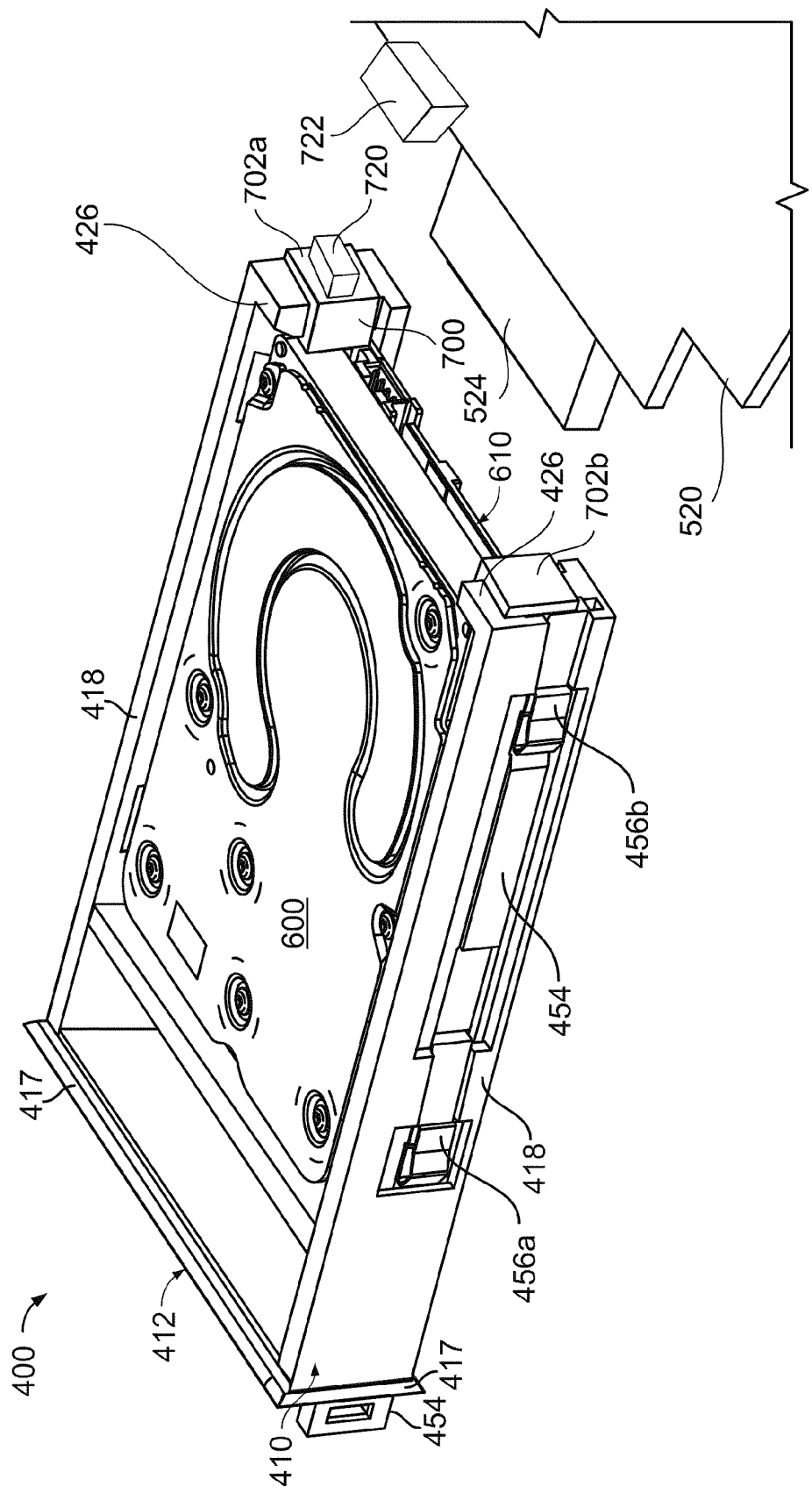
FIG. 27 is a perspective view of a storage device transporter, supporting a storage device, aligned for connection (via blind mating connectors) with a device interface board.

Alternative or additionally, electrical connection between the printed circuitry of the storage device transporter and the connection interface board can be provided by way of blind mate connectors. For example, FIG. 27 illustrates an embodiment in which mating blind mate connectors (i.e., male blind mate connector 720 and female blind mate connector 722) are provided for electrical communication between the printed circuitry 700 of the storage device transporter 400 and the connection interface board 520.

Figure 28:
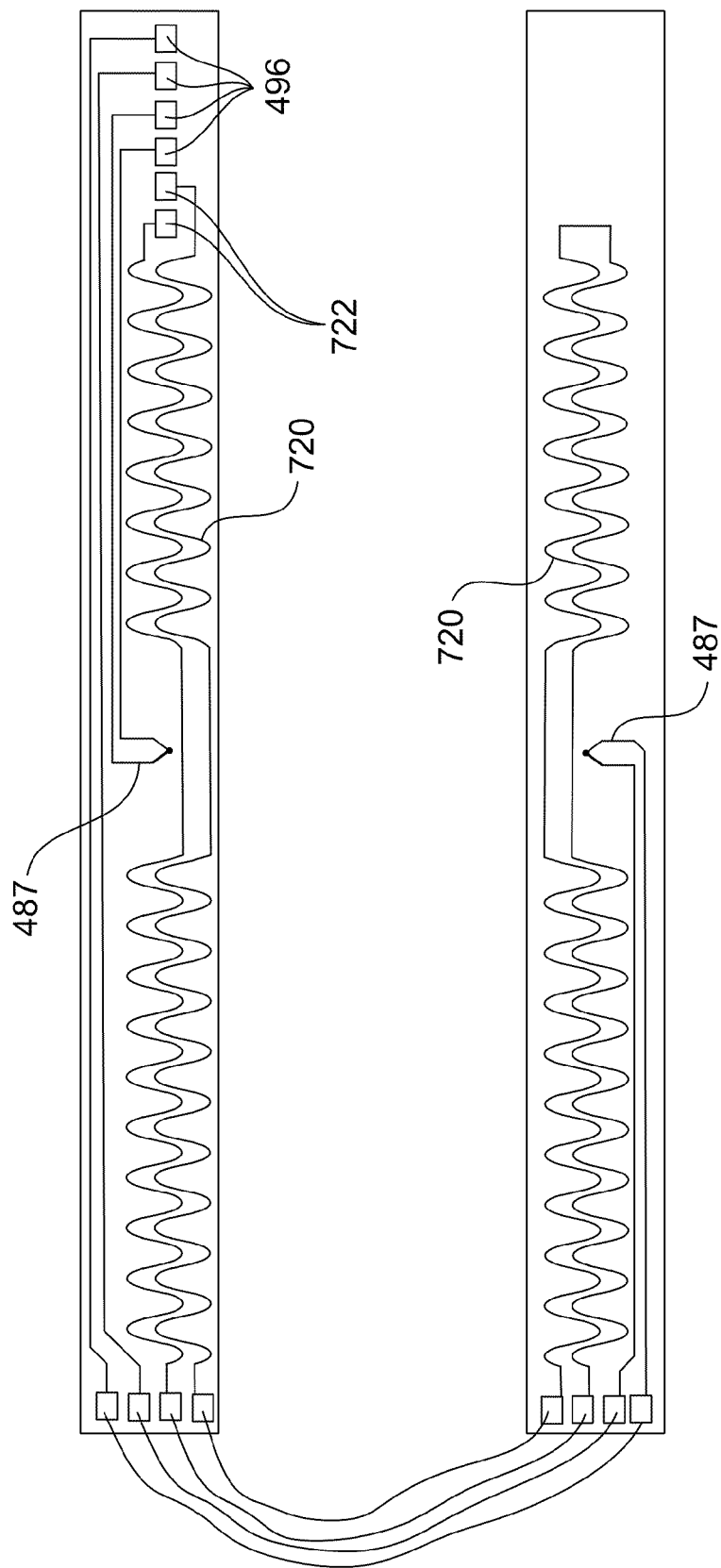
FIG. 28 is a plan view of a pair of printed wiring boards with integrated resistive heaters and thermocouples.

In some embodiments, the temperature sensing assembly 490 can also include one or more electric heating elements (e.g., resistive heaters) for heating a storage device supported in the storage device transporter during testing. For example, FIG. 28 illustrates one embodiment in which the printed wiring boards 491a, 491b include resistive heaters 720 that are arranged to heat a storage device supported by the frame to be heated. In particular, when the printed wiring boards 491a, 491b are clamped against a storage device 600 supported in the storage device transporter 400, the resistive heaters 720 contact the storage device 600, thereby allowing the storage device 600 to be heated by way of thermal conduction In addition to contact terminals 496 for the thermocouples 487, the first printed wiring board 491a is also provided with resistive heaters contact terminals 722 that are electrically connected to the resistive heaters 720. Additional spring contacts or pogo pins can also be provided on the connection interface board 520 (FIG. 20) to provide electrical communication between the connection interface board 520 and the resistive heaters 720.

The resistive heaters 720 can be placed in electrical communication with the test electronics 160 (FIGS. 3A and 3B) via the connection interface board 520. The test electronics 160 can be configured to control flows of electrical current to the resistive heaters 720 based, at least in part, on signals received from the thermocouples 487.

The resistive heaters 720 can be integrated into the electrically conductive layers of the printed wiring boards 491a, 491b. Furthermore, although an embodiment has been described in which resistive heaters are provided on a rigid printed wiring board, resistive heaters can also be incorporated in embodiments employing flexible printed circuits, such as the embodiment described above with regard to FIGS. 24-26. Flexible printed circuits with integrated resistive heaters and/or thermocouples are available from Watlow Electric Manufacturing Company of Columbia, Mo.

Figure 29:
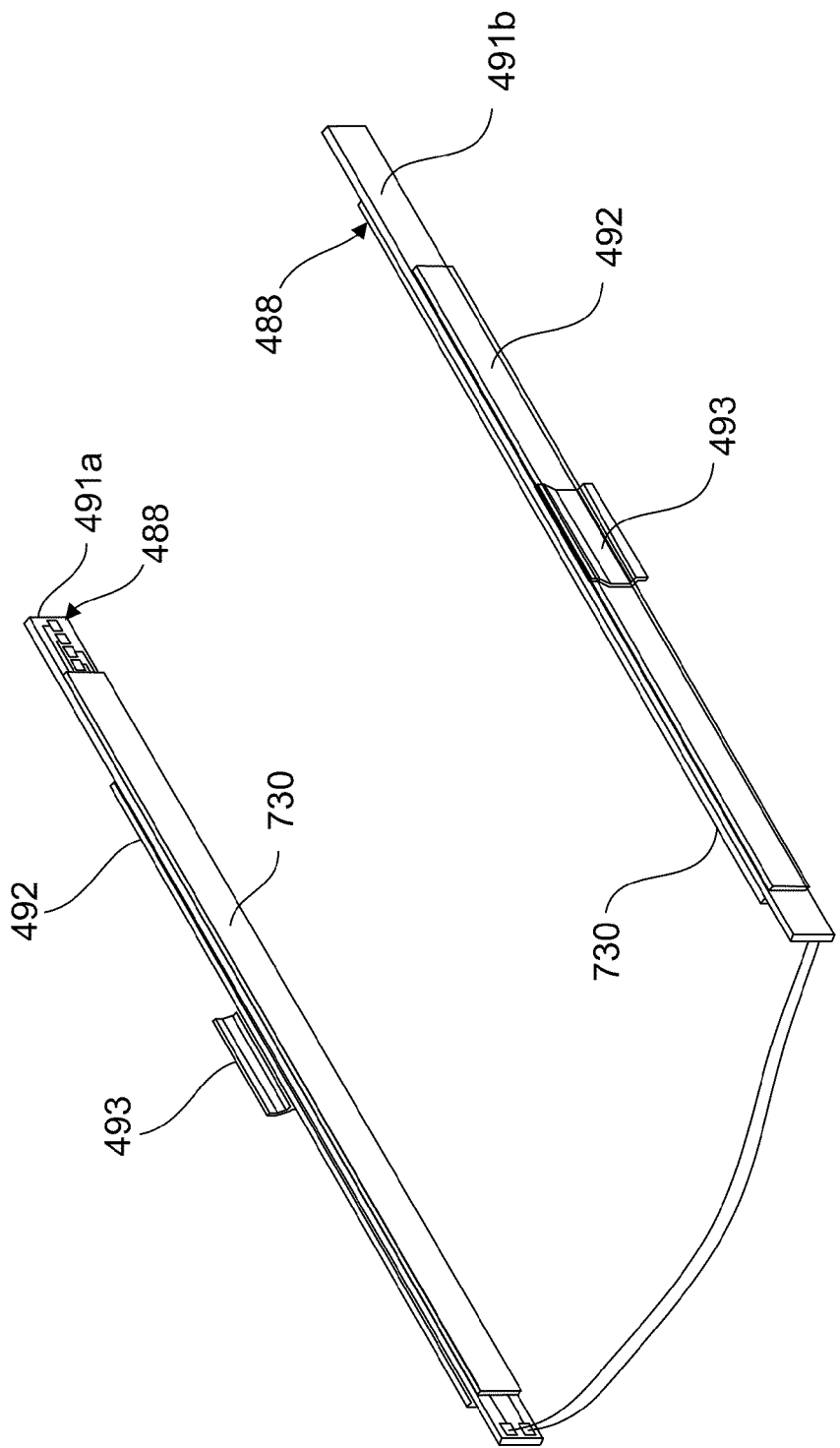
FIG. 29 is a perspective view of a temperature sensing assembly with a compliant material on exposed surfaces of printed wiring boards.

In some embodiments, the temperature sensing assembly 490 can also include a compliant material, such as Sil-Pad manufactured by Bergquist Company of Chanhassen, Minn., as an additional layer between the thermocouples 487 and a storage device supported in the storage device transporter 400. For example, FIG. 29 illustrates an embodiment in which a layer of compliant material 730 is adhered the first surfaces 488 of the printed wiring boards 491a, 491b. The compliant material 730 can help to inhibit scratching of a supported storage device when clamped within the storage device transporter 400. The compliant material 730 can also help to further inhibit the transmission of vibrations between the storage device transporter 400 and a supported storage device. The compliant material 730 between the thermocouples 487 and the storage device 600 also accommodates the surface irregularities of the storage device 600.

Although an embodiment of a storage device transporter has been described which utilizes a pair of spring plates to bias the pressure plates, and the attached printed circuitry, toward respective sidewalls of the transporter frame, other resilient biasing mechanisms are possible.

Although an embodiment of a clamping mechanism has been described that includes multiple spring claims, in some embodiments, as few as one spring clamp may be used.

Figure 30A:
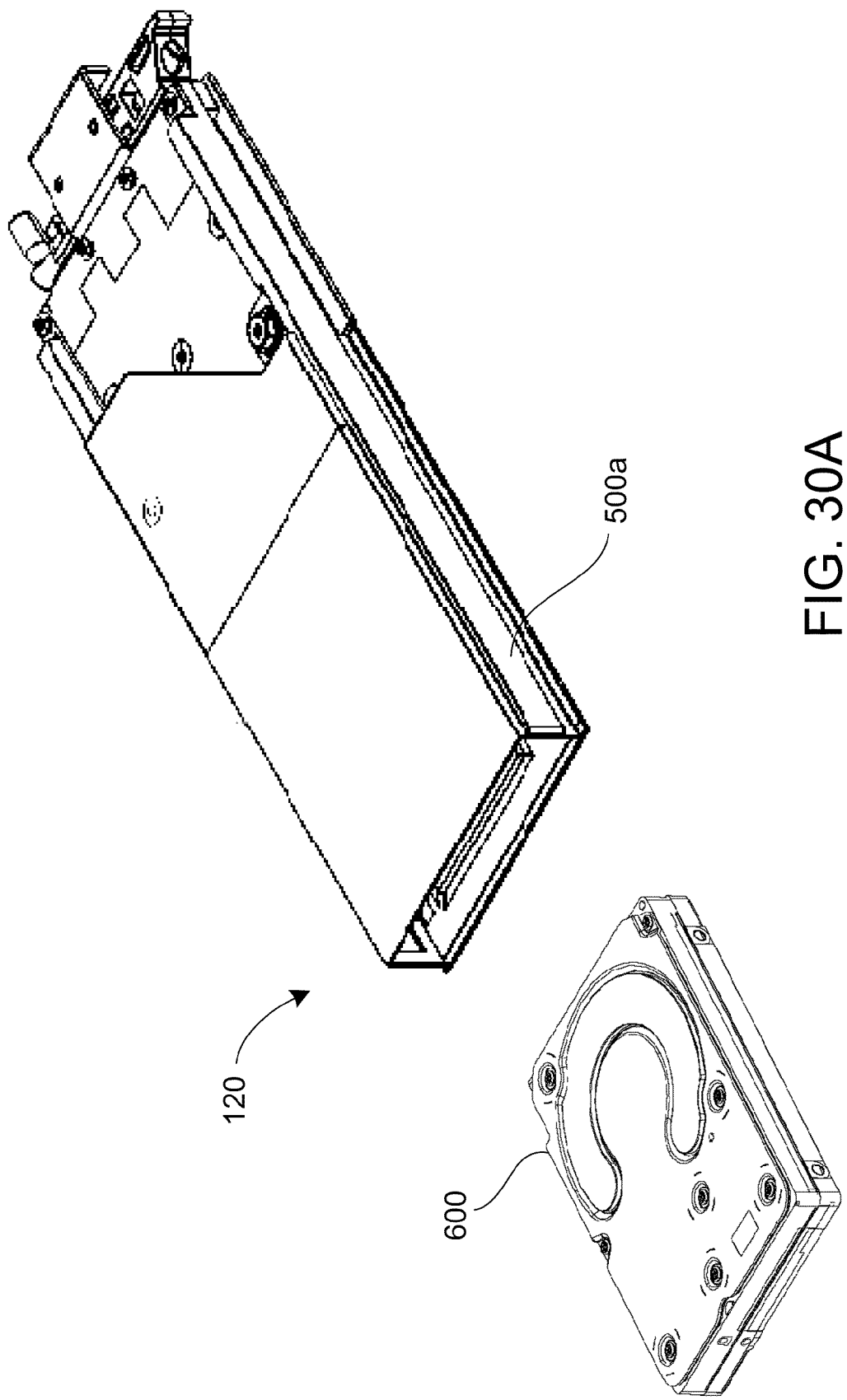
FIG. 30A is a perspective view of a test slot assembly.
Figure 30B:
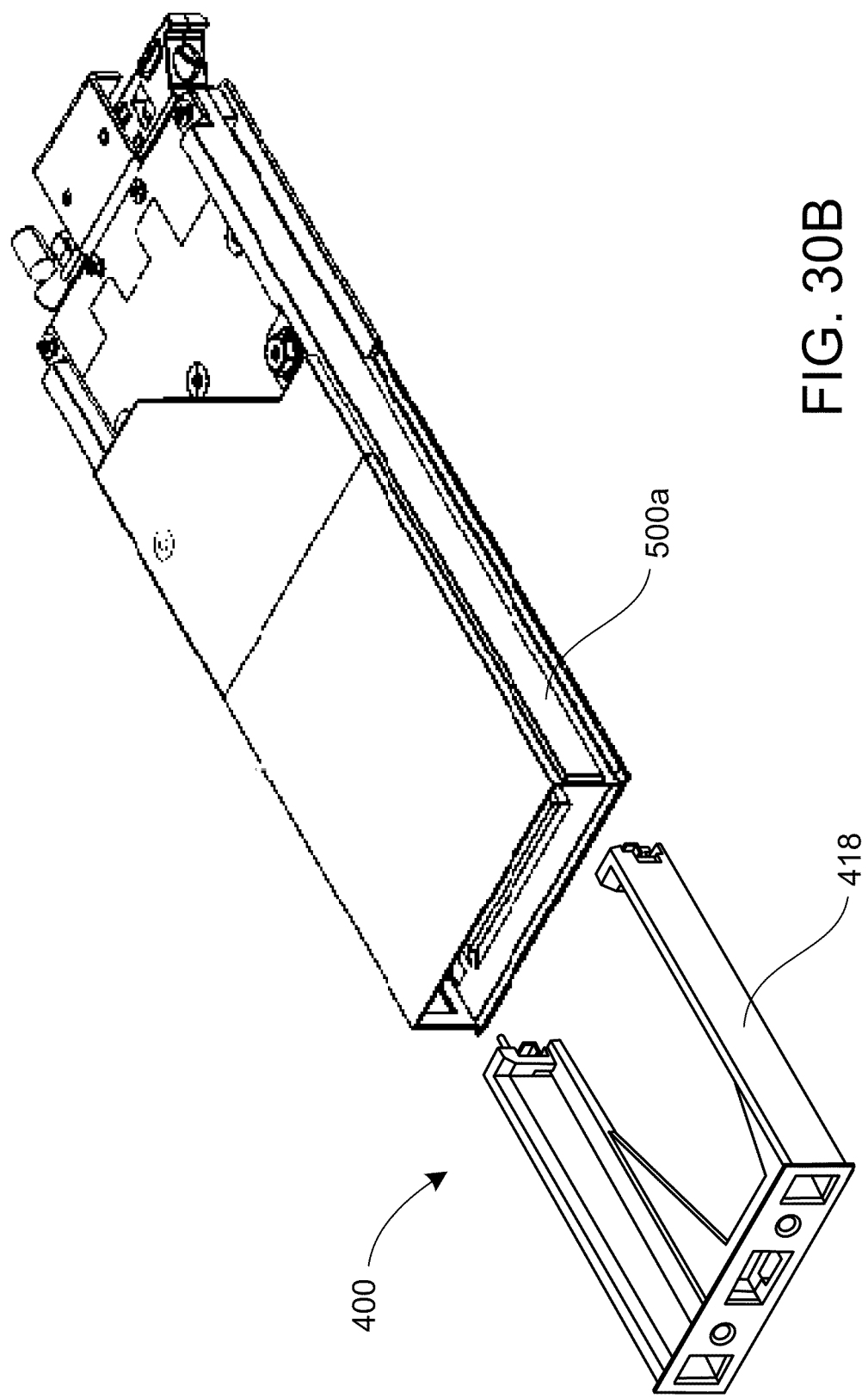
FIG. 30B is a perspective view of a test slot assembly and a storage device.

Other embodiments of the test slot may be used, and the storage device transporter may take a different form or be absent from the test slot assembly. As shown in FIG. 30A, each test slot assembly 120 may include at least a test slot 500a for receiving a storage device 600 to be tested. As shown in FIG. 30B, the test slot assembly 120 may include an optional storage device transporter 400. The storage device transporter 400 can be used for capturing storage devices 600 (e.g., from the loading station) and for transporting the storage devices 600 to one of the test slots 500a for testing. The storage device transporter 400 may have integrated sidewalls 418. In some implementations, the sidewalls are absent from the storage device transporter 400.

Figure 31A:
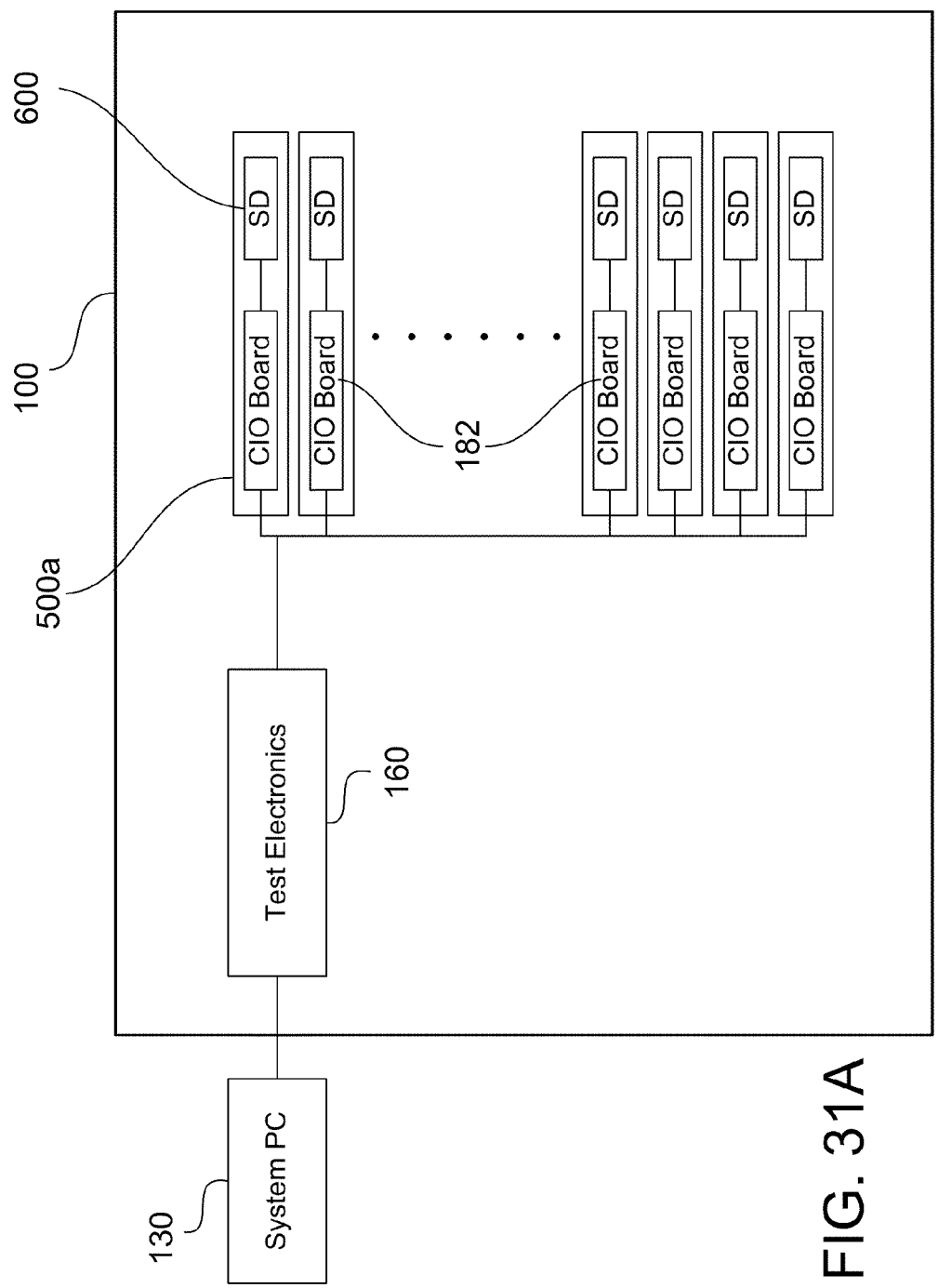
FIGS. 31A and 31B are schematic views of self-test and functional test circuitry.

Referring to FIG. 31A, in some implementations, the storage device testing system 10 also includes at least one computer 130 in communication with the test slots 500a. The computer 130 may be configured to provide inventory control of the storage devices 600 and/or an automation interface to control the storage device testing system 10. Within each of the test racks 100, test electronics 160 are in communication with each test slot 500a. The test electronics 160 are configured to communicate with a disk dive 600 received within the test slot 500a. The test electronics 160 execute test algorithms and monitor the status (e.g., temperature) of storage devices under test.

Figure 31B:
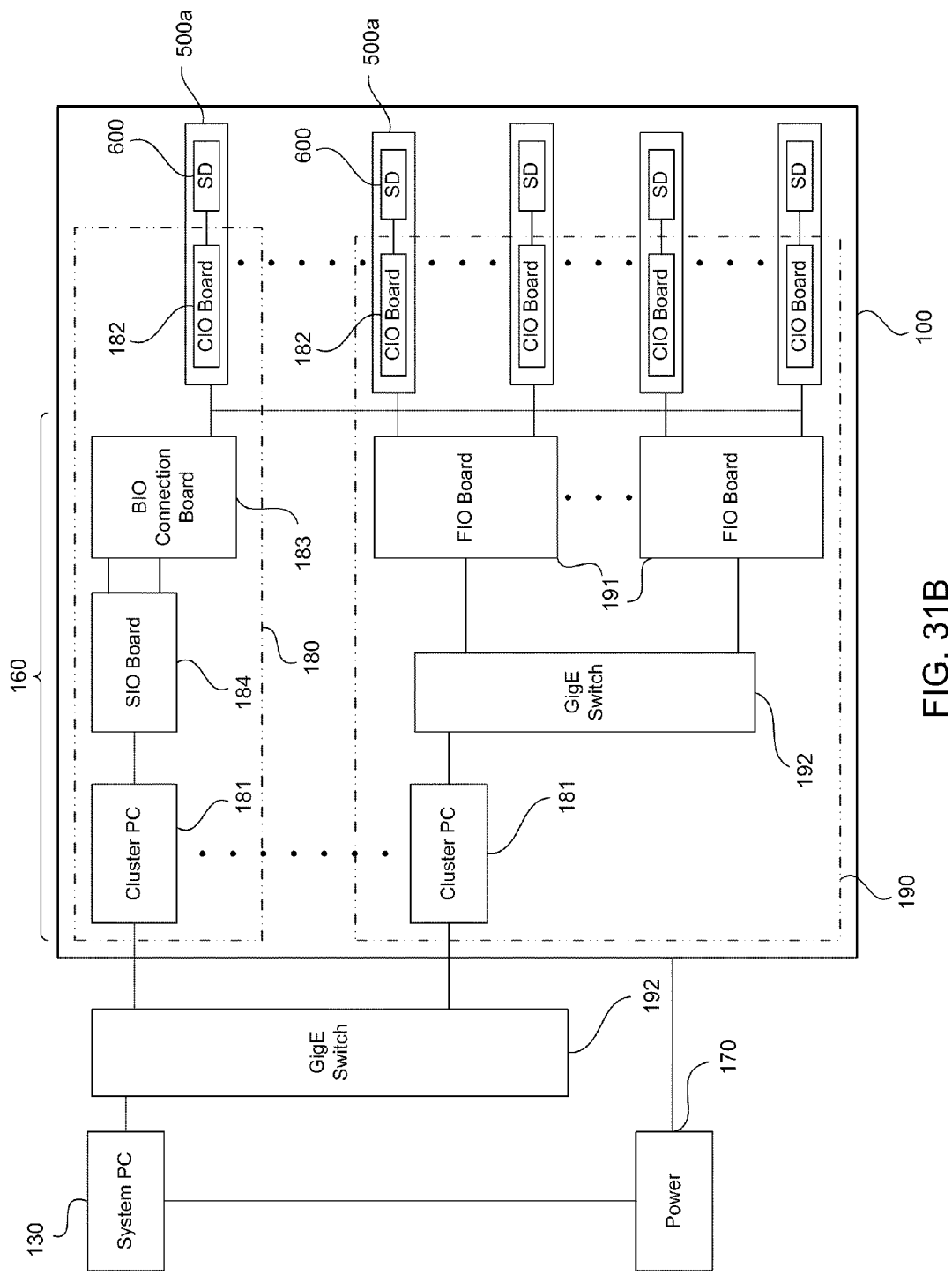

Referring to FIG. 31B, a power system 170 supplies power to the storage device testing system 10. The power system 170 may monitor and/or regulate power to the received storage device 600 in the test slot 500a. In the example illustrated in FIG. 31B, the test electronics 160 within each test rack 100 include at least one self-testing system 180 in communication with at least one test slot 500a. The self-testing system 180 supports the self-testing of the storage device 600 received within the test slot 500a. The self-testing system 180 includes a cluster controller 181, one or more connection interface circuits 182 each in electrical communication with a storage device (SD) 600 received within the test slot 500a, and one or more block interface circuits 183 in electrical communication with the connection interface circuit 182. The cluster controller 181, in some examples, is configured to run one or more testing programs with a capacity of approximately 120 self-tests and/or 60 functionality test of storage devices 600. The connection interface circuits 182 and the block interface circuit(s) 183 are configured to support storage device self-test. A storage device self-test may include testing the amount of power received by the storage device 600, the operating temperature, the ability to read and write data, and the ability to read and write data at different temperatures (e.g. read while hot and write while cold, or vice versa). The storage device self-test may test every memory sector of the storage device 600 or only random samplings. The functionality test may test an operating temperature of the storage device 600 and also the data integrity of communications with the storage device 600. The cluster controller 181 may communicate with the self-test circuit 184 via Ethernet (e.g. Gigabit Ethernet), which may communicate with the block interface circuit(s) 183 and onto the connection interface circuit(s) 182 and storage device(s) 600 via universal asynchronous receiver/transmitter (UART) serial links. A UART is usually an individual (or part of an) integrated circuit used for serial communications over a computer or peripheral device serial port. The block interface circuit(s) 183 is/are configured to control power to and temperature of the test slots 500a and each block interface circuit 183 may control one or more test slots 500a and/or storage devices 600.

In some examples, the test electronics 160 can also include at least one functional testing system 190 in communication with at least one test slot 500a. The functional testing system 190 tests whether a received storage device 600, held and/or supported in the test slot 500a by the storage device transporter 400, is functioning properly. A functionality test may include testing the amount of power received by the storage device 600, the operating temperature, the ability to read and write data, and the ability to read and write data at different temperatures (e.g. read while hot and write while cold, or vice versa). The functionality test may test every memory sector of the storage device 600 or only random samplings. The functionality test may test an operating temperature of the storage device 600 and also the data integrity of communications with the storage device 600. The functional testing system 190 includes a cluster controller 181 and at least one functional interface circuit 191 in electrical communication with the cluster controller 181. A connection interface circuit 182 is in electrical communication with a storage device 600 received within the test slot 500a and the functional interface circuit 191. The functional interface circuit 191 is configured to communicate a functional test routine to the storage device 600. The functional testing system 190 may include a communication switch 192 (e.g. Gigabit Ethernet) to provide electrical communication between the cluster controller 181 and the one or more functional interface circuits 191. Preferably, the computer 130, communication switch 192, cluster controller 181, and functional interface circuit 191 communicate on an Ethernet network. However, other forms of communication may be used. The functional interface circuit 191 may communicate to the connection interface circuit 182 via Parallel AT Attachment (a hard disk interface also known as IDE, ATA, ATAPI, UDMA and PATA), SATA, or SAS (Serial Attached SCSI).

Figure 32A:
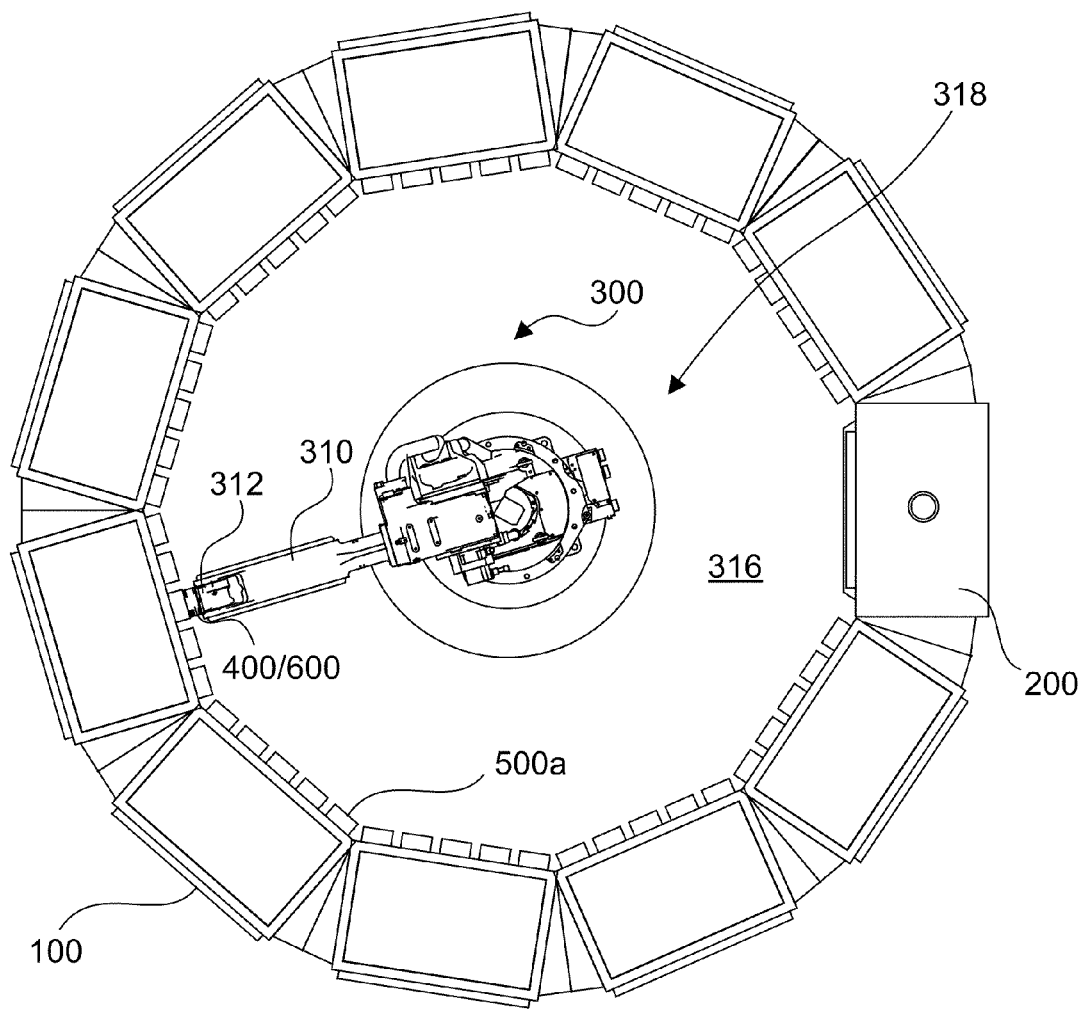
FIG. 32A is a top view of a storage device testing system.
Figure 32B:
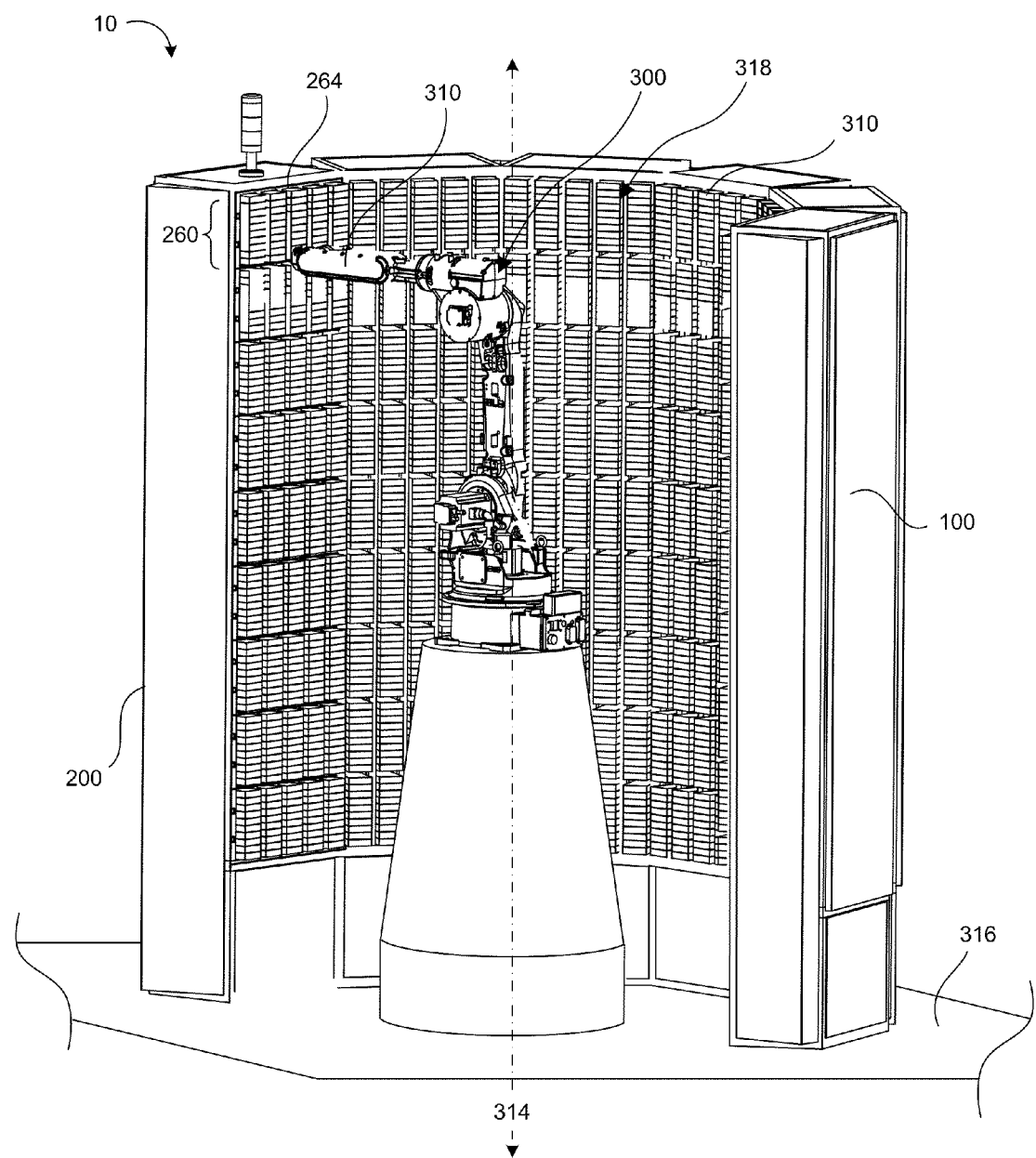
FIG. 32B is a perspective view of a storage device testing system.

Referring to FIGS. 32A and 32B, the robot 300 includes a robotic arm 310 and a manipulator 312 (FIG. 32A) disposed at a distal end of the robotic arm 310. The robotic arm 310 defines a first axis 314 (FIG. 32B) normal to a floor surface 316 and is operable to rotate through a predetermined arc about and extends radially from the first axis 314 within a robot operating area 318. The robotic arm 310 is configured to independently service each test slot 500a by transferring storage devices 600, for example, between totes 260 at the transfer station 200 and the test racks 100. In some implementations, the robotic arm 310 is configured to pick up a storage device 600 from one the storage device receptacles 264 at the transfer station 200 and load the storage device 600 into the test slot 500a for testing of the storage device 600. In some implementations, the robotic arm 310 is configured to remove a storage device transporter 400 from one of the test slots 500a with the manipulator 312, then pick up a storage device 600 from one the storage device receptacles 264 at the transfer station 200 with the storage device transporter 400, and then return the storage device transporter 400, with a storage device 600 therein, to the test slot 500a for testing of the storage device 600. After testing, the robotic arm 310 retrieves the supported storage device 600 (and, if applicable, the storage device transporter 400) from one of the test slots 500a and returns it to one of the storage device receptacles 264 at the transfer station 200 (or moves it to another one of the test slots 500a).

Test Slot with Temperature Sensing Assembly

Figure 33:
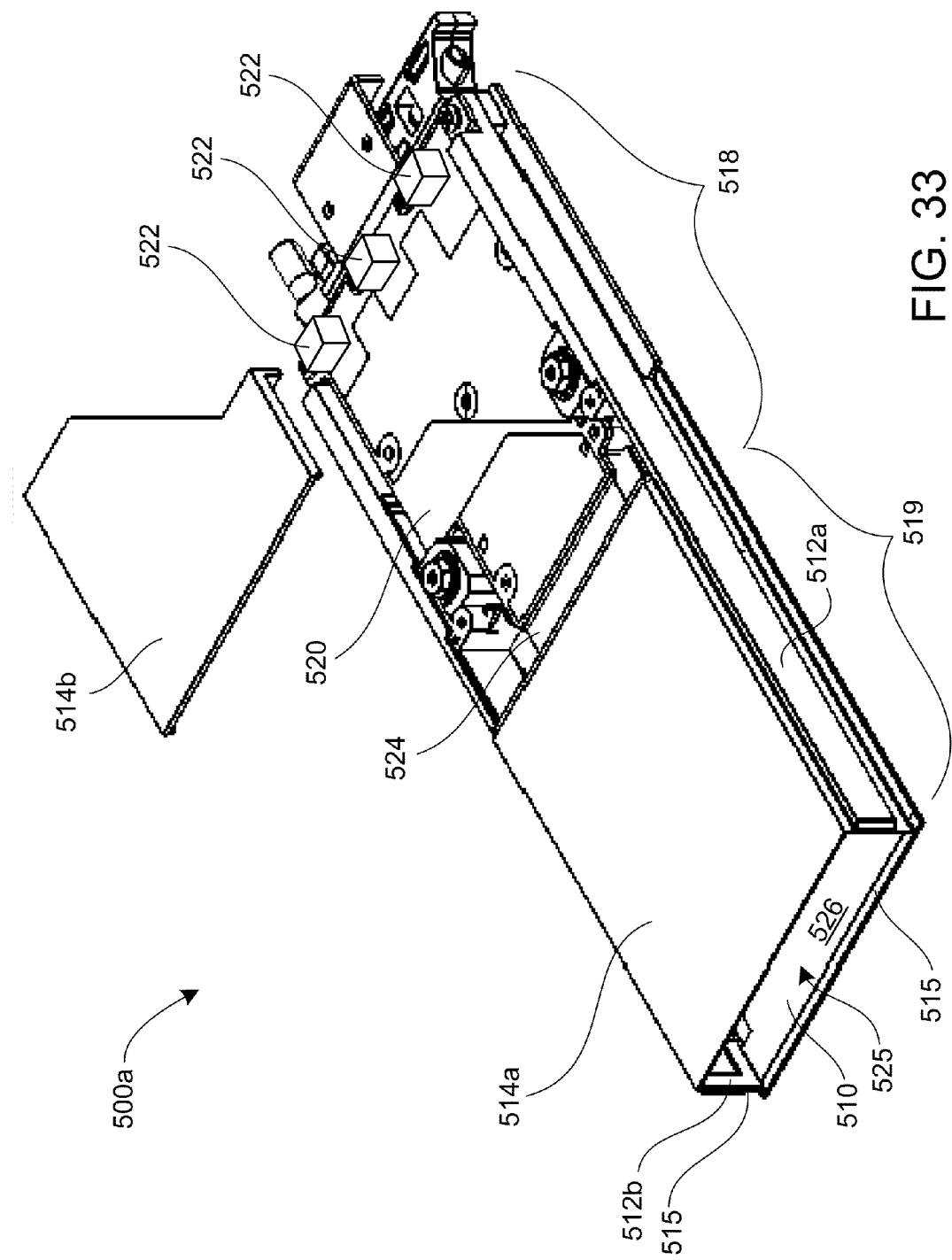
FIG. 33 is a perspective view of a test slot.
Figure 34:
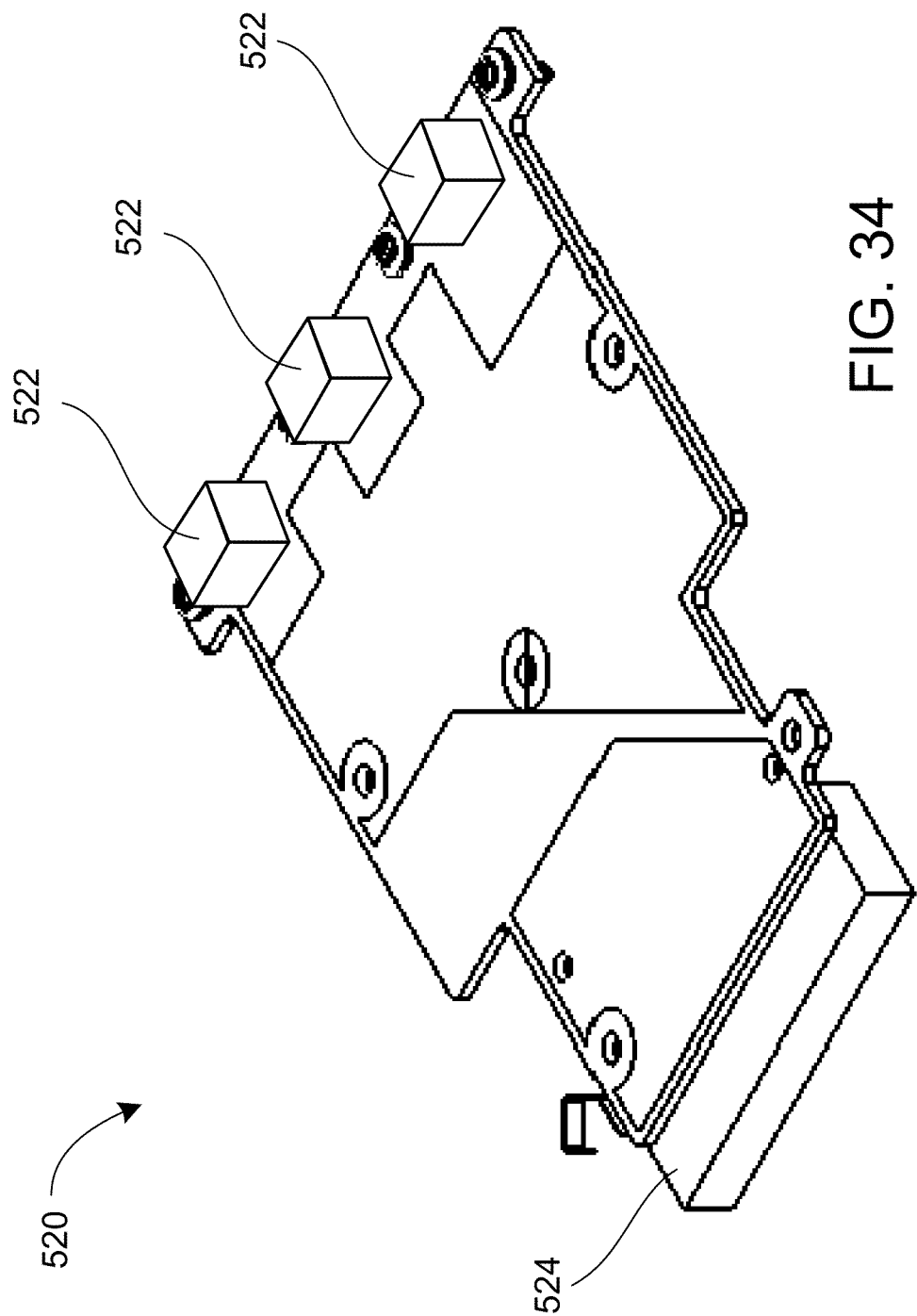
FIG. 34 is a perspective view of a connection interface board.

As shown in FIG. 33, the test slot 500a includes a base 510, upstanding walls 512a, 512b and first and second covers 514a, 514b. The first cover 514a is integrally molded with the base 510 and the upstanding walls 512a, 512b. The test slot 500a includes a rear portion 518 and a front portion 519. The rear portion 518 houses a connection interface board 520, which carries the connection interface circuit 182 (FIGS. 31A and 31B). As shown in FIG. 34, the connection interface board 520 includes electrical connectors 522 disposed along a distal end 573 of the connection interface board 520. The electrical connectors 522 provide for electrical communication between the connection interface circuit 182 (FIGS. 31A and 31B) and the test circuitry (e.g., self test system 180 and/or functional test system 190) in the associated test rack 100. The connection interface board 520 also includes a test slot connector 524, which provides for electrical communication between the connection interface circuit 182 and a storage device in the test slot 500a.

The front portion 519 of the test slot 500a defines a test compartment 526 for receiving and supporting a storage device 600 or, optionally, a storage device transporter 400 for carrying a storage device 600. The base 510, upstanding walls 512a, 512b, and the first cover 514a together define a first open end 525, which provides access to the test compartment 526 (e.g., for inserting and removing the storage device 600 or storage device transporter 400), and the beveled edges 515. In some implementations the beveled edges 515 abut the face plate of a storage device transporter 400 inserted in the test slot 500a to provide a seal that inhibits the flow of air into and out of the test slot 500a via the first open end 525.

Figure 35A:
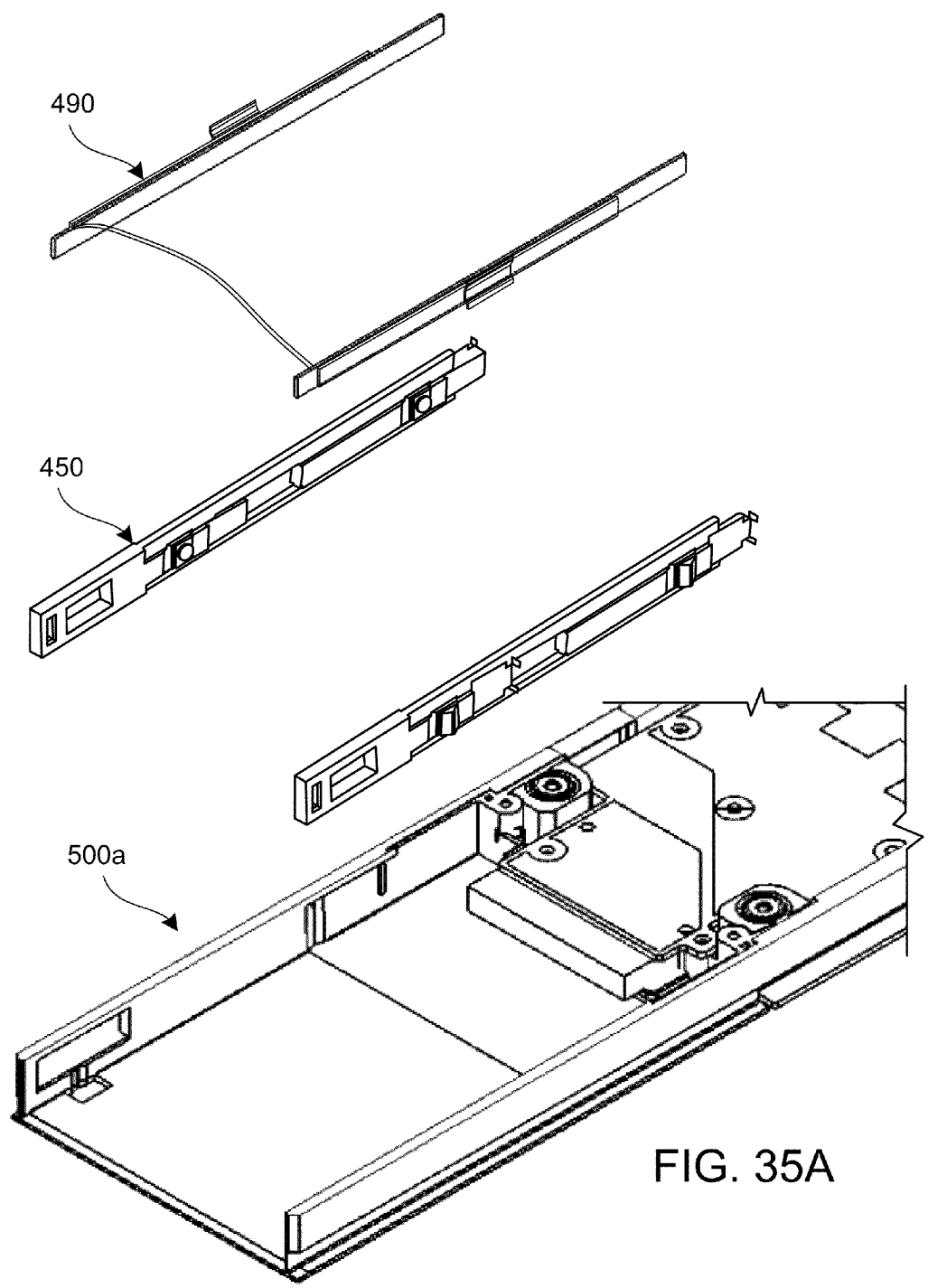
FIG. 35A is an exploded perspective view of a test slot.

As shown in FIGS. 35A and 35B, the test slot 500a includes a clamping mechanism 450 and a temperature sensing assembly 490. The temperature sensing assembly 490 allows a storage device supported by the test slot to be measured (e.g., directly measured via contact with the storage device). The clamping mechanism 450 and temperature sensing assembly 490 can be included in the test slot 500a in any of several possible configurations. In some implementations, the clamping mechanism 450 abuts the upstanding walls 512a, 512b of the test slot 500a. When a storage device 600 is inserted into the test slot 500a, the clamping mechanism 450 secures the storage device 600 in place and lessens some movement of the storage device 600 relative to the test slot 500a. In some implementations, the temperature sensing assembly 490 can be positioned to abut the clamping mechanism 450, such that the clamping mechanism 450, when engaged, will apply pressure on the temperature sensing assembly 490, which in turn applies pressure on the storage device 600. In some implementations, the temperature sensing assembly 490 contacts the storage device 600 at a different location than at the location of clamping mechanism 450 pressure. For example, in these implementations, the clamping mechanism 450 may apply pressure directly onto the storage device 600, or the clamping mechanism 450 may apply pressure to a storage device transporter 400 containing the storage device 600. In some implementations, the temperature sensing assembly 490 is arranged within the test slot 500a such that, when the storage device transporter 400 is inserted in the test slot 500a, the temperature sensing assembly 490 is received by the storage device transporter 400 (e.g. through a pair of ports or holes in the transporter) and comes into direct contact with the storage device 600.

Figure 36:
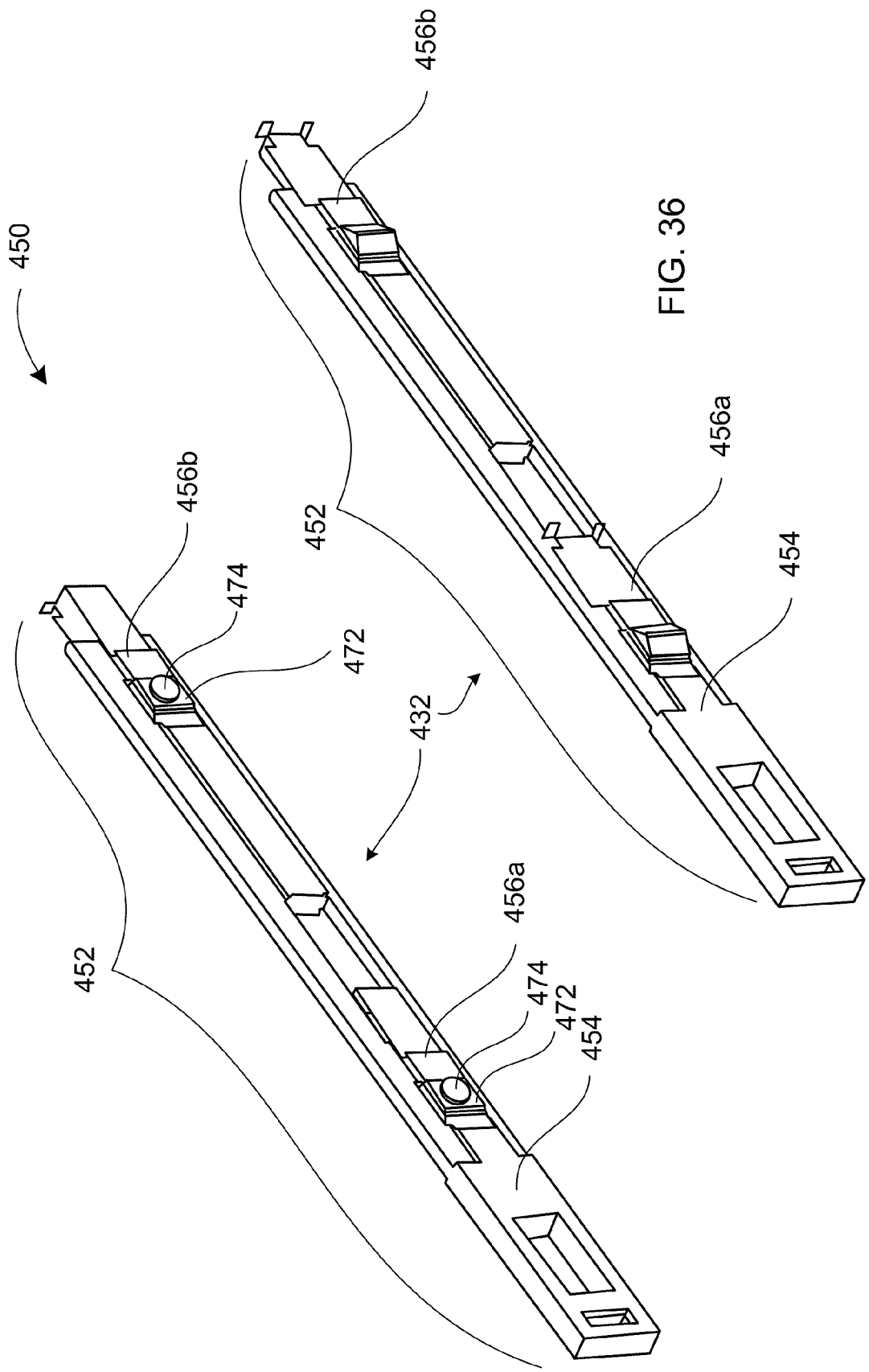
FIG. 36 is a perspective view of a clamping mechanism.

As shown in FIG. 36, the clamping mechanism 450 includes a pair of clamping assemblies 452 each including an actuator 454 and a pair of spring clamps (i.e., proximal and distal spring clamps 456a, 456b). The portions of the spring clamps at the inner surfaces 432 of the clamping assemblies 452 include an engagement member 472 having a damper 474. The spring clamps 456a, 456b are operatively associated with the actuators 454, e.g., for clamping a storage device 600 within a test slot 500a.

Figure 37:
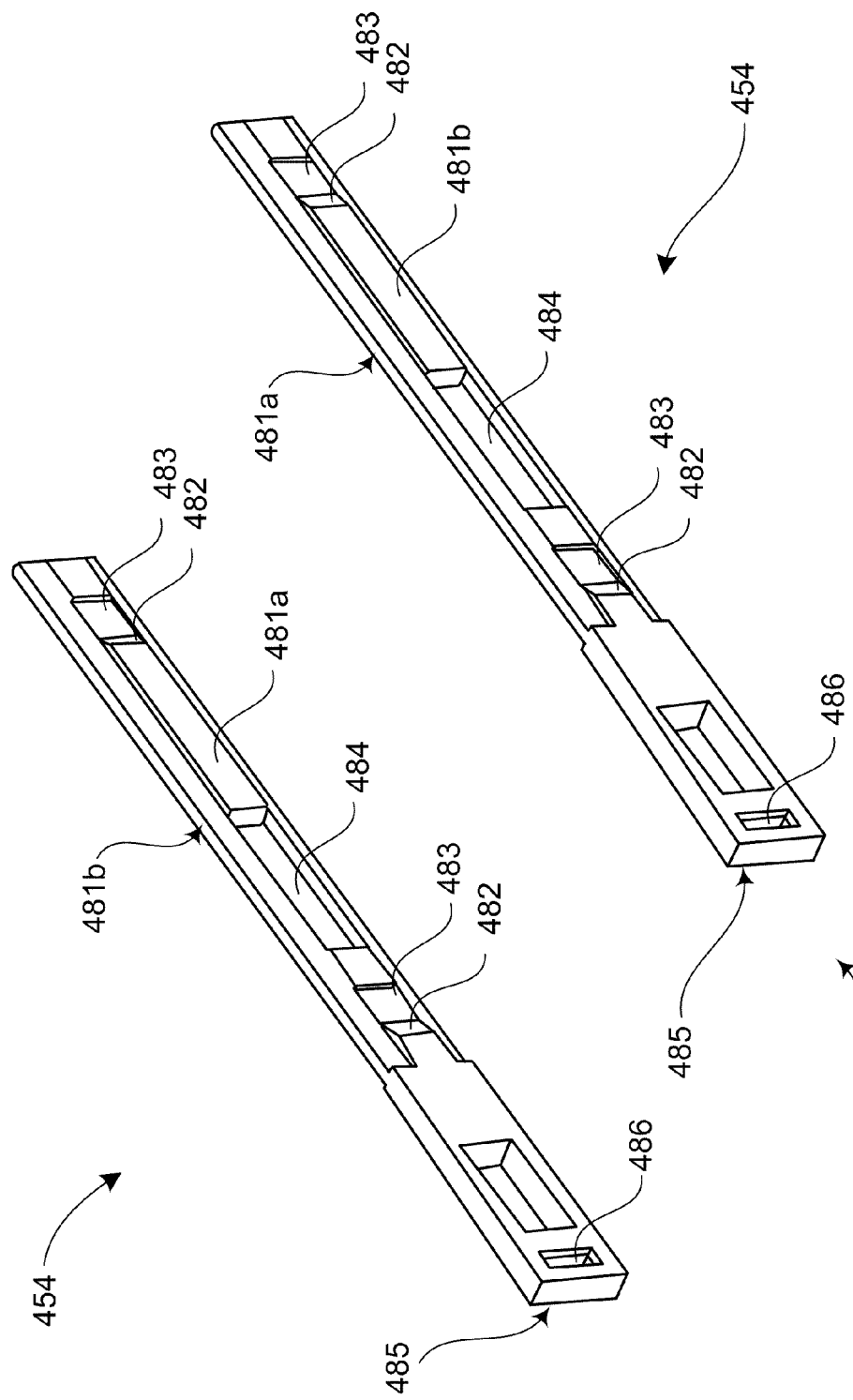
FIG. 37 is a perspective view of a pair of actuators.

Referring to FIG. 37, each of the actuators 454 includes inner and outer surfaces 481a, 481b which define actuating features. The actuating features include wedges 482 and recesses 483. The actuators 454 also define openings 484 which extend between the inner and outer surfaces 481a, 481b. At their proximal ends 485, the actuators 454 include actuator sockets 486 which are configured to be engageable with the manipulator 312 (FIG. 32A) for controlling movement of the actuators 454 relative to the test slot 500a. For example, the manipulator 312 can engage the actuators 454 to engage the spring clamps 456a, 456b, securing a storage device 500a in place.

Figure 38:
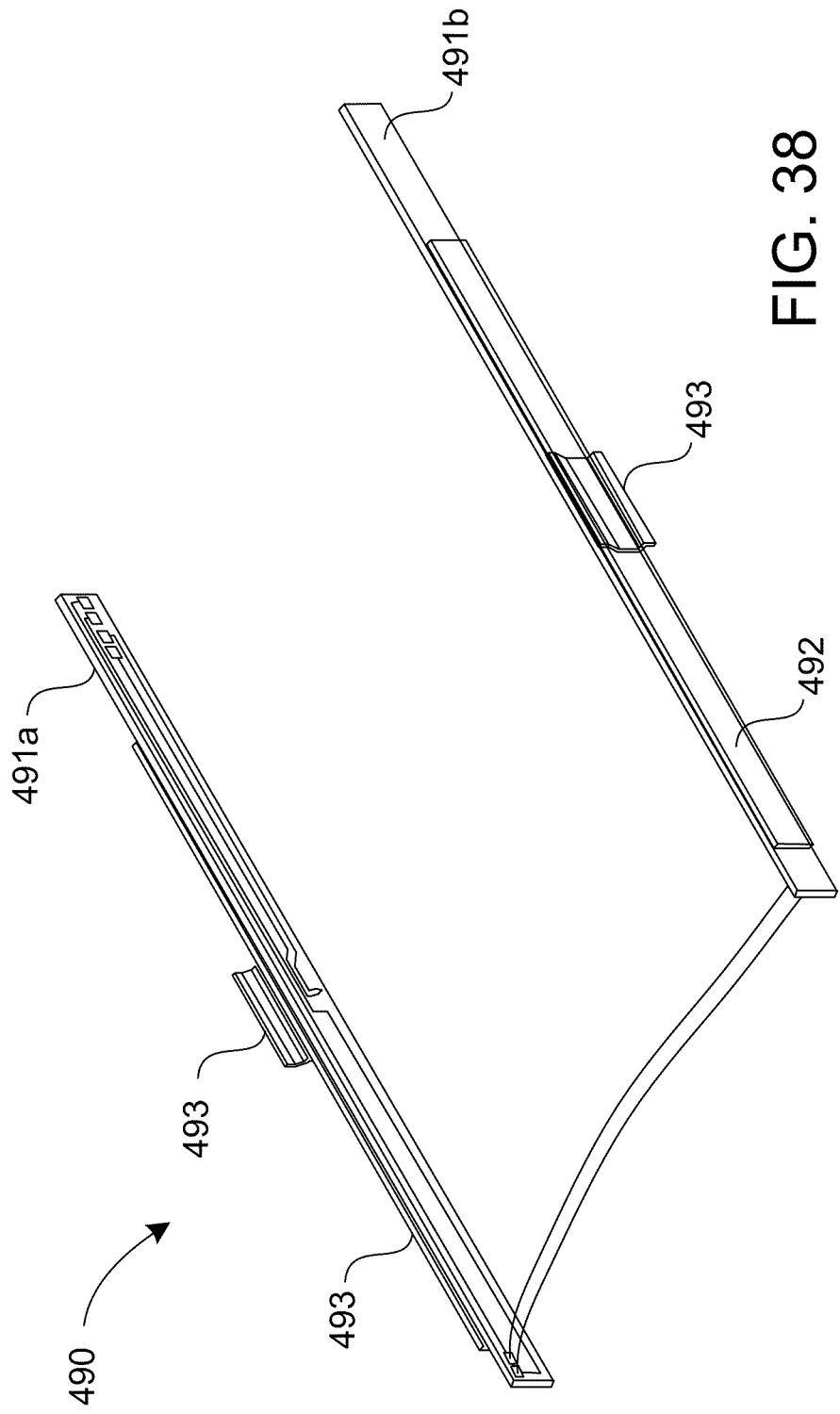
FIG. 38 is a perspective view of a temperature sensing assembly.

As shown in FIG. 38, the temperature sensing assembly 490 includes a pair of printed wiring boards (i.e., first and second printed wiring boards 491a, 491b), a pair of pressure plates 492, and a pair of resilient biasing mechanisms (shown in the form of spring plates 493), which operate to bias the printed wiring boards 491a, 491b toward the inner surfaces 432 of the clamping assemblies 452 following assembly.

Figure 39:
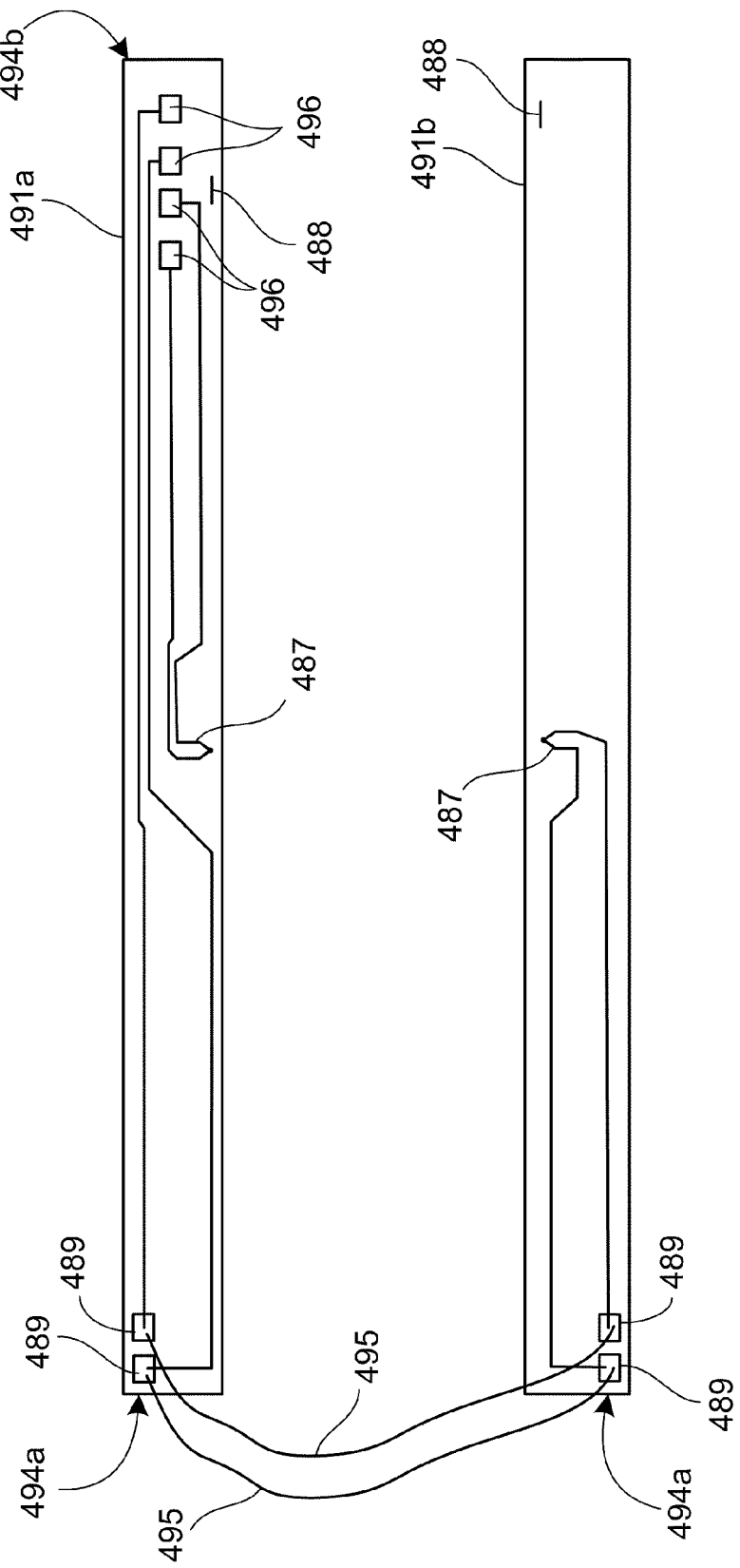
FIG. 39 is a plan view of a pair of printed wiring boards from the temperature sensing assembly of FIG. 38.

Referring to FIG. 39, each of the printed wiring boards 491a, 491b includes a thermocouple 487 integrated (e.g., etched) in an electrically conductive (e.g., copper) layer at respective first surfaces 488 of the printed wiring boards 491a, 491b. The printed wiring boards 491a, 491b include wiring pads 489 at their respective proximal ends 494a. The printed wiring boards 491a, 491b can be electrically connected to each other via wires 495 which are soldered to the printed wiring boards 491a, 491b at the wiring pads 489. The first printed wiring board 491a includes a pair of contact terminals 496 at its distal end 494b. The contact terminals 496 allow for electrical communication with a connection interface board 520 within the test slot 500a. In some implementations, the contact terminals 496 are permanently connected, e.g. soldered, to the connection interface board 520. Each of the printed wiring boards 491a, 491b is mounted (e.g., via adhesive or mechanical fasteners) to an associated one of the pressure plates 492.

The pressure plates 492 are substantially flat and can be formed of metal or rigid plastic. The pressure plates 492 are each mounted to a corresponding one of the spring plates 493.

Figure 40:
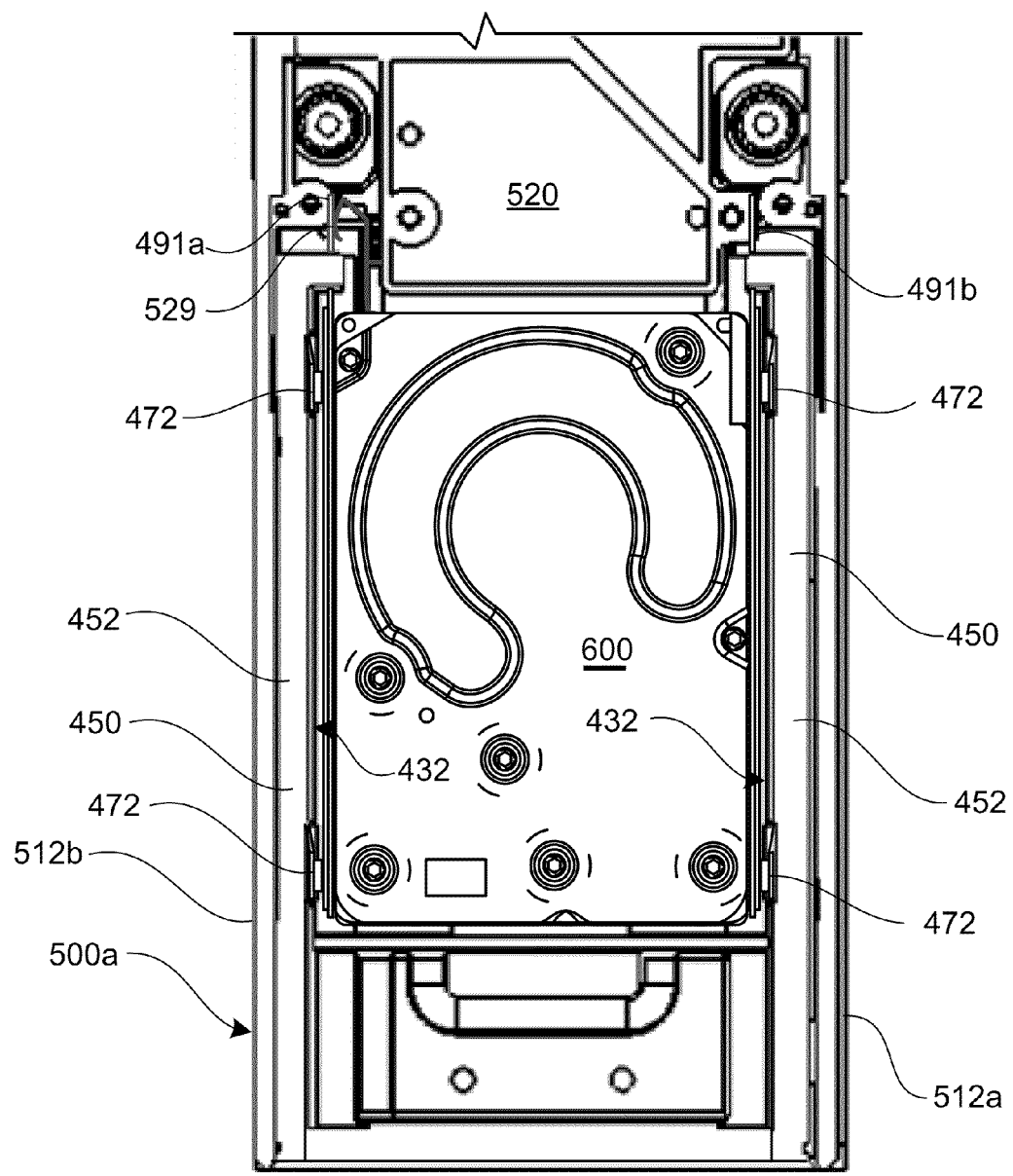
FIG. 40 is a plan view showing a storage device inserted in a test slot.

Referring to FIG. 40, with the storage device 600 in a fully inserted position within the test slot 500a the actuators 454 can be moved towards the engaged position to displace the engagement members 472 of the spring clamps 456a, 456b to extend outwardly from the inner surfaces 432 of the clamping assemblies 452. In the engaged position, the engagement members 472 displace the printed wiring boards 491a, 491b of the temperature sensing assembly 490 towards the storage device 600 to provide physical contact between the printed wiring boards 491a, 491b and the storage device 600. This physical contact allows a direct measurement of the temperature of the storage device 600 via the thermocouples 487 during testing. In some implementations, this clamping effect also brings the contact terminals 496 of the first printed wiring board 491a into firm contact with spring contacts 529 on the connection interface board 520. In some implementations, the storage device 600 is housed within a storage device transporter 400, and the clamping mechanism 450 clamps the storage device 600 against movement relative to the storage device transporter 400.

Methods of Operation

In use, the robotic arm 310 picks up a storage device 600 from one of the storage device receptacles 264 at the transfer station 200 and loads the storage device 600 into the associated test slot 500a for testing of the storage device 600. In some implementations, the robotic arm 310 removes a storage device transporter 400 from the test slot 500a with the manipulator 312, retrieves the storage device 600 with the storage device transporter 400, and then and then returns the storage device transporter 400 to the test slot 500a for testing of the storage device 600. During testing, the test electronics 160 execute a test algorithm that includes, inter alia, adjusting the temperature of the storage device 600 under test. For example, during testing the storage devices 600 are each tested over a temperature range from about 20° C. to about 70° C. The test electronics 160 can monitor the temperature of the storage devices 600 in each of the test slots 500 based on feedback received from the thermocouples 487. The test electronics 160 can also adjust the temperature of the storage devices 600 based on feedback from the thermocouples 487.

After testing, the robotic arm 310 retrieves the storage device 600 (and, in some examples, the storage device transporter 400) from the test slot 500a and returns it to one of the storage device receptacles 264 at the transfer station 200 (or moves it to another one of the test slots 500a).

Further Embodiments

Figure 41:
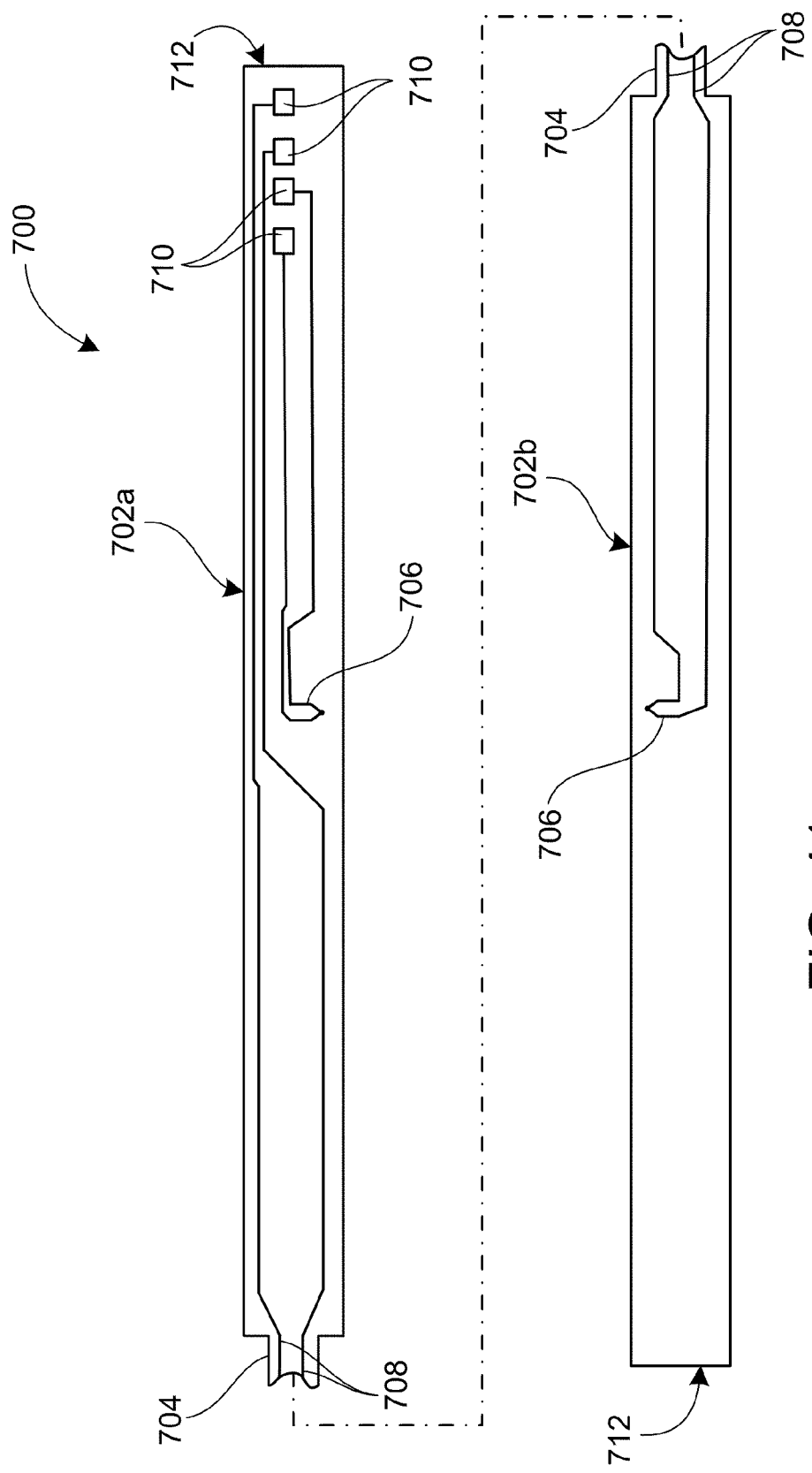
FIG. 41 is a plan view of a flexible printed circuit with integrated thermocouples.

For example, although an embodiment of a temperature sensing assembly has been described in which thermocouples are integrated into the circuitry on a pair of relatively rigid printed wiring boards that are hard wired together, in some embodiments, the thermocouples can be integrated into the circuitry of a flexible printed circuit. As an example, FIG. 41 illustrates a flexible printed circuit 700 that includes a pair of circuit portions (i.e., first and second circuit portions 702a, 702b) and a connecting portion 704 that is integral with the first and second circuit portions 702a, 702b.

Each of the first and second circuit portions 702a, 702b includes a thermocouple 706 that is defined by electrically conductive traces. The connecting portion 704 also includes electrically conductive traces 708 which provide an electrical connection between the thermocouples 706 of the first and second circuit portions 702a, 702b. The first circuit portion 702a includes a pair of contact terminals 710 at its distal end 712. The contact terminals 710 allow for electrical communication with the connection interface board 520 in the test slot 500a. Suitable flexible printed circuits with integrated thermocouples are available from Watlow Electric Manufacturing Company of Columbia, Mo.

Figure 42:
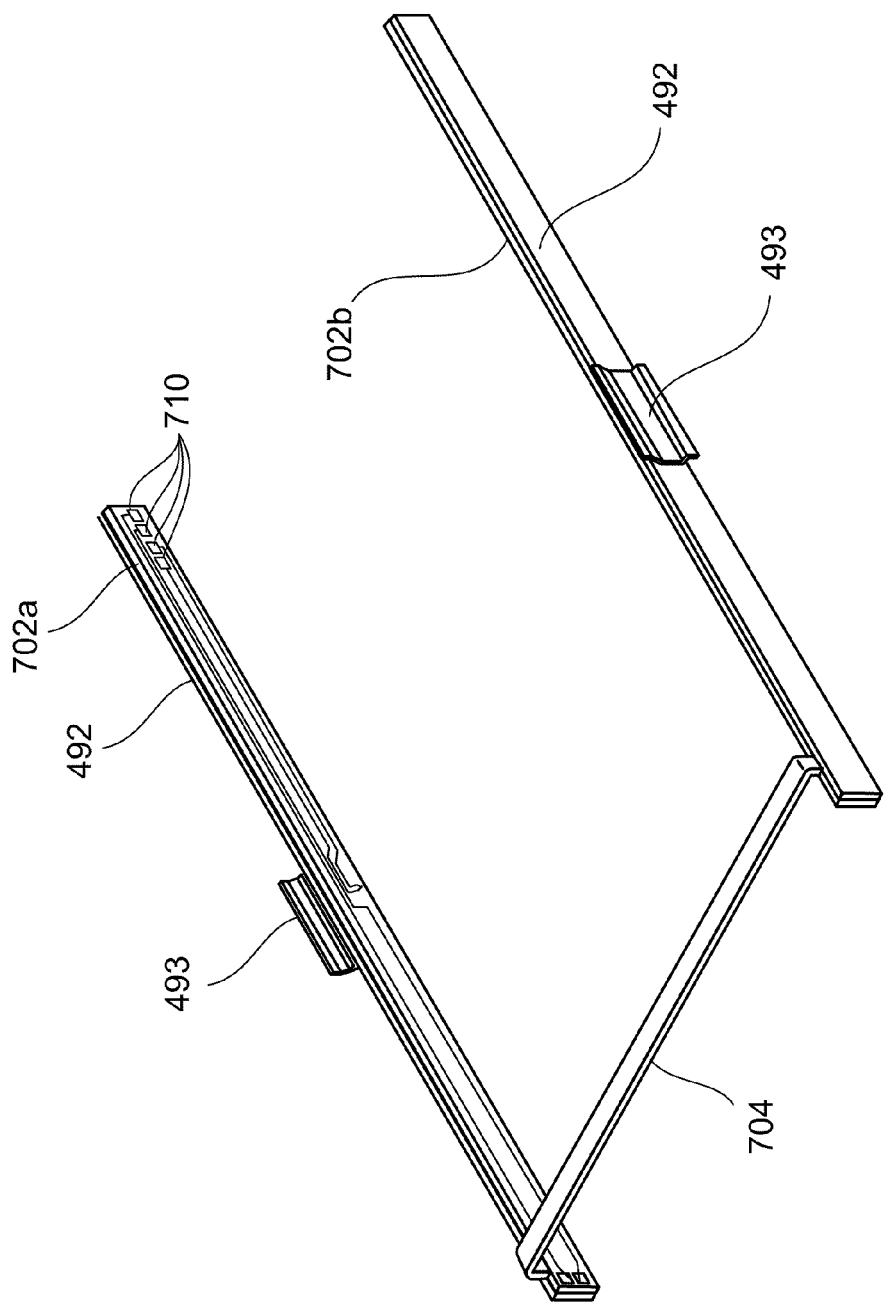
FIG. 42 is a perspective view of a temperature sensing assembly with the flexible printed circuit of FIG. 41.

As shown in FIG. 42, each of the first and second circuit portions 702a, 702b is mounted (e.g., via adhesive or mechanical fasteners) to an associated one of the pressure plates 492. The pressure plates 492 can extend along the entire back surfaces of the first and second circuit portions 702a, 702b for added stiffness and stability, e.g., to help provide good electrical connection between the contact terminals 710 on the flexible printed circuit 700 and the spring contacts 529 (FIG. 12) on the connection interface board 520.

Figure 43:
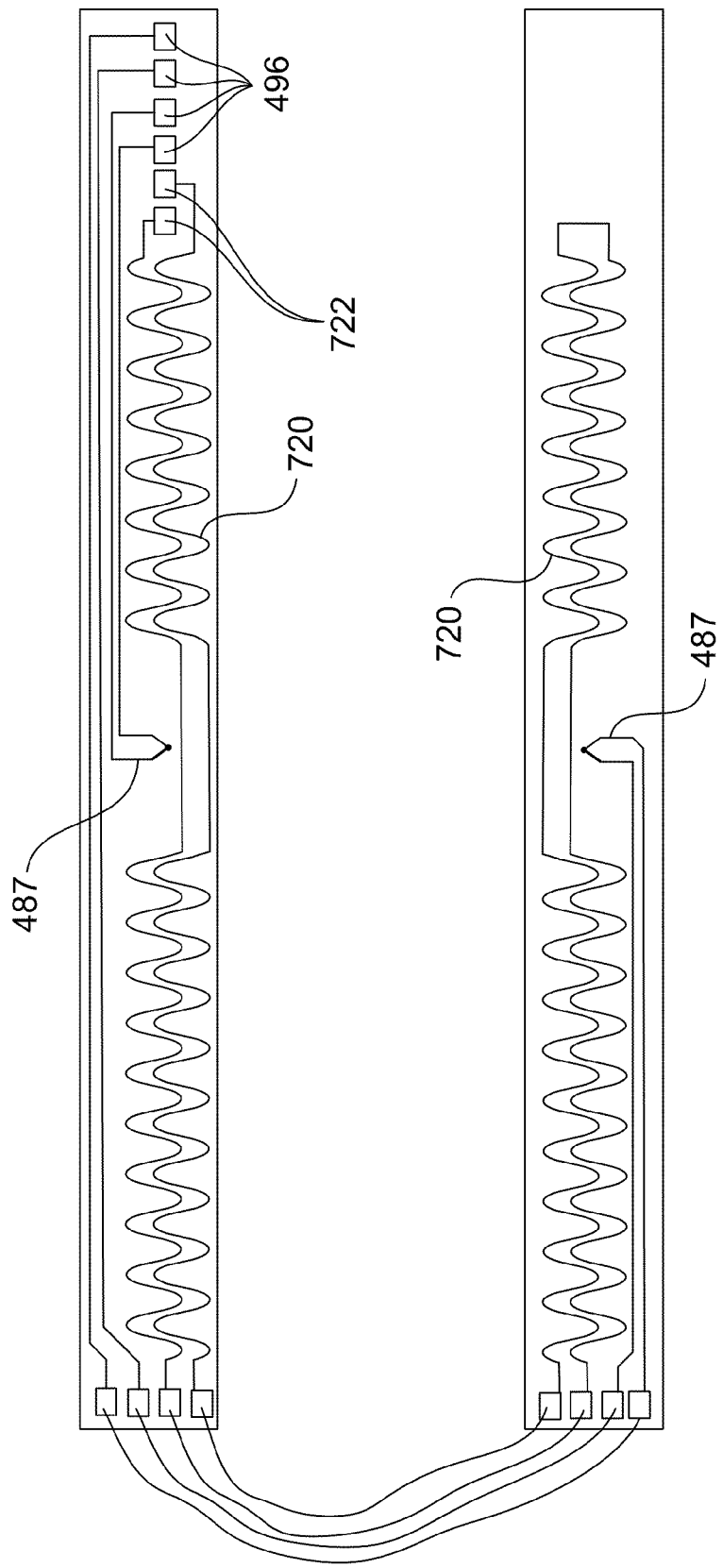
FIG. 43 is a plan view of a pair of printed wiring boards with integrated resistive heaters and thermocouples.

In some embodiments, the temperature sensing assembly 490 can also include one or more electric heating elements (e.g., resistive heaters) for heating a storage device supported in the storage device transporter during testing. For example, FIG. 43 illustrates one embodiment in which the printed wiring boards 491a, 491b include resistive heaters 720 that are arranged to heat a storage device 600. In particular, when the printed wiring boards 491a, 491b are clamped against a storage device 600, the resistive heaters 720 contact the storage device 600, thereby allowing the storage device 600 to be heated by way of thermal conduction.

The resistive heaters 720 may be physically separated or otherwise thermally insulated from the thermocouples 487, to limit the influence of the resistive heaters 720 on the temperature of the thermocouples 487.

In addition to contact terminals 496 for the thermocouples 487, the first printed wiring board 491a is also provided with resistive heater contact terminals 722 that are electrically connected to the resistive heaters 720. In some examples, spring contacts or pogo pins can also be provided on the connection interface board 520 (FIG. 34) to provide electrical communication between the connection interface board 520 and the resistive heaters 720.

The resistive heaters 720 can be placed in electrical communication with the test electronics 160 (FIGS. 31A and 31B) via the connection interface board 520. The test electronics 160 can be configured to control flows of electrical current to the resistive heaters 720 based, at least in part, on signals received from the thermocouples 487. Alternatively, the connection interface board 520 can be configured to directly control flows of electrical current to the resistive heaters 720 based, at least in part, on signals received from the thermocouples 487.

In some configurations, the test electronics 160 can compensate for any error between an actual temperature of the storage device and the temperature measured by the thermocouples 487. For example, power drawn by the storage device 600 will be dissipated as heat and increase the temperature inside the storage device, but this temperature increase may not be fully measured by the thermocouples 487. The test electronics 160 can measure the power drawn by the storage device 600 and use this measurement to calculate an offset for the temperature measured by the thermocouples 487 to estimate the actual temperature of the storage device 600. The thermocouples 487 can be provided in the form of a discrete device that is mounted to one of the printed wiring boards 491a, 491b or it can be integrated into the electrically conductive layers of the printed wiring boards 491a, 491b. Furthermore, although an embodiment has been described in which a thermocouple is provided on a rigid printed wiring board, a thermocouple can also be incorporated in embodiments employing flexible printed circuits, such as the embodiment described above with regard to FIG. 42. Flexible printed circuits with integrated thermocouples and/or resistive heaters are available from Watlow Electric Manufacturing Company of Columbia, Mo.

Figure 44:
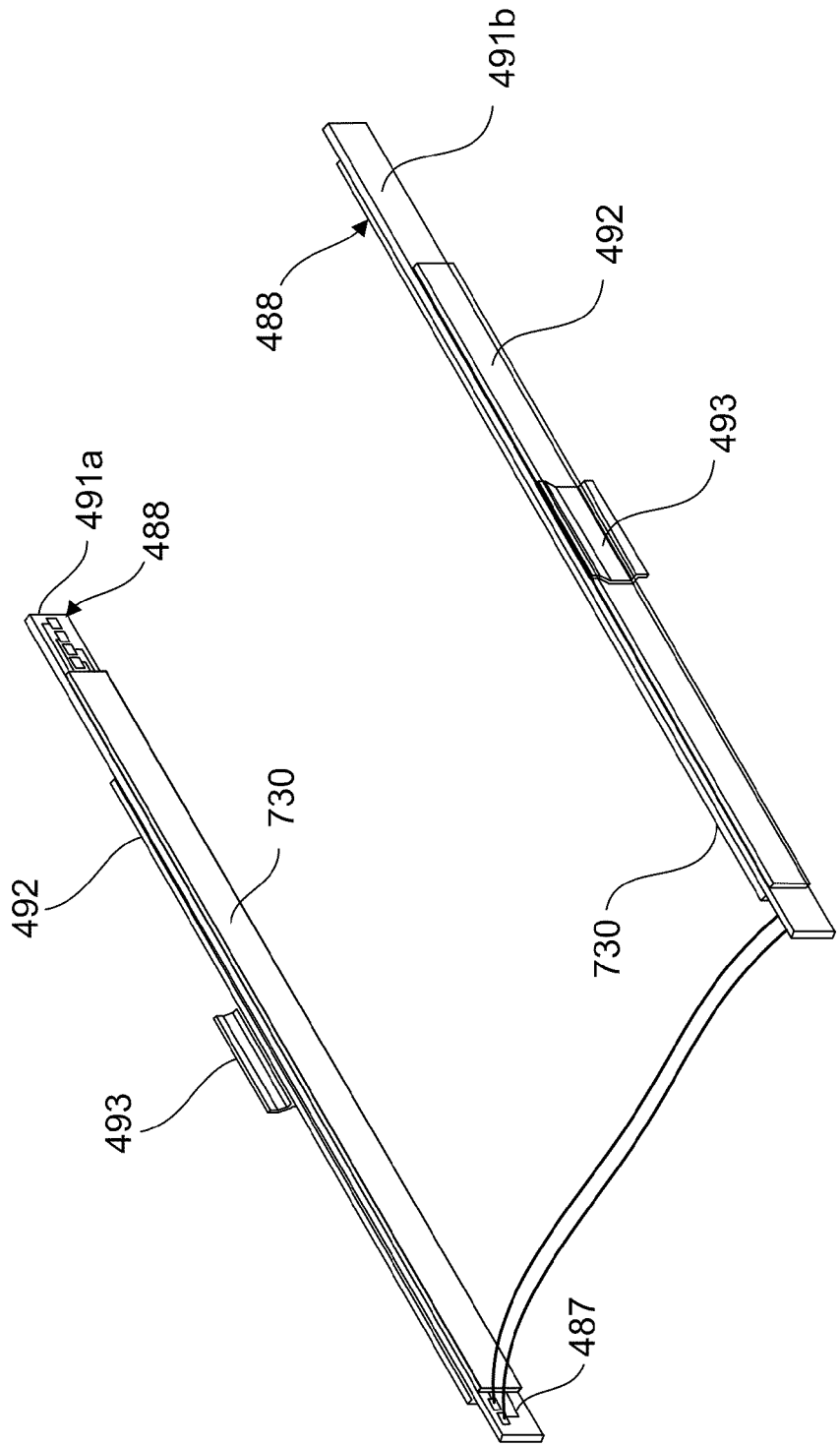
FIG. 44 is a perspective view of a conductive heating assembly with a compliant material on exposed surfaces of printed wiring boards.

In some embodiments, the temperature sensing assembly 490 can also include a compliant material, such as Sil-Pad manufactured by Bergquist Company of Chanhassen, Minn., as an additional layer between the thermocouples 487 and a storage device supported in the storage device transporter 400. For example, FIG. 44 illustrates an embodiment in which a layer of compliant material 730 is adhered the first surfaces 488 of the printed wiring boards 491a, 491b. The compliant material 730 can help to inhibit scratching of a supported storage device 600 when clamped within the test slot 500a. The compliant material between the thermocouple and the storage device also accommodates the surface irregularities of the storage device 600 and allows for more efficient heat transfer.

Although an embodiment of a temperature sensing assembly has been described which utilizes a pair of spring plates to bias the pressure plates, and the attached printed circuitry, toward respective inner surfaces of the clamping assemblies, other resilient biasing mechanisms are possible.

Although an embodiment of a temperature sensing assembly has been described which utilizes one or more thermocouples provided on a rigid or flexible printed wiring board, other mechanisms for sensing the temperature of a storage device through physical contact are possible. For example, the temperature sensor may be a resistive temperature sensor, a semiconductor diode sensor, an infrared thermometer, or a silicon bandgap temperature sensor. Any of these temperature sensors may be mounted on a rigid or flexible printed wiring board and made to contact the storage device in the same way that a thermocouple may be used.

Although an embodiment of a temperature sensing assembly has been described in which a temperature sensor directly contacts a storage device, in some embodiments, the temperature sensor contacts an intermediate medium in contact with the storage device in a configuration that allows the temperature sensor to properly sense temperature. For example, in some implementations, the temperature sensor may have a layer of thermally conductive material that contacts the storage device. The storage device may also have a layer of thermally conductive material that contacts the temperature sensor or contacts a layer of thermally conductive material on the temperature sensor.

Although an embodiment of a clamping mechanism has been described that includes multiple spring clamps, in some embodiments, as few as one spring clamp may be used.

Other embodiments are within the scope of the following claims.

What is claimed is:

1. A test slot assembly comprising:
   a housing configured to receive and to support a storage device;
   a temperature sensing assembly associated with the housing and configured to measure a temperature of the storage device by way of physical contact; and
   a clamping mechanism that is different from the housing;
   wherein a least a portion of the clamping mechanism is adjustable between a first position and a second position;
   wherein the clamping mechanism when in the first position is configured to cause the temperature sensing assembly to be disengaged from the storage device;
   wherein the clamping mechanism when in the second position is configured to perform a clamping action that moves the temperature sensing assembly into contact with the storage device and to clamp the storage device against movement relative to the housing in response to pressure between the clamping mechanism and the housing; and
   wherein the clamping mechanism is adjacent to a portion of a sidewall of the housing, and wherein the temperature sensing assembly is adjacent to the clamping mechanism such that the clamping mechanism is positioned between the portion of the sidewall and the temperature sensing assembly.

2. The test slot assembly of claim 1, wherein the temperature sensing assembly comprises printed circuitry and a thermocouple, wherein the printed circuitry comprises one or more electrically conductive layers, and wherein the thermocouple is integrated in the one or more electrically conductive layers.

3. The test slot assembly of claim 2, wherein the printed circuitry comprises a printed wiring board.

4. The test slot assembly of claim 2, wherein the printed circuitry comprises a flexible printed circuit.

5. The test slot assembly of claim 1, wherein the temperature sensing assembly comprises at least one of a resistive temperature sensor, a semiconductor diode sensor, a thermocouple, an infrared thermometer and a silicon bandgap temperature sensor.

6. The test slot assembly of claim 1, further comprising a conductive heating element arranged to heat the storage device.

7. The test slot assembly of claim 6, wherein the clamping mechanism is further configured to move the conductive heating element into contact with the storage device.

8. The test slot assembly of claim 6, wherein the conductive heating element comprises a resistive heater.

9. The test slot assembly of claim 1, further comprising a storage device transporter for supporting the storage device.

10. The test slot assembly of claim 9, wherein the housing is further configured to receive and to support the storage device transporter.

11. A storage device testing system comprising:
a test slot comprising:
- a test compartment for receiving and supporting a storage device;
- a temperature sensing assembly associated with the test compartment and configured to measure a temperature of the storage device by way of physical contact;
- a clamping mechanism that is different from the test compartment;
- wherein a least a portion of the clamping mechanism is adjustable between a first position and a second position;
- wherein the clamping mechanism when in the first position is configured to cause the temperature sensing assembly to be disengaged from the storage device;
- wherein the clamping mechanism when in the second position is configured to perform a clamping action that moves the temperature sensing assembly into contact with the storage device and to clamp the storage device against movement relative to the test compartment in response to pressure between the clamping mechanism and the test compartment;
- wherein the clamping mechanism is adjacent to a portion of a sidewall of the test slot, and wherein the temperature sensing assembly is adjacent to the clamping mechanism such that the clamping mechanism is positioned between the portion of the sidewall and the temperature sensing assembly; and
test electronics configured to communicate one or more test routines to the storage device.

12. The storage device testing system of claim 11, wherein the test slot further comprises a connection interface board configured to provide electrical communication with the test electronics; and
wherein the test electronics are further configured to monitor a temperature of the storage device based on signals received from the temperature sensing assembly.

13. The storage device testing system of claim 11, wherein the test slot further comprises a connection interface board configured to monitor the temperature of the storage device based on signals received from the temperature sensing assembly.

14. The storage device testing system of claim 11, wherein the test compartment further comprises a conductive heating element configured to heat the storage device.

15. The storage device testing system of claim 14, wherein the test slot further comprises:
a connection interface board configured to:
- provide electrical communication between the temperature sensor and the test electronics; and
- control a current flow to the conductive heating element based, at least in part, on signals received from the temperature sensing assembly.

16. The storage device testing system of claim 14, wherein the test electronics are further configured to measure a power draw of the storage device and to compensate for an error between an actual temperature of the storage device and the temperature measured by the temperature sensing assembly.

17. The storage device testing system of claim 11, wherein the test slot further comprises a connection interface board configured to provide electrical communication with a conductive heating assembly when the storage device is disposed within the test compartment.

18. A method comprising:
inserting a storage device into a test slot; and
adjusting a clamping mechanism from a first position to a second position;
wherein the clamping mechanism when in the first position is configured to cause a temperature sensor assembly to be disengaged from the storage device;
engaging, based on adjustment to the second position, the clamping mechanism;
clamping, based on engaging, the storage device within a test compartment of the test slot to clamp the storage device against movement relative to the test compartment in response to pressure between the clamping mechanism and the test compartment; and
moving, based on clamping, the temperature sensor into physical contact with the storage device;
wherein the clamping mechanism is adjacent to a portion of a sidewall of the test slot, and wherein the temperature sensor is adjacent to the clamping mechanism such that the clamping mechanism is positioned between the portion of the sidewall and the temperature sensor.

19. The method of claim 18, wherein the storage device is received in a storage device transporter; and
wherein inserting comprises:
inserting the storage device transporter with the received storage device into the test slot.

* * * * *